US010567685B2

United States Patent
Sato et al.

(10) Patent No.: US 10,567,685 B2
(45) Date of Patent: Feb. 18, 2020

(54) SIGNAL PROCESSING DEVICE AND METHOD, IMAGING ELEMENT, AND ELECTRONIC DEVICE

(71) Applicant: SONY SEMICONDUCTOR SOLUTIONS CORPORATION, Kanagawa (JP)

(72) Inventors: Mamoru Sato, Kanagawa (JP); Yusuke Oike, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/393,501

(22) Filed: Apr. 24, 2019

(65) Prior Publication Data

US 2019/0253648 A1    Aug. 15, 2019

Related U.S. Application Data

(63) Continuation of application No. 15/514,890, filed as application No. PCT/JP2015/077008 on Sep. 25, 2015, now Pat. No. 10,326,953.

(30) Foreign Application Priority Data

Oct. 6, 2014    (JP) ................................. 2014-205440

(51) Int. Cl.
*H04N 5/363* (2011.01)
*H04N 5/357* (2011.01)
(Continued)

(52) U.S. Cl.
CPC .............. *H04N 5/363* (2013.01); *H03M 1/12* (2013.01); *H04N 5/3575* (2013.01);
(Continued)

(58) Field of Classification Search
CPC ..................................................... H04N 5/363
(Continued)

(56) References Cited

U.S. PATENT DOCUMENTS

2013/0015329 A1*   1/2013   Iwaki ................... H04N 5/3765
                                              250/208.1

FOREIGN PATENT DOCUMENTS

CN         102984469         3/2013
JP         2006-352597       12/2006
(Continued)

OTHER PUBLICATIONS

Official Action (with English translation) for Chinese Patent Application No. 201580053277.3, dated Jul. 24, 2019, 23 pages.

*Primary Examiner* — Joel W Fosselman
(74) *Attorney, Agent, or Firm* — Sheridan Ross P.C.

(57) ABSTRACT

The present technology relates to signal processing device and method, an imaging element, and an electronic device capable of reducing a rise of costs. A signal processing device according to the present technology includes a measurement unit that performs measurement of a length of a period from an input start of a signal to a change of a value of the signal a plurality of times, retains measured values obtained by the measurement performed the plurality of times, sets an initial value of the measurement on the basis of any one of a plurality of the retained measured values, and performs the measurement by using the initial value. The present technology is applicable to an electronic circuit such as a flip-flop circuit and an A/D conversion unit, an imaging element such as a CMOS image sensor, and an electronic device such as a digital still camera, for example.

12 Claims, 43 Drawing Sheets

(51) Int. Cl.
*H04N 5/378* (2011.01)
*H04N 5/3745* (2011.01)
*H03M 1/12* (2006.01)
H03M 1/56 (2006.01)
H01L 27/146 (2006.01)

(52) U.S. Cl.
CPC ........... *H04N 5/378* (2013.01); *H04N 5/3745* (2013.01); *H01L 27/14643* (2013.01); *H03M 1/123* (2013.01); *H03M 1/1295* (2013.01); *H03M 1/56* (2013.01)

(58) Field of Classification Search
USPC ....................................................... 348/308
See application file for complete search history.

(56) References Cited

FOREIGN PATENT DOCUMENTS

| | | |
|---|---|---|
| JP | 2009-225323 | 10/2009 |
| JP | 2011-078049 | 4/2011 |
| JP | 2013-051575 | 3/2013 |
| JP | 2013-055447 | 3/2013 |
| WO | WO 2013/129202 | 9/2013 |

\* cited by examiner

FIG. 28
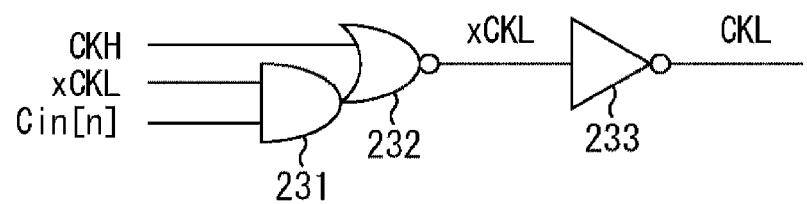
A
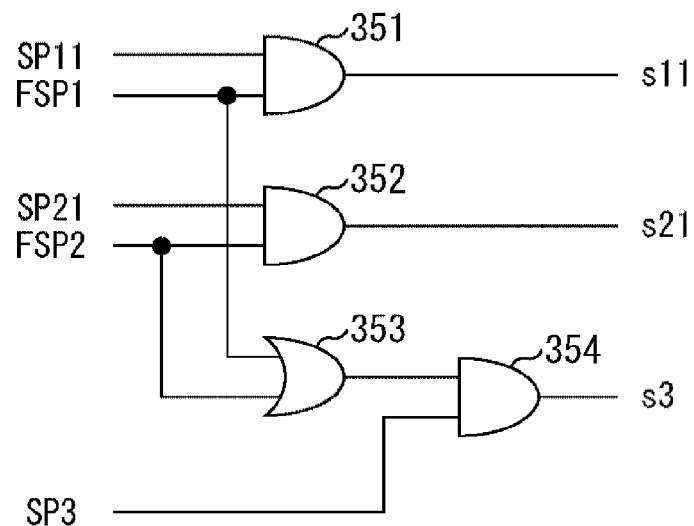
B

SIGNAL PROCESSING DEVICE AND METHOD, IMAGING ELEMENT, AND ELECTRONIC DEVICE

CROSS REFERENCE TO RELATED APPLICATIONS

This application is a continuation of U.S. patent application Ser. No. 15/514,890, filed Mar. 28, 2017, which is a national stage application under 35 U.S.C. 371 and claims the benefit of PCT Application No. PCT/JP2015/077008 having an international filing date of Sep. 25, 2015, which designated the United States, which PCT application claimed the benefit of Japanese Patent Application No. 2014-205440 filed Oct. 6, 2014, the disclosures of which are incorporated herein by reference in their entirety.

TECHNICAL FIELD

The present technology relates to signal processing device and method, an imaging element, and an electronic device, and more particularly to signal processing device and method, an imaging element, and an electronic device capable of reducing a rise of costs.

BACKGROUND ART

There has been known a slope A/D converter which achieves A/D conversion of an image sensor by comparing an image signal with a reference voltage having a ramp waveform by use of a comparator, and counting a time until inversion of output from the comparator. The slope A/D converter is excellent in linearity and noise characteristics. Further, there has also been a column A/D converter which includes a plurality of A/D converters for each pixel column to simultaneously achieve A/D conversion of each pixel column. The column A/D converter realizes speed increase by decreasing an operation frequency per one A/D converter, and improves area efficiency and power consumption efficiency by providing a reference voltage generator shared by the respective A/D converters. Accordingly, the column A/D converter is more compatible with a complementary metal oxide semiconductor (CMOS) image sensor than other types of A/D conversion systems.

There has been considered a method of the foregoing slope A/D conversion which selects a slope reference signal from slope reference signals having different inclinations on the basis of level determination of pixel signals to obtain similar effects by using a column-parallel A/D conversion circuit (for example, see Patent Document 1 and Patent Document 2).

On the other hand, there has been considered a method of the foregoing column A/D conversion which obtains lower bits by using a gray code counter and a latch provided for each of a plurality of columns, and higher bits by using a binary ripple counter provided for each of the columns to reduce power consumption (for example, see Patent Document 3 and Patent Document 4).

Incidentally, for A/D conversion of pixel signals of an image sensor, there has been a method which reduces kTC noise or the like contained in pixel signals by using correlated double sampling (CDS) to prevent lowering of image quality of a captured image.

CITATION LIST

Patent Document

Patent Document 1: Japanese Patent Application Laid-Open No. 2011-41091
Patent Document 2: Japanese Patent Application Laid-Open No. 2013-251677
Patent Document 3: Japanese Patent Application Laid-Open No. 2011-234326
Patent Document 4: Japanese Patent Application Laid-Open No. 2011-250395

SUMMARY OF THE INVENTION

Problems to be Solved by the Invention

However, in case of CDS for achieving A/D conversion by using these methods, digital CDS is difficult to perform when the method described in Patent Document 1 is used. Accordingly, analog CDS is employed in place of digital CDS. Analog CDS does not completely remove fixed pattern noise in comparison with digital CDS and thus lowers noise features, in which condition image quality of a captured image may deteriorate.

On the other hand, the use of digital CDS is allowed for the methods described in Patent Documents 2 through 4. However, the method described in Patent Document 2 requires a multiple of blocks allowing count operation by counters. This necessity doubles a counter area, and may raise costs. In addition, each of the methods described in Patent Document 3 and Patent Document 4 adopts a hybrid counter which uses binary codes for higher bits and gray codes for lower bits. In this case, a black level retaining unit and a selection means are needed for each of the binary codes and the gray codes. This necessity doubles a counter area, and may raise costs.

The present technology has been proposed in consideration of the aforementioned circumstances. An object of the present technology is to reduce a rise of costs.

Solutions to Problems

A signal processing device according to one aspect of the present technology includes a measurement unit that performs measurement of a length of a period from an input start of a signal to a change of a value of the signal a plurality of times, retains measured values obtained by the measurement performed the plurality of times, sets an initial value of the measurement on the basis of any one of a plurality of the retained measured values, and performs the measurement by using the initial value.

The measurement unit may perform the measurement of the length of the period by counting a clock number of a predetermined clock signal, and retain an obtained count value as the measured value.

The measurement unit may perform the measurement of a first signal a plurality of times, set the initial value on the basis of a measured value corresponding to one of the plurality of retained measured values and indicating a signal level of a second signal different from the first signal, and perform the measurement of a third signal different from the first signal and the second signal by using the set initial value.

The first signal may be a result of comparison between signal levels of a reset signal read from a unit pixel and a reference signal.

The reference signal may have a slope different for each measurement.

The second signal may be a result of comparison between signal levels of a pixel signal read from a unit pixel and a predetermined reference voltage.

The third signal may be a result of comparison between signal levels of a pixel signal read from a unit pixel, and a reference signal having a slope corresponding to the signal level of the second signal.

The measurement unit may obtain all bits of each of the measured values of the measurement in binary codes. The measurement unit may invert data indicating the measured value corresponding to the signal level of the second signal, and set the initial value to the inverted data.

The measurement unit may obtain higher bits of each of the measured values of the measurement in binary codes, and obtain lower bits of each of the measured values in gray codes. The measurement unit may convert the gray codes of the lower bits of the measured value corresponding to the signal level of the second signal into binary codes, add the converted binary codes of the lower bits to the binary codes of the higher bits, invert data indicating the obtained binary codes of all bits of the measured value, and set the initial value to the inverted data.

The measurement unit may obtain all bits of each of the measured values of the measurement in gray codes. The measured value may convert the gray codes of the measured value corresponding to the signal level of the second signal into binary codes, invert data indicating the obtained binary codes of the measured value, and set the initial value to the inverted data.

The measurement unit may perform first measurement that measures a length of a period from a start to a change of a value of the signal on the basis of a result of comparison between signal levels of a reset signal read from a unit pixel and a first reference signal having a first slope. The measurement unit may retain a first measured value obtained by the first measurement. The measurement unit may perform second measurement that measures a length of a period from a start to a change of a value of the signal on the basis of a result of comparison between signal levels of the reset signal and a second reference signal having a second slope. The measurement unit may retain a second measured value obtained by the second measurement. The measurement unit may set an initial value on the basis of the first measured value or the second measured value in accordance with a result of comparison between a pixel signal read from a unit pixel and a predetermined reference voltage. The measurement unit may perform third measurement that measures a length of a period from a start to a change of a value of the signal by using the set initial value on the basis of a result of comparison between signal levels of the pixel signal and the first reference signal or the second reference signal corresponding to the result of comparison between the pixel signal and the reference voltage. The measurement unit may output a third measured value obtained by the third measurement.

When the signal level of the pixel signal is lower than the reference voltage, the measurement unit may set the initial value on the basis of the first measured value, and perform the third measurement by using the set initial value on the basis of a result of comparison between signal levels of the pixel signal and the first reference signal. When the signal level of the pixel signal is higher than the reference voltage, the measurement unit may set the initial value on the basis of the second measured value, and perform the third measurement by using the set initial value on the basis of a result of comparison between signal levels of the pixel signal and the second reference signal.

The measurement unit may include a number of flip-flop circuits corresponding to a bit length of each of the measured values and connected with each other in series, each of the flip-flops retaining a plurality of values.

The signal processing device may further include a comparison unit that performs comparison of signal levels of a signal read from a unit pixel and a reference signal. The measurement unit may perform the measurement on the basis of a signal indicating a result of the comparison performed by the comparison unit.

In addition, a signal processing method according to the one aspect of the present technology includes: performing measurement of a length of a period from an input start of a signal to a change of a value of the signal a plurality of times; retaining measured values obtained by the measurement performed the plurality of times; setting an initial value of the measurement on the basis of any one of a plurality of the retained measured values; and performing the measurement by using the initial value.

An imaging element according to another aspect of the present technology includes: a pixel array that includes a plurality of unit pixels disposed in matrix; and a measurement unit that performs measurement of a length of a period from an input start of a signal, which signal indicates a result of comparison between signal levels of a signal read from a unit pixel of the pixel array and a reference signal, to a change of a value of the signal a plurality of times, retains measured values obtained by the measurement performed the plurality of times, sets an initial value of the measurement on the basis of any one of a plurality of the retained measured values, and performs the measurement by using the initial value.

An electronic device according to a further aspect of the present technology includes: an imaging unit that images a subject; and an image processing unit that performs image processing of image data captured by the imaging unit. The imaging unit includes a pixel array that includes a plurality of unit pixels disposed in matrix, and a measurement unit that performs measurement of a length of a period from an input start of a signal, which signal indicates a result of comparison between signal levels of a signal read from a unit pixel of the pixel array and a reference signal, to a change of a value of the signal a plurality of times, retains measured values obtained by the measurement performed the plurality of times, sets an initial value of the measurement on the basis of any one of a plurality of the retained measured values, and performs the measurement by using the initial value.

A signal processing device according to a still further aspect of the present technology includes: one or a plurality of first latches each of which retains an input signal and outputs the retained signal; one or a plurality of second latches each of which obtains the signal retained in the first latch or latches and retains the obtained signal, and further supplies the retained signal to the first latch to allow the first latch to retain the supplied signal; and a transfer control unit that controls transfer of the signal between the first latch or latches and the second latch or latches.

The signal processing device may further include an inversion control unit that controls data inversion of the signal retained in the first latch or latches.

A signal processing device according to a still further aspect of the present technology includes: a plurality of latches connected with each other in series, each of the latches retaining a signal; and a control unit that controls transfer of the signal between the latches, and transfers a signal retained in the desired latch to the latch in a final stage, and outputs the signal from the latch in the final stage at the time of output of the signal.

According to one aspect of the present technology described above, measurement of a length of a period from an input start of a signal to a change of a value of the signal is performed a plurality of times. Measured values obtained by the measurement performed the plurality of times are retained. An initial value of the measurement is set on the basis of any one of a plurality of the retained measured values. The measurement is performed by using the initial value.

According to another aspect of the present technology described above, a plurality of unit pixels are disposed in matrix to constitute a pixel array. Measurement of a length of a period from an input start of a signal, which signal indicates a result of comparison between signal levels of a signal read from a unit pixel of the pixel array and a reference signal, to a change of a value of the signal is performed a plurality of times. Measured values obtained by the measurement performed the plurality of times are retained. An initial value of the measurement is set on the basis of any one of a plurality of the retained measured values. The measurement of the length of the period from the input start of the signal indicating the result of comparison between the signal levels of the signal read from the unit pixel of the pixel array and the reference signal to the change of the value of the signal is performed by using the initial value.

According to a further aspect of the present technology described above, an imaging element includes a plurality of unit pixels are disposed in matrix to constitute a pixel array of an electronic device. Measurement of a length of a period from an input start of a signal, which signal indicates a result of comparison between signal levels of a signal read from a unit pixel of the pixel array and a reference signal, to a change of a value of the signal is performed a plurality of times. Measured values obtained by the measurement performed the plurality of times are retained. An initial value of the measurement is set on the basis of any one of a plurality of the retained measured values. The measurement of the length of the period from the input start of the signal indicating the result of comparison between the signal levels of the signal read from the unit pixel of the pixel array and the reference signal to the change of the value of the signal is performed by using the initial value.

According to a still further aspect of the present technology described above, transfer of signals is controlled between one or a plurality of first latches each of which retains an input signal and outputs the retained signal, and one or a plurality of second latches each of which obtains the signal retained in the first latch or latches and retains the obtained signal, and further supplies the retained signal to the first latch to allow the first latch to retain the supplied signal.

According to a still further aspect of the present technology described above, transfer of signals is controlled between a plurality of latches connected with each other in series, each of the latches retaining a signal. A signal retained in the desired latch is transferred to the latch in a final stage, and output from the latch in the final stage.

Effects of the Invention

According to the present technology, signal processing is achievable. Moreover, according to the present technology, reduction of a rise of costs is achievable.

BRIEF DESCRIPTION OF DRAWINGS

FIG. 28 is a view showing an example of control signals.

MODE FOR CARRYING OUT THE INVENTION

Figure 1:
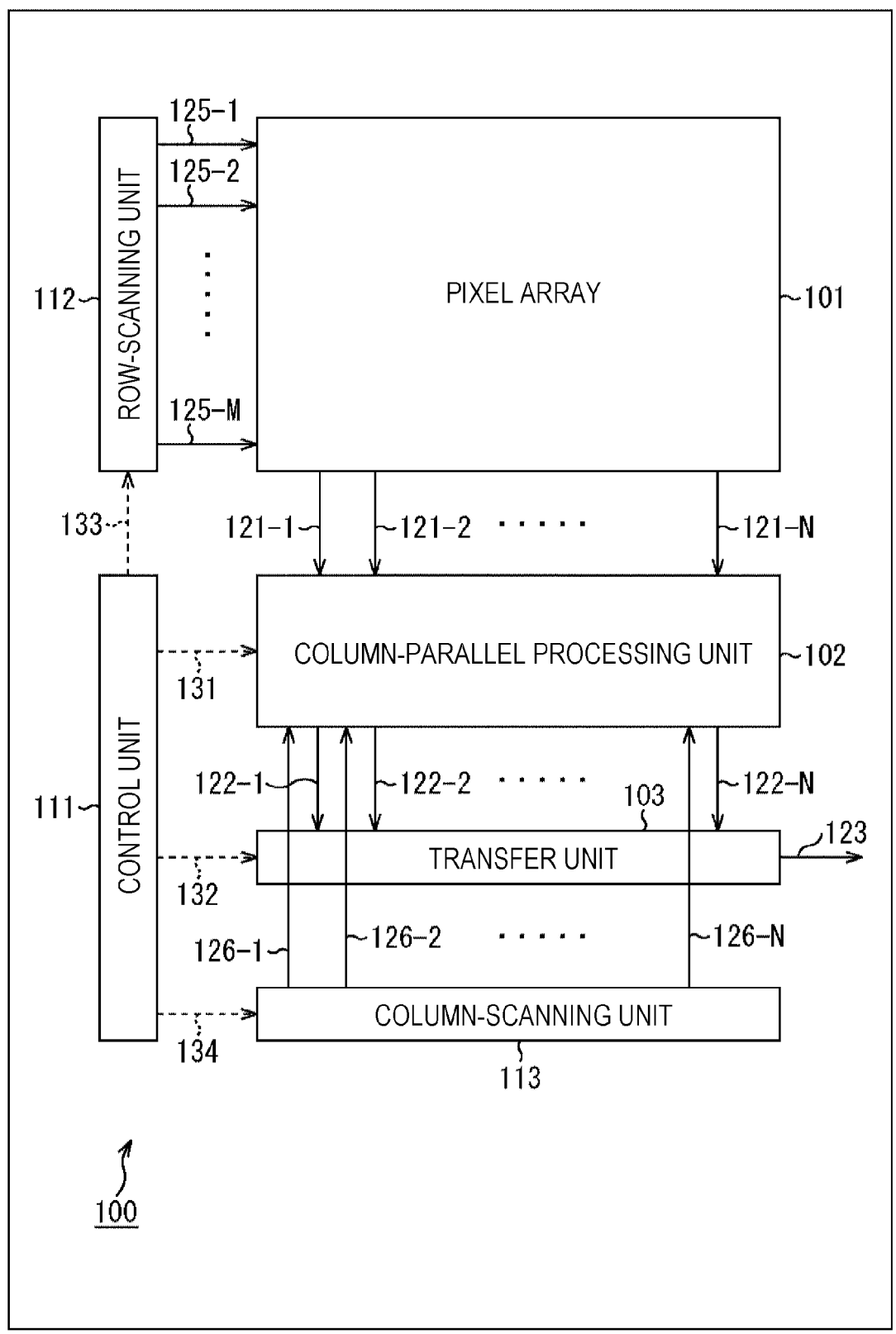
FIG. 1 is a view illustrating an example of a main configuration of an image sensor.

Modes for carrying out the present disclosure (hereinafter referred to as embodiments) are described hereinbelow. Note that the description is presented in the following order.

1. First Embodiment (image sensor, binary counter)
2. Second Embodiment (image sensor, hybrid counter)
3. Third Embodiment (image sensor, gray code counter)
4. Fourth Embodiment (image sensor, three-slope)
5. Fifth Embodiment (image sensor, physical configuration)
6. Sixth Embodiment (image sensor, area-parallel process)
7. Seventh Embodiment (imaging device)

1. First Embodiment

<Correlated Double Sampling>

There has been known a slope A/D conversion which achieves A/D conversion of an image sensor by comparing an image signal with a reference voltage having a ramp waveform by use of a comparator, and counting a time until inversion of output from the comparator. The slope A/D conversion is excellent in linearity and noise characteristics.

Incidentally, for A/D conversion of pixel signals of an image sensor, there has been a method which reduces kTC noise or the like contained in pixel signals by using correlated double sampling (CDS) to prevent lowering of image quality of a captured image.

However, according to the method described in Patent Document 1, analog CDS is employed in place of digital CDS which is difficult to perform by the method of Patent Document 1. Analog CDS does not completely remove fixed pattern noise in comparison with digital CDS and thus lowers noise features, in which condition image quality of a captured image may deteriorate.

On the other hand, use digital CDS is allowed for the methods described in Patent Documents 2 through 4. However, the method described in Patent Document 2 requires a multiple of blocks allowing count operation by a counter. This necessity doubles a counter area, and may raise costs. In addition, each of the methods described in Patent Document 3 and Patent Document 4 adopts a hybrid counter which uses binary codes for higher bits and gray codes for lower bits. In this case, a black level retaining unit and a selection means are needed for each of the binary codes and the gray codes. This necessity doubles a counter area, and may raise costs.

<Correlated Double Sampling within Counter>

Accordingly, measurement of a length of a period from an input start of a signal to a change of a value of the signal is performed a plurality of times. Measured values obtained by the measurement performed the plurality of times are retained. Thereafter, an initial value of the measurement is set on the basis of any one of a plurality of the retained measured values. The measurement of the length of the period from the input start of the signal to the change of the value of the signal is performed by using the initial value.

For example, a signal processing device includes a measurement unit that performs measurement of a length of a period from an input start of a signal to a change of a value of the signal a plurality of times, retains measured values obtained by the measurement performed the plurality of times, sets an initial value of the measurement on the basis of any one of a plurality of the retained measured values, and performs the measurement by using the initial value.

In this case, digital CDS is realizable within a counter without unnecessary increase in a circuit scale (area) of the measurement unit (i.e., while preventing increase in area of measurement unit). Accordingly, reduction of a rise of costs is achievable. In other words, increase in noise components is avoidable while reducing a rise of costs. Accordingly, in case of an image sensor, for example, lowering of image quality of a captured image decreases.

Note that the measurement unit may perform the measurement of the length of the period by counting a clock number of a predetermined clock signal, and retain an obtained count value as the measured value. In other words, the measurement unit may be constituted by a counter which counts a clock number. When this counter is used, the length of the period is easily obtained as a digital value.

In addition, the measurement unit may perform the measurement of the length of the period of a first signal a plurality of times, set the initial value on the basis of a measured value corresponding to one of the plurality of retained measured values and indicating a signal level of a second signal different from the first signal, and perform the measurement of the length of the period of a third signal different from the first signal and the second signal by using the set initial value.

In this case, the first signal may be a result of comparison between signal levels of a reset signal read from a unit pixel and a reference signal.

In addition, the reference signal may have a slope different for each measurement for the first signal.

In addition, the second signal may be a result of comparison between signal levels of a pixel signal read from a unit pixel and a predetermined reference voltage.

In addition, the third signal may be a result of comparison between signal levels of a pixel signal read from a unit pixel, and a reference signal having a slope corresponding to the signal level of the second signal.

In addition, the measurement unit may obtain all bits of each of the measured values of the measurement of the length of the period in binary codes. In this case, the measurement unit may invert data indicating the measured value contained in the measured values in the binary codes and corresponding to the signal level of the second signal, and set the inverted data as the initial value of the measurement of the length of the period for the third signal.

Note that the measurement unit may perform first measurement that measures a length of a period from a start to a change of a value of the signal on the basis of a result of comparison between signal levels of a reset signal read from a unit pixel and a first reference signal having a first slope. The measurement unit may retain a first measured value obtained by the first measurement. The measurement unit may perform second measurement that measures a length of a period from a start to a change of a value of the signal on the basis of a result of comparison between signal levels of the reset signal and a second reference signal having a second slope. The measurement unit may retain a second measured value obtained by the second measurement. The measurement unit may set an initial value on the basis of the first measured value or the second measured value in accordance with a result of comparison between a pixel signal read from a unit pixel and a predetermined reference voltage. The measurement unit may perform third measurement that measures a length of a period from a start to a change of a value of the signal by using the set initial value on the basis of a result of comparison between signal levels of the pixel signal and the first reference signal or the second reference signal corresponding to the result of comparison between the pixel signal and the reference voltage. The measurement unit may output a third measured value obtained by the third measurement.

When the signal level of the pixel signal is lower than the reference voltage, for example, the measurement unit may set the initial value on the basis of the first measured value, and perform the third measurement by using the set initial value on the basis of a result of comparison between signal levels of the pixel signal and the first reference signal. In addition, when the signal level of the pixel signal is higher than the reference voltage, for example, the measurement unit may set the initial value on the basis of the second measured value, and perform the third measurement by using the set initial value on the basis of a result of comparison between signal levels of the pixel signal and the second reference signal.

In this case, the measurement unit is capable of performing the third measurement on the basis of a reference signal having a slope more appropriate for the signal level of the pixel signal. Accordingly, higher dynamic range A/D conversion along with reduction of a drop of a frame rate is realizable by the use of the measurement unit configured as described above. In other words, more accurate A/D conversion at a high speed and in a high dynamic range is achievable while reducing a rise of costs.

Note that the measurement unit may include a number of flip-flop circuits corresponding to a bit length of each of the measured values and connected with each other in series, each of the flip-flops retaining a plurality of values.

In addition, a comparison unit that performs comparison of signal levels of a signal read from a unit pixel and a reference signal may be further provided. In this case, the measurement unit performs the measurement on the basis of a signal indicating a result of the comparison performed by the comparison unit.

In addition, a signal processing device such as a flip-flop may include: one or a plurality of first latches each of which retains an input signal and outputs the retained signal; one or a plurality of second latches each of which obtains the signal retained in the first latch or latches and retains the obtained signal, and further supplies the retained signal to the first latch to allow the first latch to retain the supplied signal; and a transfer control unit that controls transfer of the signal between the first latch or latches and the second latch or latches. In this case, the signal processing device is capable of retaining a plurality of values, selecting a desired value from the retained values, and outputting the selected value.

Note that the signal processing device may further include an inversion control unit that controls data inversion of the signal retained in the first latch or latches. In this case, the signal processing device is capable of outputting retained values, and outputting the values after data inversion.

<Image Sensor>

FIG. 1 illustrates an example of a main configuration of an image sensor according to an embodiment of an imaging element to which the present technology described above has been applied. An image sensor 100 illustrated in FIG. 1 is a device which performs photoelectric conversion of light received from a subject, and outputs image data obtained by the photoelectric conversion. For example, the image sensor 100 constitutes a complementary metal oxide semiconductor (CMOS) image sensor including a CMOS, a charge coupled device (CCD) image sensor including a CCD, or the like.

As illustrated in FIG. 1, the image sensor 100 includes a pixel array 101, a column-parallel processing unit 102, a transfer unit 103, a control unit 111, a row-scanning unit 112, and a column-scanning unit 113.

The pixel array 101 is a pixel area where pixel constituent elements (unit pixels), each of which contains a photoelectric conversion element such as a photodiode, are disposed in a flat shape or a curved shape. It is assumed hereinbelow that the unit pixels are disposed in an array of M rows and N columns (M, N: arbitrary natural numbers) on the pixel array 101. A detailed configuration of the pixel array 101 will be described below.

Each analog signal read from the respective unit pixels is transmitted to the column-parallel processing unit 102 via any one of vertical signals 121-1 through 121-N. In the following description, the respective vertical signal lines 121-1 through 121-N are collectively referred to as vertical signal lines 121 when no distinction between the vertical signal lines 121-1 through 121-N is needed in the description.

The column-parallel processing unit 102 processes signals transmitted from the pixel array 101 via one of the vertical signal lines 121 for each unit pixel column such that the respective signals are independently processed for each unit pixel column. For example, the column-parallel processing unit 102 performs A/D conversion of analog signals (such as reset signals and pixel signals) of each column read from the pixel array 101 into digital signals. The column-parallel processing unit 102 outputs obtained processing results of the respective signals (such as respective digital data obtained by A/D conversion of respective signals) to the transfer unit 103 via any one of signal lines 122-1 through 122-N. In the following description, the respective signal lines 122-1 through 122-N are collectively referred to as signal lines 122 when no distinction between the signal lines 122-1 through 122-N is needed in the description.

The transfer unit 103 transfers digital data supplied from the column-parallel processing unit 102 via the signal lines 122 to the outside of the image sensor 100, for example, via a signal line 123.

The control unit 111 controls the column-parallel processing unit 102 by supplying a control signal via a control line 131. The control unit 111 also controls the transfer unit 103 by supplying a control signal via a control line 132. The control unit 111 also controls the row-scanning unit 112 by supplying a control signal via a control line 133. The control unit 111 also controls the column-scanning unit 113 by supplying a control signal via a control line 134. Accordingly, the control unit 111 controls overall operations of the image sensor 100 (operations of respective units) by control respective units of the image sensor 100.

Note that, while each of the foregoing control lines 131 through 134 is indicated by a single dotted line (dotted-line arrow) in FIG. 1, each of these control lines may be constituted by a plurality of control lines.

The row-scanning unit 112 controls operations of transistors of the respective unit pixels of the pixel array 101 by supplying control signals via control lines 125-1 through 125-M under control by the control unit 111. Note that, in the following description, the respective control lines 125-1 through 125-M are collectively referred to as control lines 125 when no distinction between the control lines 125-1 through 125-N is needed in the description.

The column-scanning unit 113 controls operations of the column-parallel processing unit 102 for each column by supplying control signals via control lines 126-1 through 126-N under control by the control unit 111. Note that, in the following description, the respective control lines 126-1 through 126-N are collectively referred to as control lines 126 when no distinction between the control lines 126-1 through 126-N is needed in the description.

<Pixel Array>

Figure 2:
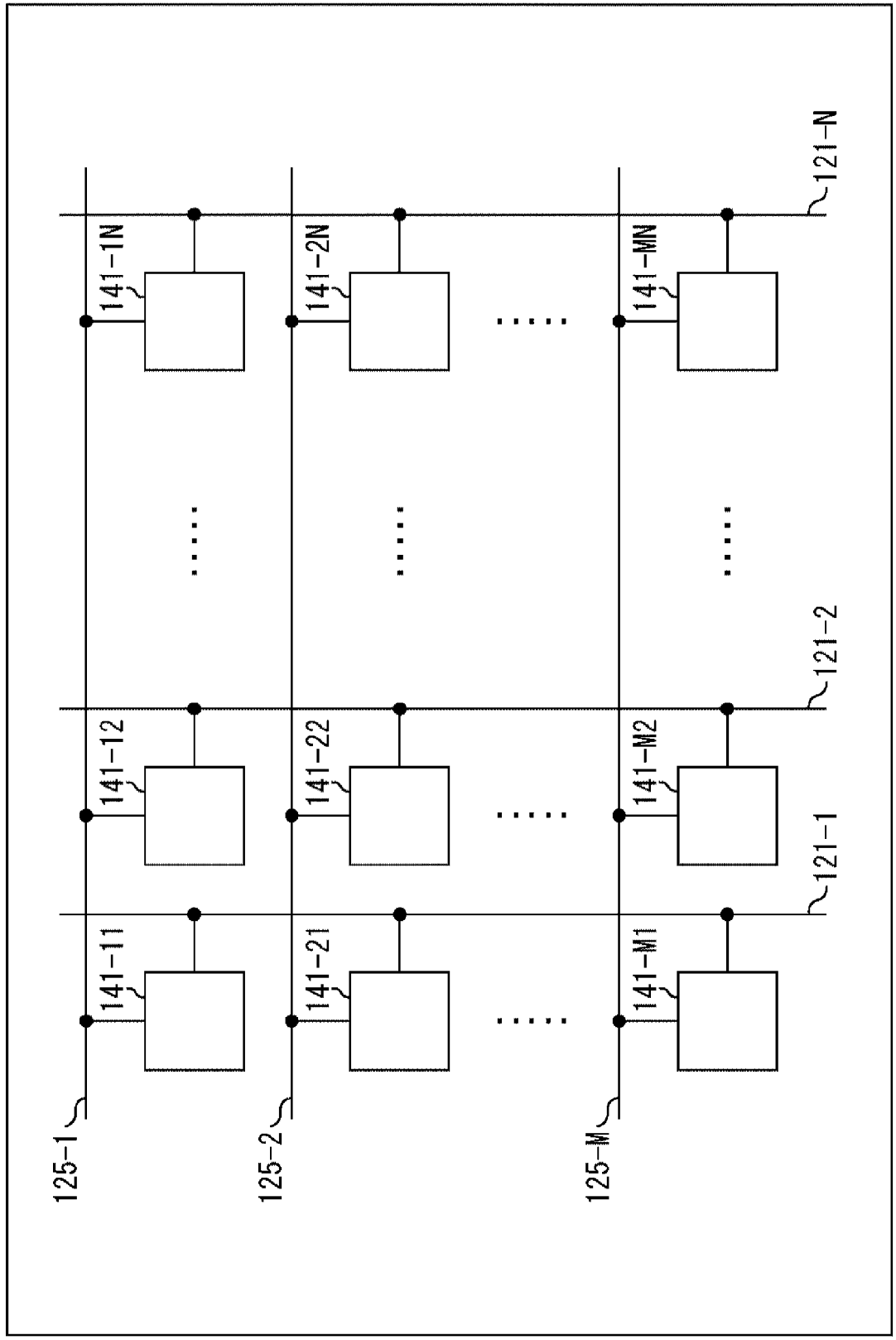
FIG. 2 is a view illustrating an example of a main configuration of a pixel array.

FIG. 2 illustrates an example of a main configuration of the pixel array 101. As described above, a plurality of unit pixels are arranged in a planar shape on the pixel area (pixel array 101). According to the example illustrated in FIG. 2, M×N unit pixels 141 (unit pixels 141-11 through 141-MN) are arranged in a matrix shape (array shape) of M rows and N columns. In the following description, the respective unit pixels 141-11 through 141-MN are collectively referred to as unit pixels 141 when no distinction between the unit pixels 141-11 through 141-MN is needed in the description. The unit pixels 141 are arranged in an arbitrary manner. For example, the unit pixels 141 may be arranged in a manner different from a matrix shape, such as a so-called honeycomb structure.

As illustrated in FIG. 2, each of the vertical signal lines 121 (vertical signal lines 121-1 through 121-N) is provided for corresponding one of the columns of the unit pixels 141 (hereinafter also referred to as unit pixel columns). In this case, each of the vertical signal lines 121 is connected to the respective unit pixels of the column (unit pixel column) associated with the corresponding vertical signal line 121 to transfer signals read from the respective unit pixels to the column-parallel processing unit 102. In addition, as illustrated in FIG. 2, each of the control lines 125 (control lines 125-1 through 125-M) is provided for corresponding one of the rows of the unit pixels 141 (hereinafter also referred to as unit pixel rows). In this case, each of the control lines 125 is connected to the respective unit pixels of the unit pixel row associated with the corresponding control line 125 to transfer control signals supplied from the row-scanning unit 112 to the corresponding respective unit pixels.

Accordingly, each of the unit pixels 141 is connected to the vertical signal line 121 allocated to the column (unit pixel column) to which the corresponding unit pixel 141 belongs, and the control line 125 allocated to the unit pixel row to which the corresponding unit pixel 141 belongs. Each of the unit pixels 141 is driven in accordance with a control signal supplied via the corresponding control line 125, and supplies an electric signal obtained by the corresponding unit pixel 141 to the column-parallel processing unit 102 via the corresponding vertical signal line 121.

Note that each of the control lines 125 in the respective rows as indicated by a single line in FIG. 2 may be constituted by a plurality of control lines.

<Unit Pixel Configuration>

Figure 3:
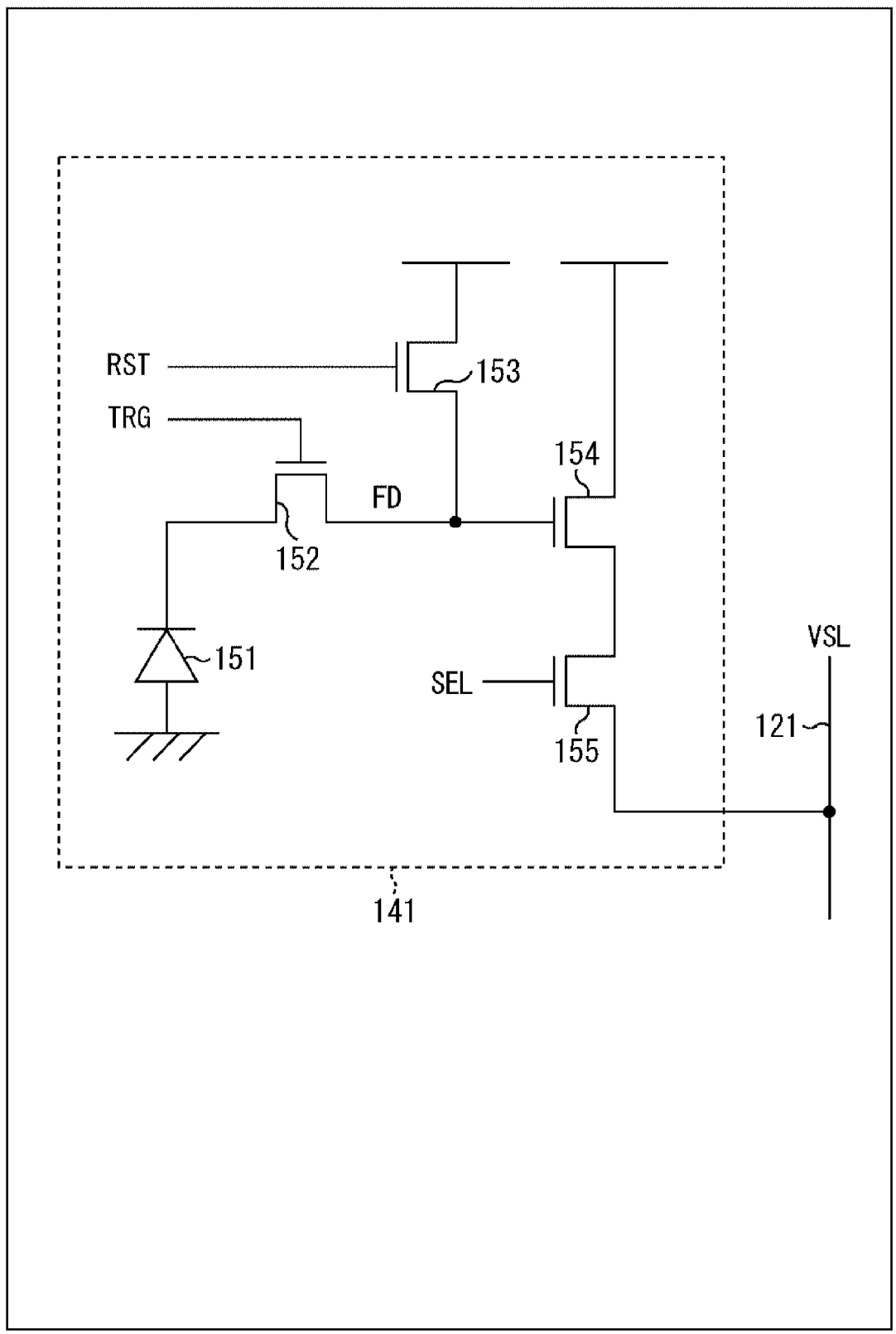
FIG. 3 is a view illustrating an example of a main configuration of a unit pixel.

FIG. 3 is a view illustrating an example of a main circuit configuration of each of the unit pixels 141. As illustrated in FIG. 3, the unit pixel 141 includes a photodiode (PD) 151, a transfer transistor 152, a reset transistor 153, an amplification transistor 154, and a select transistor 155.

The photodiode (PD) 151 performs photoelectric conversion for converting received light into light charges (photoelectrons in this example) in accordance with a light amount, and accumulates the light charges. The accumulated light charges are read at predetermined timing. An anode electrode of the photodiode (PD) 151 is connected to a ground of the pixel area (pixel ground), while a cathode electrode of the photodiode (PD) 151 is connected to a floating diffusion (FD) via the transfer transistor 152. Needless to say, the cathode electrode of the photodiode (PD) 151 may be connected to a power supply of the pixel area (pixel power supply), while the anode electrode of the photodiode (PD) 151 may be connected to the floating diffusion (FD) via the transfer transistor 152. In this system, a light charge is read as a photohole.

The transfer transistor 152 controls reading of light charges from the photodiode (PD) 151. A drain electrode of the transfer transistor 152 is connected to the floating diffusion, while a source electrode of the transfer transistor 152 is connected to the cathode electrode of the photodiode (PD) 151. In addition, a transfer control line (TRG) for transmitting a transfer control signal supplied from the row-scanning unit 112 is connected to a gate electrode of the transfer transistor 152. Accordingly, the transfer control line (TRG) is included in the control line 125 illustrated in FIG. 2.

When a signal of the transfer control line (TRG) (i.e., gate potential of transfer transistor 152) is in an off-state, light charges are not transferred from the photodiode (PD) 151 (light charges are accumulated in photodiode (PD) 151). On the other hand, when a signal of the transfer control line (TRG) is in an on-state, light charges accumulated in the photodiode (PD) 151 are transferred to the floating diffusion (FD).

The reset transistor 153 resets a potential of the floating diffusion (FD). A drain electrode of the reset transistor 153 is connected to a power supply potential, while a source electrode of the reset transistor 153 is connected to the floating diffusion (FD). In addition, a reset control line (RST) for transmitting a reset control signal supplied from the row-scanning unit 112 is connected to a gate electrode of the reset transistor 153. Accordingly, the reset control line (RST) is included in the control line 125 illustrated in FIG. 2.

When a signal of the reset control line (RST) (i.e., gate potential of reset transistor 153) is in an off-state, the floating diffusion (FD) is separated from the power supply potential. On the other hand, when a signal of the reset control line (RST) is in an on-state, a charge of the floating diffusion (FD) is discarded to the power supply potential to reset the floating diffusion (FD).

The amplification transistor 154 amplifies a potential change of the floating diffusion (FD), and outputs the amplified potential change as an electric signal (analog signal). A gate electrode of the amplification transistor 154 is connected to the floating diffusion (FD), a drain electrode of the amplification transistor 154 is connected to a source follower power supply voltage, and a source electrode of the amplification transistor 154 is connected to a drain electrode of the select transistor 155.

For example, the amplification transistor 154 outputs a potential of the floating diffusion (FD) reset by the reset transistor 153 to the select transistor 155 as a reset signal (reset level). In addition, the amplification transistor 154 outputs a potential of the floating diffusion (FD) having received transfer of light charges from the transfer transistor 152 to the select transistor 155 as a light accumulation signal (signal level).

The select transistor 155 controls output of an electric signal received from the amplification transistor 154 to the vertical signal line (VSL) 121 (i.e., column-parallel processing unit 102). A drain electrode of the select transistor 155 is connected to the source electrode of the amplification transistor 154, while a source electrode of the select transistor 155 is connected to the vertical signal line 121. In addition, a select control line (SEL) for transmitting a select control signal supplied from the row-scanning unit 112 is connected to a gate electrode of the select transistor 155. Accordingly, the select control line (SEL) is included in the control line 125 illustrated in FIG. 2.

When a signal of the select control line (SEL) (i.e., gate potential of select transistor 155) is in an off-state, the amplification transistor 154 and the vertical signal line 121 are electrically separated from each other. Accordingly, a reset signal, a pixel signal or the like is not output from the corresponding unit pixel 141 in this state. On the other hand, when the select control line (SEL) is in an on-state, the corresponding unit pixel 141 comes into a select state. More specifically, the amplification transistor 154 and the vertical signal line 121 are electrically connected, in which condition a signal output from the amplification transistor 154 is supplied to the vertical signal line 121 as a pixel signal of the corresponding unit pixel 141. In other words, a reset signal, a pixel signal or the like is read from the corresponding unit pixel 141.

Note that the configuration of the unit pixel 141 is not limited to the example illustrated in FIG. 3, but may be an arbitrary configuration. For example, a five-transistor type, a floating diffusion shared type, or other various types of configurations may be adopted.

<Column-Parallel Processing Unit>

Figure 4:
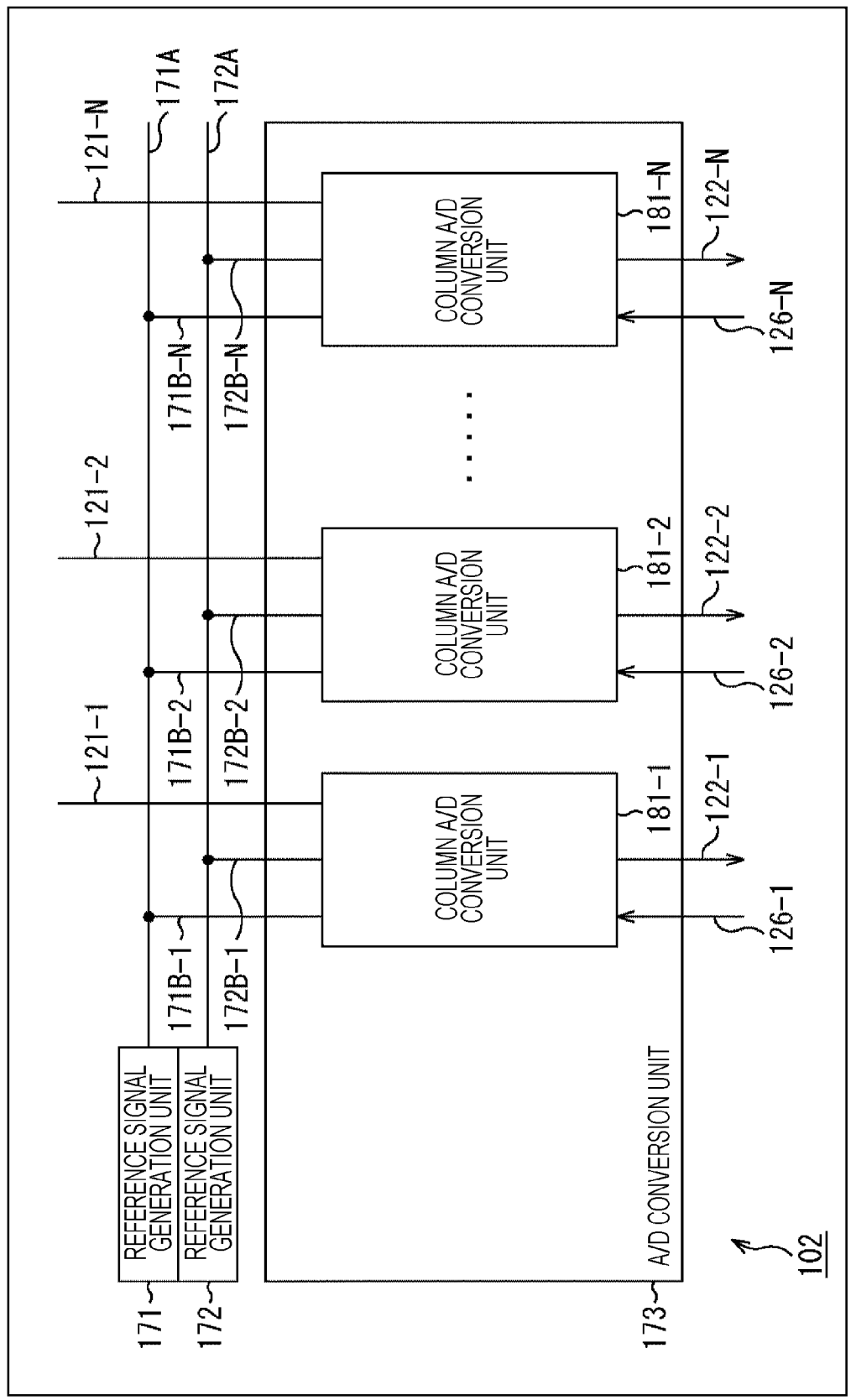
FIG. 4 is a view illustrating an example of a main configuration of a column-parallel processing unit.

A configuration example of the column-parallel processing unit 102 (FIG. 1) is hereinafter described with reference to FIG. 4. As illustrated in FIG. 4, the column-parallel processing unit 102 includes a reference signal generation unit 171, a reference signal generation unit 172, and an A/D conversion unit 173.

The reference signal generation unit 171 generates a reference signal (also referred to as reference voltage) corresponding to a reference signal for A/D conversion by the A/D conversion unit 173. A waveform of this reference signal may be an arbitrary waveform. For example, the reference signal may be a signal having a ramp wave (sawtooth wave). The reference signal discussed hereinbelow is an example of a signal having a ramp wave (Ramp).

The reference signal generation unit 171 includes a D/A conversion unit, for example, to generate the reference signal (Ramp) by using the D/A conversion unit. The reference signal (Ramp) is supplied to the A/D conversion unit 173 via a reference signal line 171A, and one of reference signal lines 171B-1 through reference signal lines 171B-N. In the following description, the respective reference signal lines 171B-1 through 171B-N are collectively referred to as reference signal lines 171B when no distinction between the reference signal lines 171B-1 through 171B-N is needed in the description.

The reference signal generation unit 172 is a processing unit similar to the reference signal generation unit 171, and generates a reference signal (also referred to as reference voltage) corresponding to a reference signal for A/D conversion by the A/D conversion unit 173. The reference signal (Ramp) generated by the reference signal generation unit 172 is supplied to the A/D conversion unit 173 via a reference signal line 172A, and one of reference signal lines 172B-1 through reference signal lines 172B-N. In the following description, the respective reference signal lines 172B-1 through 172B-N are collectively referred to as reference signal lines 172B when no distinction between the reference signal lines 172B-1 through 172B-N is needed in the description.

A slope of a reference signal (Ramp) generated by the reference signal generation unit 171 is different from a slope of a reference signal (Ramp) generated by the reference signal generation unit 172. The reference signal generation unit 171 generates a reference signal (Ramp) having a smaller slope than a slope of a reference signal (Ramp) generated by the reference signal generation unit 172.

The A/D conversion unit 173 performs A/D conversion of an analog signal (reset signal, pixel signal or the like) supplied from the pixel array 101 via one of the vertical signal lines 121 on the basis of the reference signal (Ramp) generated by the reference signal generation unit 171 or the reference signal (Ramp) generated by the reference signal generation unit 172. In this case, the A/D conversion unit 173 is allowed to perform digital CDS. In addition, the A/D conversion unit 173 performs A/D conversion of a reset signal during a reset period (hereinafter also referred to as P-phase) of this digital CDS for each of the reference signal (Ramp) generated by the reference signal generation unit 171 and the reference signal (Ramp) generated by the reference signal generation unit 172, and performs A/D conversion of a pixel signal during a signal reading period (hereinafter also referred to as D-phase) on the basis of a reference signal which is either the reference signal (Ramp) generated by the reference signal generation unit 171 or the reference signal (Ramp) generated by the reference signal generation unit 172, and corresponds to the signal level of the pixel signal.

Accordingly, the A/D conversion unit 173 is capable of performing A/D conversion of a pixel signal on the basis of a reference signal having a more appropriate slope for the signal level of the pixel signal. In other words, the A/D conversion unit 173 is capable of realizing more accurate A/D conversion at a high speed and in a high dynamic range.

The A/D conversion unit 173 outputs digital data (a result of A/D conversion) obtained by A/D conversion in the manner described above to the transfer unit 103 via the signal lines 122.

Each of the reference signal generation unit 171, the reference signal generation unit 172, and the A/D conversion unit 173 operates in accordance with a control signal supplied from the control unit 111 via the control line 131 (i.e., control by the control unit 111). In addition, the A/D conversion unit 173 performs the A/D conversion described above on the basis of control signals supplied from the column-scanning unit 113 via the control lines 126 (i.e., control by the column-scanning unit 113) for each of the columns.

As illustrated in FIG. 4, the A/D conversion unit 173 includes column A/D conversion units 181-1 through 181-N. In the following description, the respective column A/D conversion units 181-1 through 181-N are collectively referred to as column A/D conversion units 181 when no distinction between the column A/D conversion units 181-1 through 181-N is needed in the description. Each of the column A/D conversion units 181 is provided for corresponding one of the columns (unit pixel columns) of the pixel array 101.

In this case, each of the column A/D conversion units 181 (column A/D conversion units 181-1 through 181-N) is configured to connect with the vertical signal line 121 (one of vertical signal lines 121-1 through 121-N), the reference signal line 171B, and the reference signal line 172B in the column associated with the corresponding column A/D conversion unit 181 as illustrated in FIG. 4. Each of the column A/D conversion unit 181 performs A/D conversion for signals (such as reset signals and pixel signals) read from the unit pixels 141 in the column associated with the corresponding column A/D conversion unit 181, and supplied via the vertical signal line 121 of the corresponding column on the basis of reference signals supplied from the reference signal generation unit 171 via the reference signal 171A and the reference signal 171B, or reference signals supplied from the reference signal generation unit 172 via the reference signal line 172A and the reference signal line 172B.

Moreover, as illustrated in FIG. 4, each of the column A/D conversion units 181 is configured to connect with the signal line 122 (one of signal lines 122-1 through 122-N) in the column associated with the corresponding column A/D conversion unit 181. Each of the column A/D conversion units 181 supplies a result of A/D conversion obtained thereby to the transfer unit 103 via the signal line 122 associated with the corresponding column A/D conversion unit 181.

Furthermore, each of the column A/D conversion unit 181 (column A/D conversion units 181-1 through 181-N) is configured to connect with the control line 126 (one of control lines 126-1 through 126-N) in the column associated with the corresponding column A/D conversion unit 181. Each of the column A/D conversion units 181 is driven in accordance with a control signal supplied from the column-scanning unit 113 via the corresponding control line 126 (i.e., control by column-scanning unit 113). Note that each of the control lines 126 constituted by a single line in each of the columns as illustrated in FIG. 4 may be constituted by a plurality of control lines.

According to the example described above, each of the column A/D conversion units 181 is provided for corresponding one of the unit pixel columns of the pixel array 101. However, the number of the column A/D conversion units 181 included in the A/D conversion unit 173 may be an arbitrary number, such as the same number as the number of the unit pixel columns of the pixel array 101, or a number larger or smaller than the number of the unit pixel columns. For example, each of the column A/D conversion units 181 may be provided for a set of a plurality of unit pixel columns.

<Column A/D Conversion Unit>

Figure 5:
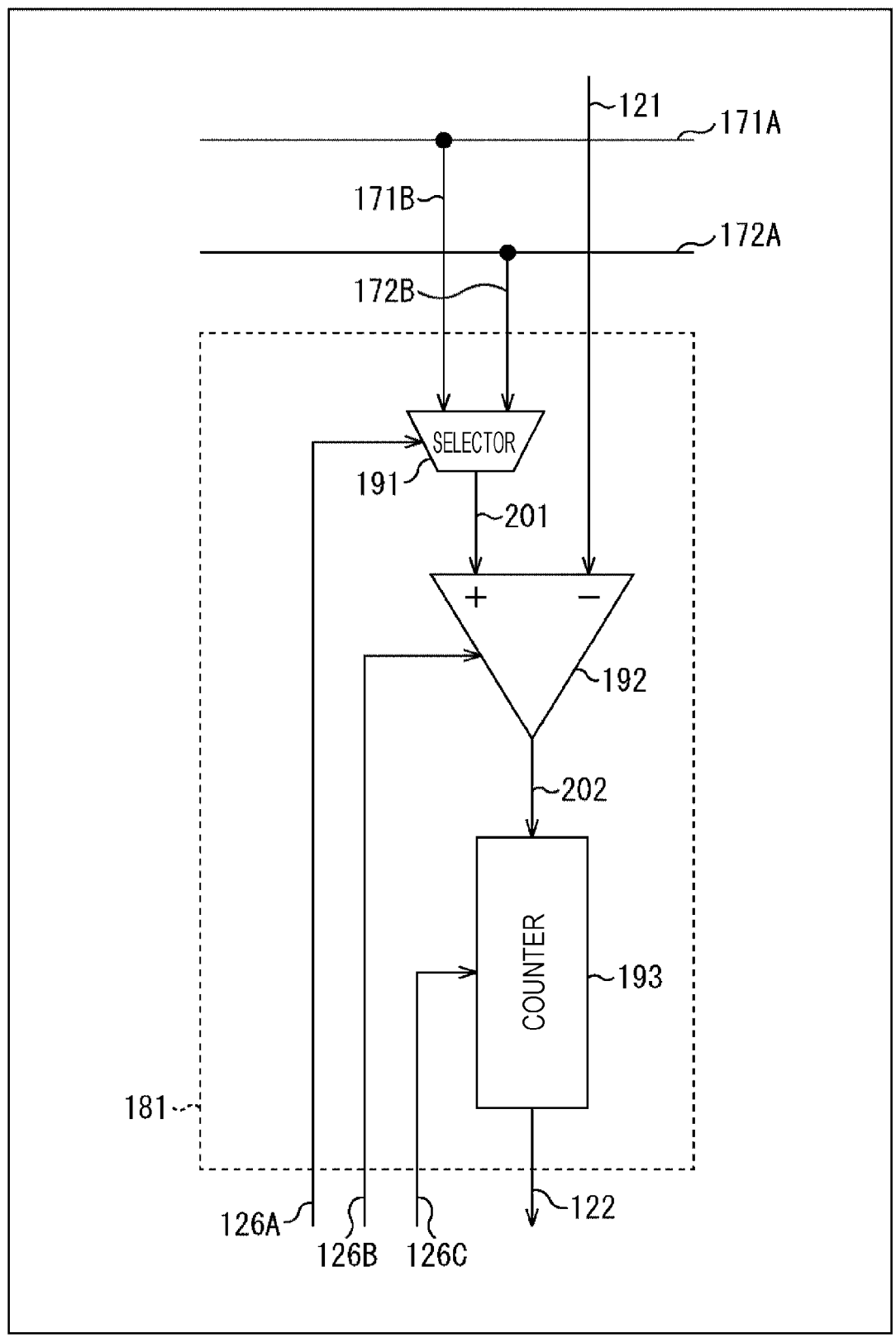
FIG. 5 is a view illustrating an example of a main configuration of a column A/D conversion unit.

A configuration example of the column A/D conversion unit 181 (FIG. 4) is hereinafter described with reference to FIG. 5. As illustrated in FIG. 5, the column A/D conversion unit 181 includes a selector 191, a comparison unit 192, and a counter 193.

The two-input one-output selector 191 is configured such that one of input terminals is connected to the reference signal line 171B, that the other input terminal is connected to the reference signal line 172B, and that an output terminal is connected to one of input terminals of the comparison unit 192 via a signal line 201. The selector 191 selects a reference signal supplied to the comparison unit 192.

More specifically, the selector 191 selects either a reference signal generated by the reference signal generation unit 171 or a reference signal generated by the reference signal generation unit 172 in accordance with a control signal supplied from the column-scanning unit 113 via the control line 126A (i.e., control by column-scanning unit 113).

The two-input one-output comparison unit 192 is configured such that one of input terminals is connected to the vertical signal line 121 of the column associated with the comparison unit 192, that the other input terminal is connected to an output terminal of the selector 191 via the signal line 201, and that an output terminal is connected to an input terminal of the counter 193 via a signal line 202. The comparison unit 192 compares signal levels of signals input to both the input terminals.

More specifically, the comparison unit 192 compares an input signal supplied via the vertical signal line 121 (such as analog signal read from unit pixel 141), with a reference signal supplied via the signal line 201 (compares signal levels) in accordance with a control signal supplied from the column-scanning unit 113 via the control line 126B (i.e., control by column-scanning unit 113), and outputs a comparison result thus obtained to the counter 193 via the signal line 202. In other words, the comparison unit 192 supplies, to the counter 193, a signal indicating which of the input signal and the reference signal has a higher signal level.

For example, a signal indicating the comparison result is constituted by one-bit digital data. For example, a value of a signal indicating this comparison result becomes "0" when the signal level of the reference signal is higher than the signal level of the input signal. On the other hand, this value becomes "1" in an opposite case. Needless to say, the value of this signal may be determined in an opposite manner. In addition, a bit length of the signal indicating the comparison result may be an arbitrary length. The signal may be information constituted by a plurality of bits.

The counter 193 is configured such that an input terminal is connected to an output terminal of the comparison unit 192 via the signal line 202, and that an output terminal is connected to the signal line 122 of the column associated with the counter 193. The counter 193 receives a comparison result from the comparison unit 192. The counter 193 measures a time from a count start until inversion of the comparison result (change of signal level of output signal from comparison unit 192) (for example, counts clock number of predetermined clock signal) in accordance with a control signal supplied from the column-scanning unit 113 via the control line 126C (i.e., control by column-scanning unit 113). Subsequently, the counter 193 outputs a count value up to the time of inversion of the comparison result to the transfer unit 103 via the signal line 122 as an A/D conversion result of the input signal input to the comparison unit 192 (i.e., digital data indicating signal read from unit pixel 141).

The control lines 126A through 126C described above are included in the control lines 126 illustrated in FIG. 4.

In the P-phase of CDS, for example, the column-scanning unit 113 allows the selector 191 to sequentially select a reference signal, allows the comparison unit 192 to sequentially compare a reset signal with the selected reference signal, and allows the counter 193 to measure a time from a count start until a change of a value of a comparison result for each of the comparison results. In other words, A/D conversion of the reset signal is performed on the basis of the reference signal.

Moreover, in the D-phase of CDS, for example, the column-scanning unit 113 allows the selector 191 to select a reference signal corresponding to a signal level of a pixel signal, allows the comparison unit 192 to compare the pixel signal with the selected reference signal, and allows the counter 193 to measure a time from a count start until a change of a value of a comparison result for each of comparison results. In other words, A/D conversion of a pixel signal is performed on the basis of a reference signal corresponding to a signal level of the pixel signal (for example, reference signal having slope corresponding to signal level of pixel signal).

Accordingly, the A/D conversion unit 173 is capable of performing A/D conversion of a pixel signal in the D-phase on the basis of a reference signal more appropriate for the signal level of the pixel signal (such as reference signal having more appropriate slope). More specifically, the A/D conversion unit 173 eliminates A/D conversion on the basis of an unnecessary reference signal in the D-phase, thereby realizing more accurate A/D conversion at a high speed and in a high dynamic range.

<Counter>

The counter 193 may obtain all bits of a measured value of a time from a count start until inversion of a comparison result (such as count value of clock number) in binary codes, for example. In other words, the counter 193 may be constituted only by a binary counter.

Figure 6:
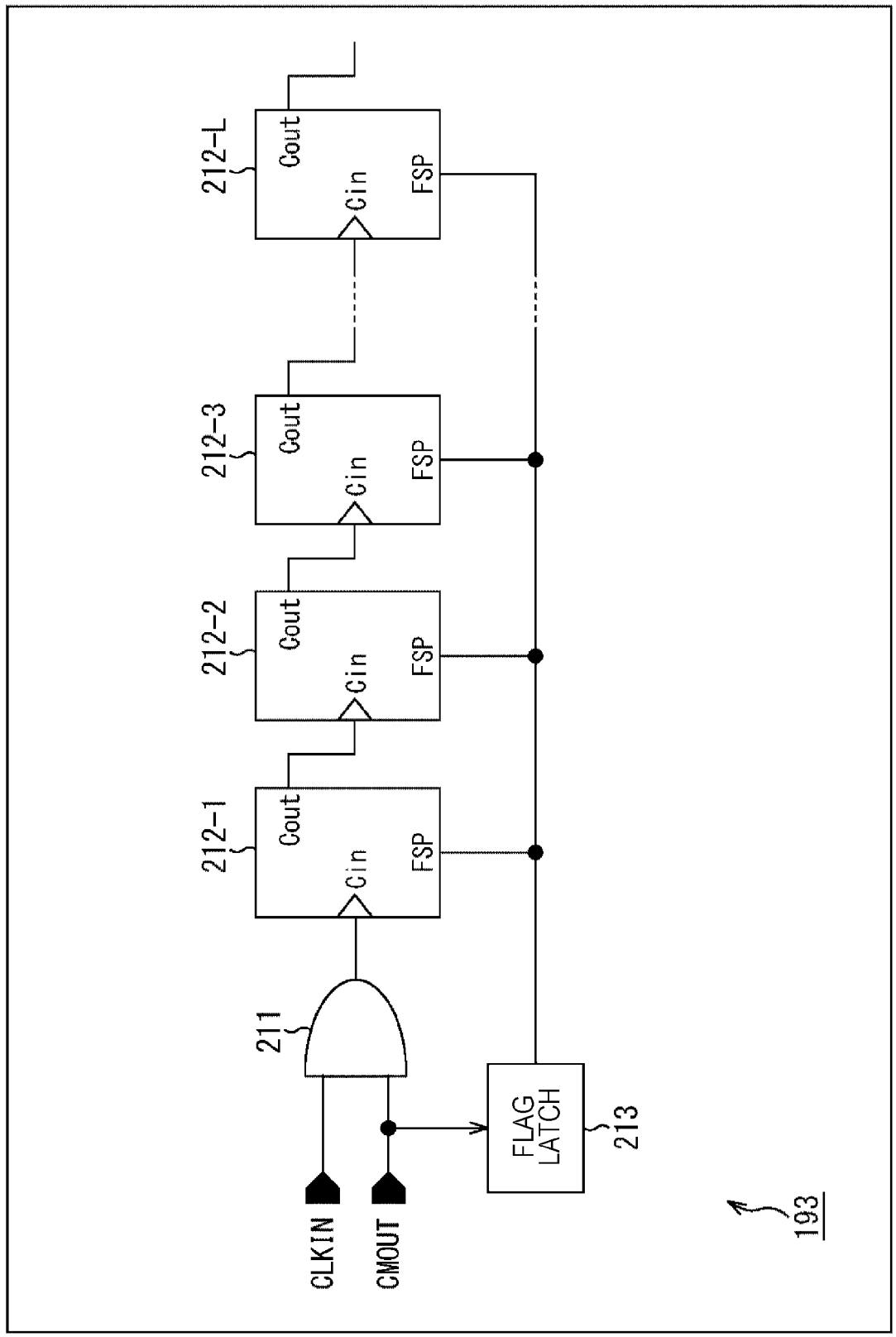
FIG. 6 is a view illustrating an example of a main configuration of a counter.

FIG. 6 illustrates an example of a main configuration of the counter 193 constituted by a binary counter. In this case, the counter 193 includes an AND gate 211, D flip-flops 212-1 through 212-L (L: arbitrary natural number), and a flag latch 213 configured as in the example illustrated in FIG. 6. Each of the D flip-flops 212-1 through 212-L is constituted by a D flip-flop circuit having a similar configuration. In the following description, the D flip-flops 212-1 through 212-L are collectively referred to as D flip-flops 212 when no distinction between the D flip-flops 212-1 through 212-L is needed in the description.

In this case, the counter 193 outputs a count value having a bit length L. More specifically, each of the D flip-flops 212 of the counter 193 includes a serial connection of the same number of ripple counters as the bit number of the count value to perform counting by using the ripple counters.

A logical product (AND) of an input clock CLKIN and an output CMOUT of the comparison unit 192 is calculated to control a count period. In addition, a flag signal (F) corresponding to a result of comparison between the D-phase and a reference voltage is input with the shared CMOUT. The flag latch 213 stores the flag signal (F). The flag signal (F) retained in the flag latch 213 is used for control of an operation of a save latch within each of the D flip-flops 212.

<D Flip-Flop>

Figure 7:
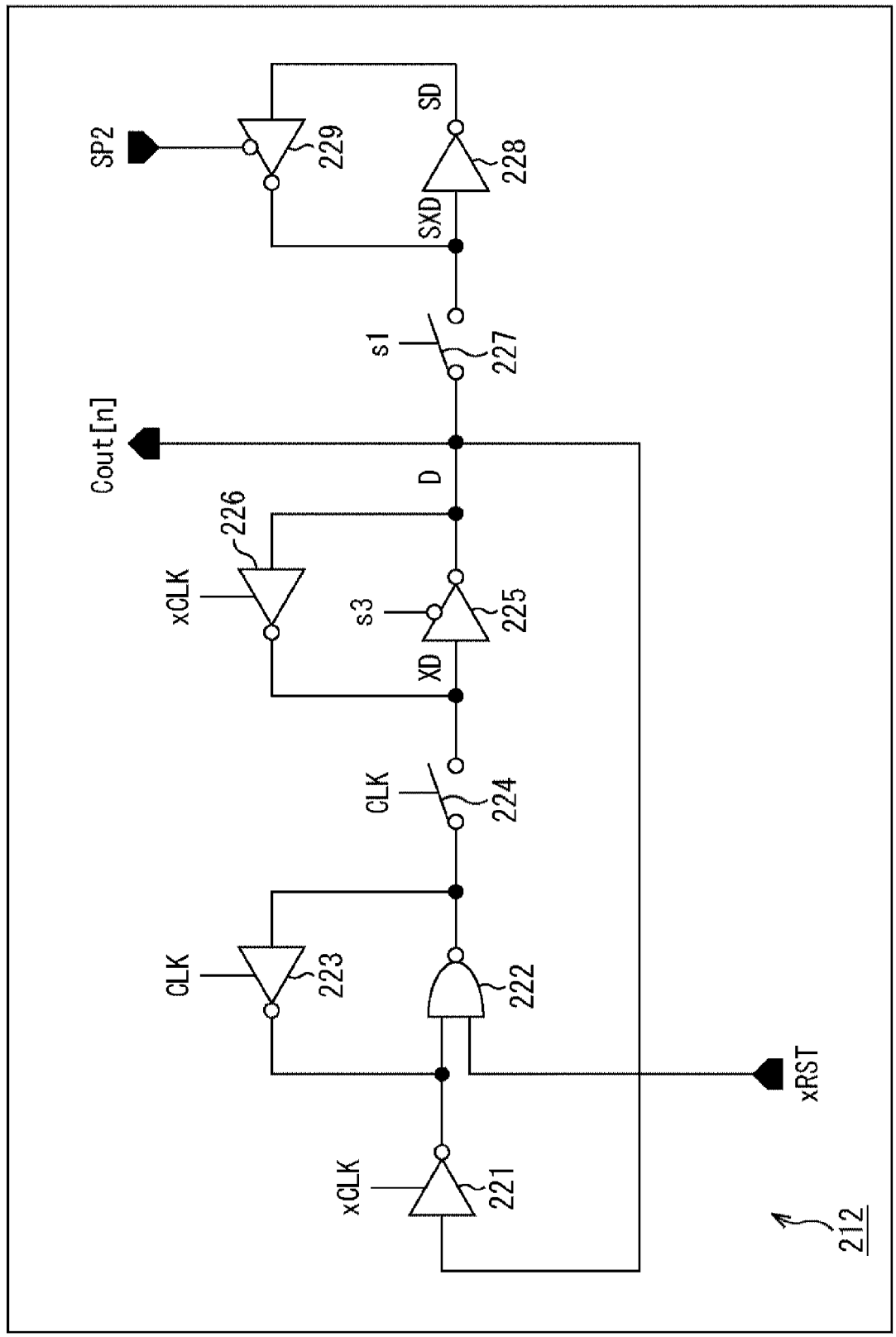
FIG. 7 is a view illustrating an example of a main configuration of a flip-flop.

FIG. 7 illustrates an example of a main configuration of each of the D flip-flops 212. The D flip-flop 212 includes a NOT gate 221, a NAND gate 222, a NOT gate 223, a switch 224, a NOT gate 225, a NOT gate 226, a switch 227, a NOT gate 228, and a NOT gate 229 configured as in the example illustrated in FIG. 7.

As illustrated in FIG. 7, the NOT gate 225 and the NOT gate 226 constitute a latch. Similarly, the NOT gate 228 and the NOT gate 229 constitute a latch. The latch constituted by the NOT gate 228 and the NOT gate 229 functions as a save latch. The switch 227 controls input and output of a signal to and from this save latch in accordance with a value of a control signal s1.

Figure 8:
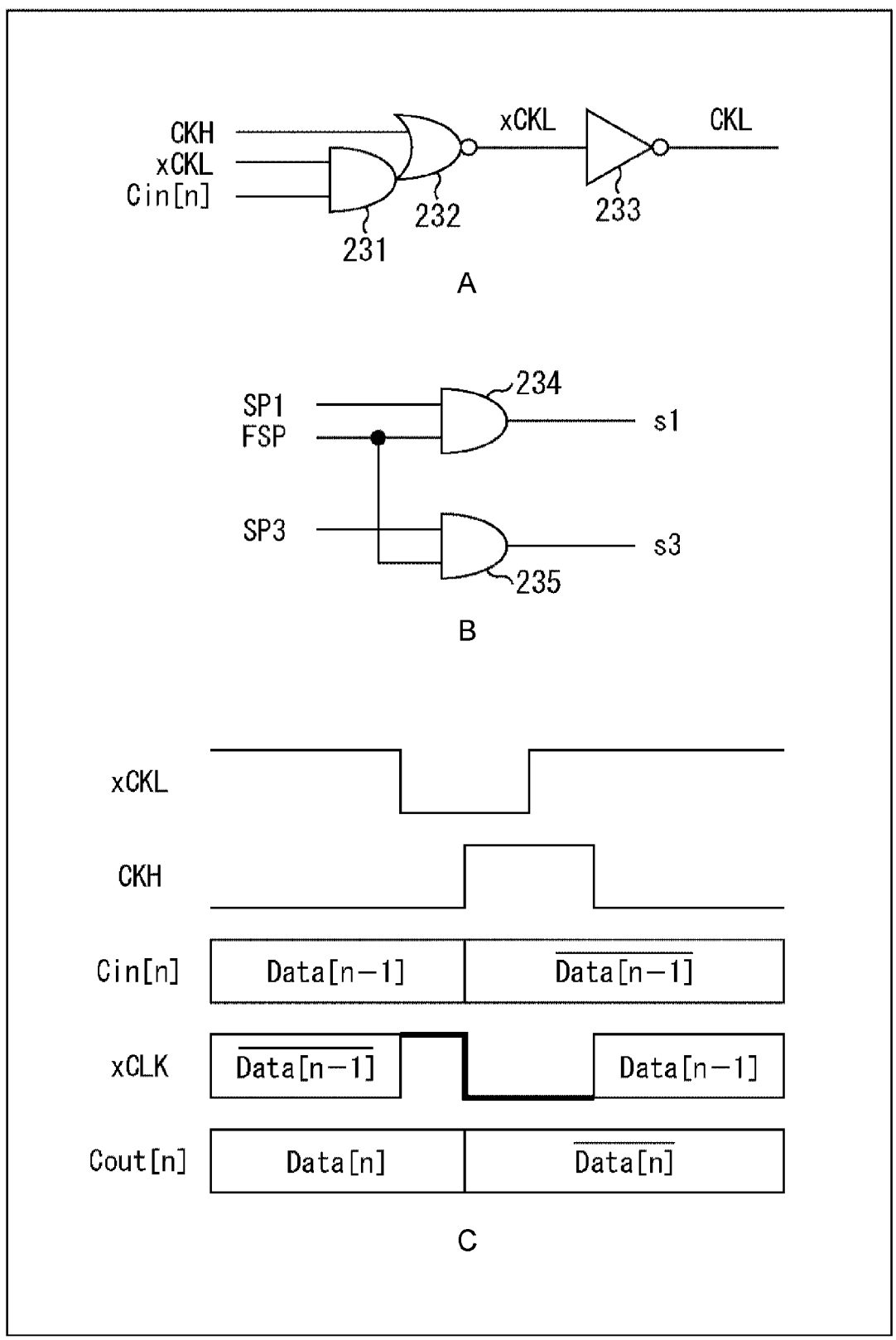
FIG. 8 is a view showing an example of control signals.

A control signal CLK controlling the NOT gate 223 and the switch 224, and a control signal xCLK controlling the NOT gate 221 and the NOT gate 226 and corresponding to an inverted value of the control signal CLK are generated from a control signal CKH, a control signal xCKL, and Cin[n] by using a logic circuit constituted by an AND gate 231, a NOR gate 232, and a NOT gate 233 as illustrated in A of FIG. 8.

On the other hand, the control signal s1 controlling the switch 227, and a control signal s3 controlling the NOT gate 225 are generated from a control signal SP1, a control signal FSP, and a control signal SP3 by using a logic circuit constituted by an AND gate 234 and an AND gate 235 as illustrated in B of FIG. 8.

C of FIG. 8 shows an example of a timing chart of the respective control signals.

In the D flip-flop 212 (FIG. 7), a signal retained at Cout[n] is transferred to the save latch (latch constituted by NOT gate 228 and NOT gate 229) by bringing the switch 227 into an on-state (ON) in accordance with the control signal s1, for example. On the other hand, a new signal is retained at Cout[n] with the previous signal retained in the save latch by bringing the switch 227 into an off-state (OFF) in accordance with the control signal s1. When the switch 227 is again brought into the on-state (ON) in accordance with the control signal s1, the signal retained in the save latch (latch constituted by NOT gate 228 and NOT gate 229) is restored into Cout[n].

Accordingly, the D flip-flop 212 includes a first latch capable of retaining an input signal and outputting a signal retained in the first latch, a second latch capable of obtaining and retaining a signal retained in the first latch, and supplying a signal retained in the second latch to the first latch to allow the first latch to retain the signal, and a transfer control unit for controlling transfer of a signal between the first latch and the second latch.

The D flip-flop 212 retaining signals by using the save latch described above is capable of retaining a plurality of signals, and selecting and outputting a desired one of the respective signals.

The counter 193 realized as in the example of FIG. 6 by using the D flip-flops 212 is capable of retaining a plurality of count values (respective bits of count values). Accordingly, the counter 193 retains both a count value of a comparison result based on a reference signal generated by the P-phase reference signal generation unit 171, and a count value of a comparison result based on a reference signal generated by the P-phase reference signal generation unit 172, and selects and uses a desired one of these count values in the D-phase during digital CDS. For example, the counter 193 selects and outputs a count value corresponding to a signal level of a pixel signal. Accordingly, the column A/D conversion unit 181 is capable of setting an initial value corresponding to a signal level of a pixel signal during counting in the D-phase of digital CDS. More specifically, the column A/D conversion unit 181 sets a more appropriate initial value at the time of A/D conversion of a pixel signal on the basis of a reference signal corresponding to the signal level of the pixel signal in the D-phase. In other words, the column A/D conversion unit 181 more accurately performs high speed and high dynamic range A/D conversion in the manner described above.

In addition, a value of Cout[n] is inverted by switching the control signal xCKL to L and the control signal CKH to H while locking the D flip-flop 212 as illustrated in C of FIG. 8. Accordingly, the D flip-flop 212 is allowed to further include an inversion control unit for controlling data inversion of a signal retained in the first latch.

Digital CDS within the counter 193 is realizable by setting an initial value of the D-phase count to an inverted value of the P-phase. In other words, the column A/D conversion unit 181 more accurately performs high speed and high dynamic range A/D conversion in the manner described above.

Moreover, digital CDS is realizable only by slight addition of the foregoing configuration to the D flip-flops 212, wherefore a circuit scale (area necessary for installation) of the counter 193 does not increase. When the circuit scale of the counter 193 increases, the circuit scale of the image sensor 100 similarly increases. When the area necessary for installation of the image sensor 100 increases, a size of a semiconductor substrate necessary for installation of the image sensor 100 similarly increases. In this case, manufacturing costs may rise. Even when installation of the image sensor 100 is allowed without increasing the semiconductor substrate, more difficult designing may be needed. In this case, developing costs may rise.

The column A/D conversion unit 181 (i.e., A/D conversion unit 173) including the D flip-flops 212 (counter 193) according to the present technology is capable of reducing increase in the circuit scale. Accordingly, high speed and high dynamic range A/D conversion is more accurately realizable while reducing a rise of costs. In other words, the image sensor 100 is capable of reducing a rise of costs by using the column A/D conversion unit 181 (i.e., A/D conversion unit 173) to which the present technology has been applied.

<Flow of A/D Conversion Process>

Figure 9:
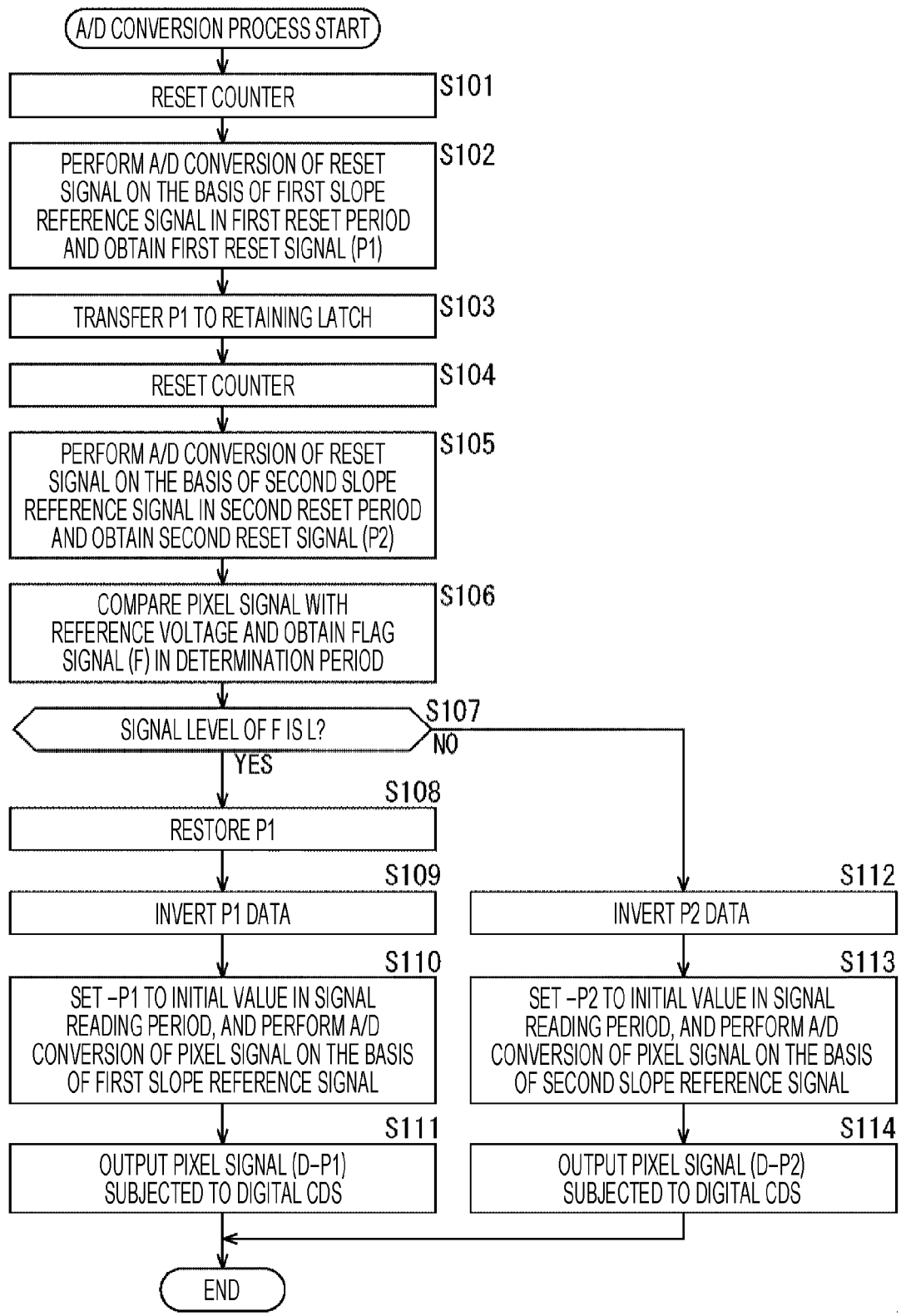
FIG. 9 is a flowchart showing an example of a flow of an A/D conversion process.

An example of a flow of an A/D conversion process executed by the column A/D conversion unit 181 of the image sensor 100 is described with reference to a flowchart shown in FIG. 9.

In step S101, the column A/D conversion unit 181 resets (initializes) the counter 193, and sets a predetermined initial value (such as "0") for each of the D flip-flops 212 in response to a start of the A/D conversion process.

In step S102, the column A/D conversion unit 181 performs A/D conversion of a reset signal read from the unit pixel 141 on the basis of a first slope reference signal (having gentle slope, for example) in a first rest period (first P-phase). The counter 193 obtains a first reset signal (P1) corresponding to a result of the A/D conversion (digital data).

In step S103, the column A/D conversion unit 181 brings the switch 227 of each of the D flip-flops 212 of the counter 193 to the on-state, and transfers the first reset signal (P1) to the save latch (latch constituted by NOT gate 228 and NOT gate 229), and allows the save latch to retain the first reset signal (P1).

In step S104, the column A/D conversion unit 181 brings the switch 227 of each of the D flip-flops 212 of the counter 193 to the off-state. Thereafter, the column A/D conversion unit 181 resets (initializes) the counter 193, and sets the predetermined initial value (such as "0") for each of the D flip-flops 212.

In step S105, the column A/D conversion unit 181 performs A/D conversion of the reset signal read from the unit pixel 141 on the basis of a second slope reference signal (having sharp slope, for example) in a second reset period (second P-phase). The counter 193 obtains a second reset signal (P2) corresponding to a result of the A/D conversion (digital data).

In this state, the counter 193 retains both the first reset signal (P1) and the second reset signal (P2). More specifically, each of the D flip-flops 212 retains both a bit value indicating the first reset signal (P1) and associated with the corresponding D flip-flop 212, and a bit value indicating the second reset signal (P2) and associated with the corresponding D flip-flop 212.

In step S106, the comparison unit 192 of the column A/D conversion unit 181 compares a pixel signal read from the unit pixel 141 with a predetermined reference voltage in a determination period, and obtains a result of the comparison as a flag signal (F).

In step S107, the column A/D conversion unit 181 determines whether or not a signal level of the flag signal (F) is L. When it is determined that the pixel signal has low illuminance on the basis of determination of the signal level of the flag signal (F) as L, the process proceeds to step S108.

In step S108, the column A/D conversion unit 181 brings the switch 227 of each of the D flip-flops 212 of the counter 193 into the on-state to restore the first reset signal (P1) retained in the save latch.

In step S109, each of the D flip-flops 212 of the counter 193 of the column A/D conversion unit 181 inverts data indicating the restored first reset signal (P1) by switching the control signal xCKL to L and the control signal CKH to H while locking the D flip-flop 212. More specifically, an initial value "−P1" is set to the counter 193 (each D flip-flop 212).

In step S110, the column A/D conversion unit 181 performs A/D conversion of a pixel signal read from the unit pixel 141 by using the initial value "−P1" on the basis of a first slope reference signal (reference signal having gentle slope, for example) in a signal reading period (D-phase).

A pixel signal (D) in digital data is obtained by this A/D conversion. The initial value has been set to "−P1" as described above, wherefore the counter 193 obtains a pixel signal (D-P1) subjected to digital CDS.

In step S111, the column A/D conversion unit 181 outputs the pixel signal (D-P1) subjected to digital CDS.

After completion of processing in step S111, the A/D conversion process ends.

On the other hand, when it is determined that the pixel signal has high illuminance on the basis of determination of the signal level of the flag signal (F) as H in step S107, the process proceeds to step S112.

In step S112, each of the D flip-flops 212 of the counter 193 of the column A/D conversion unit 181 inverts data indicating the second reset signal (P2) by switching the control signal xCKL to L and the control signal CKH to H while locking the D flip-flop 212. More specifically, an initial value "−P2" is set to the counter 193 (each D flip-flop 212).

In step S113, the column A/D conversion unit 181 performs A/D conversion of a pixel signal read from the unit pixel 141 by using the "−P2" as the initial value on the basis of a second slope reference signal (reference signal having sharp slope, for example) in the signal reading period (D-phase).

A pixel signal (D) in digital data is obtained by this A/D conversion. The initial value has been set to "−P2" as described above, wherefore the counter 193 obtains a pixel signal (D-P2) subjected to digital CDS.

In step S114, the column A/D conversion unit 181 outputs the pixel signal (D-P2) subjected to digital CDS.

After completion of processing in step S114, the A/D conversion process ends.

Figure 10:
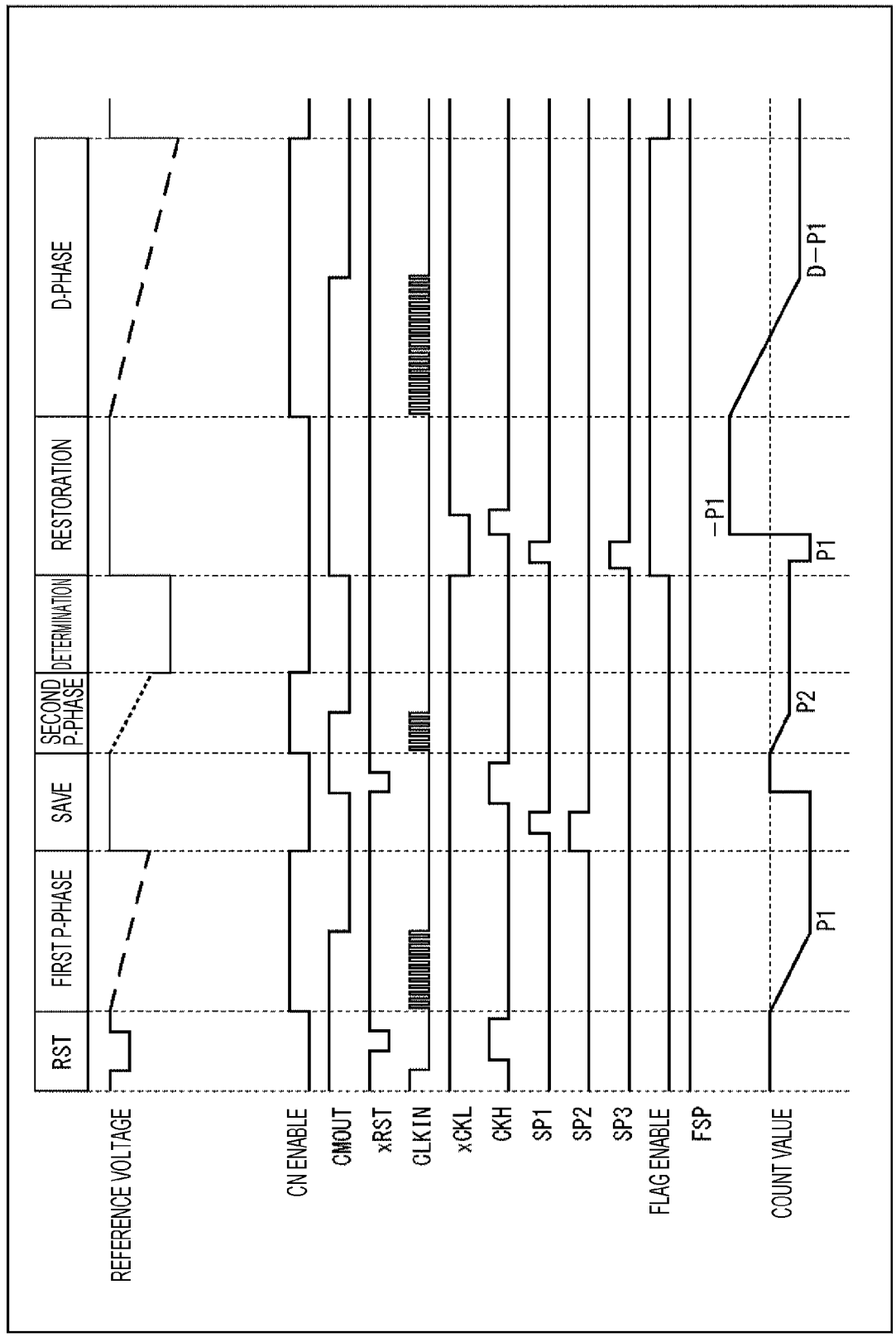
FIG. 10 is a timing chart showing an example of changes of A/D conversion.

FIG. 10 is a view showing an example of a timing chart when low illuminance is determined in the D-phase on the basis of determination of the flag signal (F) in the A/D conversion process described above. After the counter 193 is reset in a period (RST), the first reset signal (P1) is obtained in a period (first P-phase). In a subsequent period (save), the first reset signal (P1) is transferred to the save latch. After the counter 193 is reset, the second reset signal (P2) is obtained in a period (second P-phase). In a subsequent period (determination), the flag signal (F) is obtained by the comparison unit 192, and stored in the flag latch 213 of the counter 193. The signal level of the flag signal (F) is determined as L, wherefore the first reset signal (P1) in the save latch is restored at the timing of the control signal SP1. Data indicating the restored first reset signal (P1) is inverted, and set as an initial value of the D-phase. In a subsequent period (D-phase), a pixel signal (D) is obtained, whereby a pixel signal (D-P1) subjected to digital CDS is obtained.

Figure 11:
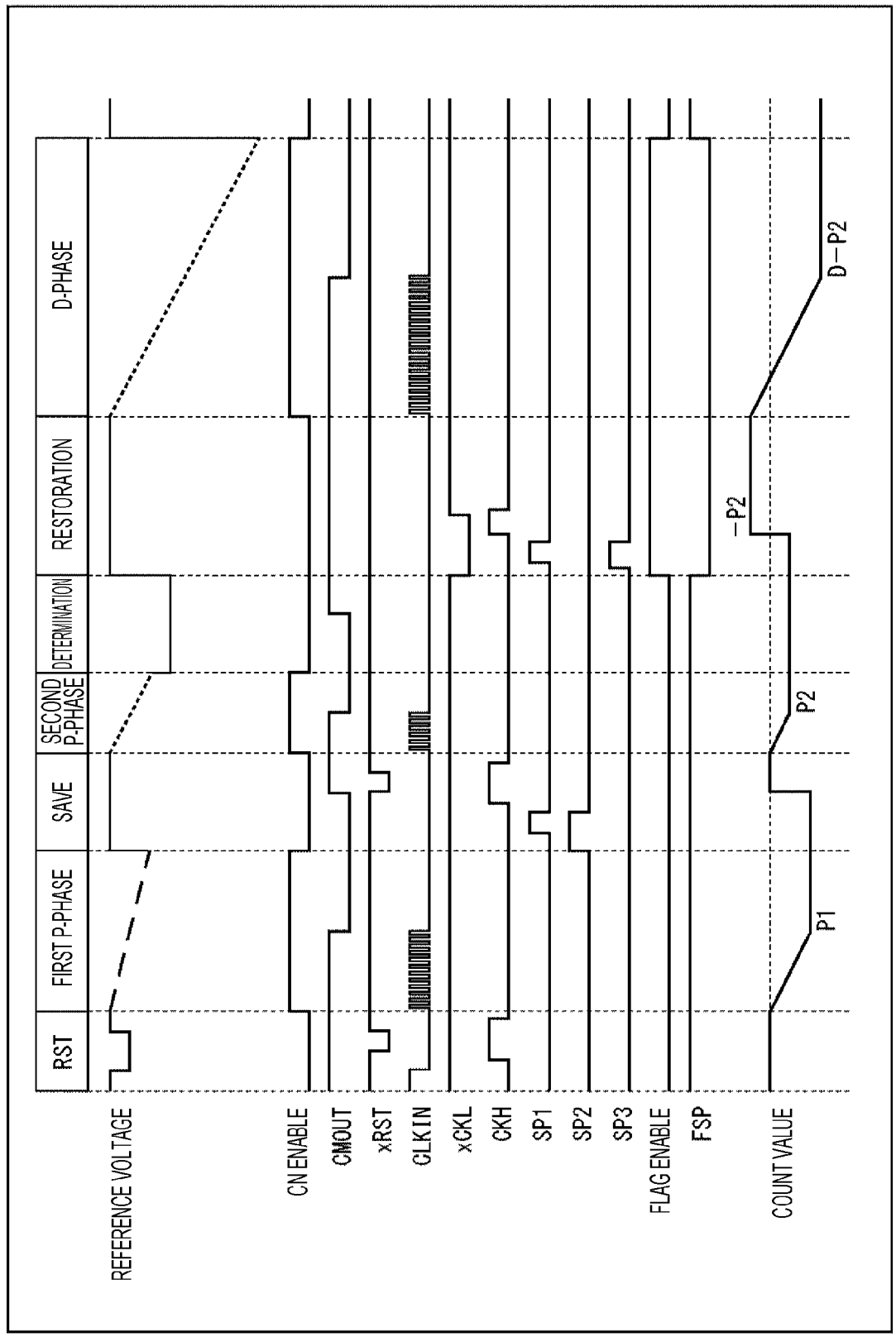
FIG. 11 is a timing chart showing another example of changes of A/D conversion.

FIG. 11 is a view showing an example of a timing chart when high illuminance is determined in the D-phase on the basis of determination of the flag signal (F) in the A/D conversion process described above. The example illustrated in FIG. 10 is applicable to the example of FIG. 11 in a period until the second P-phase. The signal level of the flag signal (F) is determined as H. In this case, the control signal SP1 and the control signal SP3 are masked by the control signal FSP in a period (restoration). A restoration operation is not performed for the first reset signal (P1). Accordingly, data indicating the second reset signal (P2) is inverted, and set to an initial value in the D-phase. In a subsequent period (D-phase), a pixel signal (D) is obtained, whereby a pixel signal (D-P2) subjected to digital CDS is obtained.

Each of the column A/D conversion units 181 performs the A/D conversion process described above every time a unit pixel corresponding to a processing target changes.

As described above, each of the column A/D conversion units 181 (i.e., A/D conversion unit 173) executing the A/D conversion process is capable of more accurately performing high speed and high dynamic range A/D conversion while reducing a rise of costs. In other words, the image sensor 100 is capable of reducing a rise of costs by using the column A/D conversion unit 181 (i.e., A/D conversion unit 173) to which the present technology has been applied.

2. Second Embodiment

<Hybrid-Type Counter>

Note that, according to the foregoing description, the measurement unit obtains all bits of a measured value in binary codes at the time of measurement of the length of the period from a signal input start to a change of the value of the signal. However, the measured value may be obtained in a form other than binary codes. For example, the measurement unit may obtain higher bits of the measured value in binary codes, and lower bits in gray codes in the foregoing measurement. In other words, the measurement unit may be constituted by a hybrid-type counter which includes both a gray code counter counting in gray codes, and a binary counter counting in binary codes.

In this case, the hybrid-type counter may convert the gray codes of the lower bits of the measured value corresponding to the signal level of the second signal into binary codes, add the converted binary codes of the lower bits to the binary codes of the higher bits, invert data indicating the obtained binary codes of all the bits of the measured value, and set the inverted data to an initial value.

For example, the hybrid-type counter may convert gray codes corresponding to the signal level of the flag signal (F) obtained by A/D conversion in the P-phase into binary codes to obtain binary codes of lower bits, add the converted binary codes to binary codes of higher bits, invert data indicating the binary codes of all the bits, and set a value thus obtained to an initial value of the counter in the A/D conversion in the D-phase.

Moreover, each of the signal processing devices such as latches may include a plurality of latches connected to each other in series and retaining signals for each latch, and a control unit which controls transfer of signals between the respective latches, and transfers a signal retained in a desired latch to a final latch, and allows the final latch to output the signal at the time of output of the signal. In this case, the signal processing device is capable of retaining a plurality of values, selecting a desired value from the retained values, and outputting the selected value.

<Column-Parallel Processing Unit>

Figure 12:
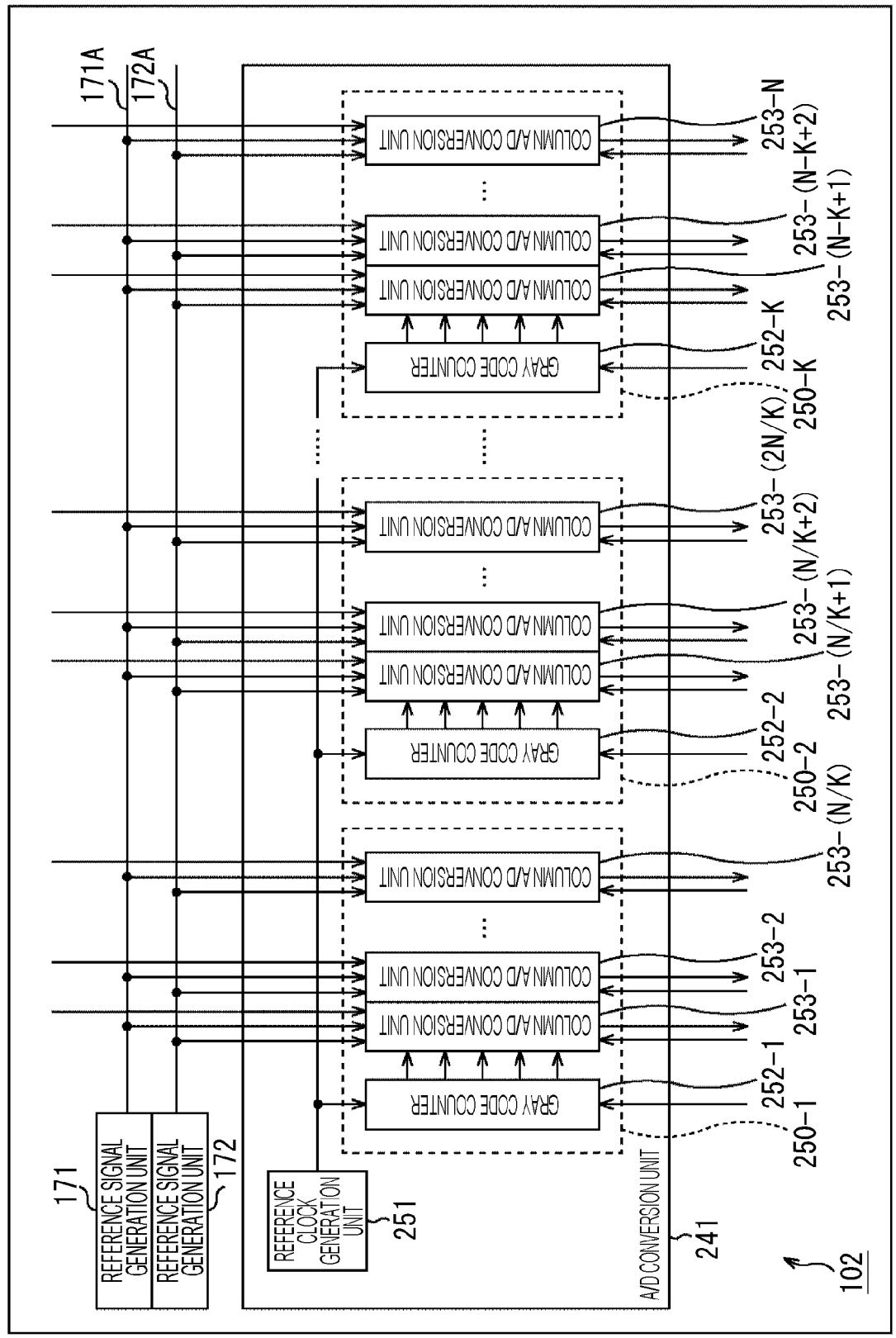
FIG. 12 is a view illustrating an example of a main configuration of the column-parallel processing unit.

FIG. 12 illustrates an example of a main configuration of the column-parallel processing unit 102 thus configured. As illustrated in FIG. 12, the column-parallel processing unit 102 thus configured includes an A/D conversion unit 241 in place of the A/D conversion unit 173 in the example of FIG. 4.

The A/D conversion unit 241 is a processing unit similar to the A/D conversion unit 173 except for a point that column A/D conversion units 253-1 through 253-N are provided in place of the column A/D conversion units 181 in the example of FIG. 4. In the following description, the respective column A/D conversion units 253-1 through 253-N are collectively referred to as column A/D conversion units 253 when no distinction between the column A/D conversion units 253-1 through 253-N is needed in the description.

Similarly to the column A/D conversion units 181, each of the column A/D conversion units 253 performs A/D conversion of a signal read from the unit pixel 141 of the column associated with the corresponding column A/D conversion unit 253 on the basis of reference signals generated by the reference signal generation unit 171 and the reference signal generation unit 172.

The A/D conversion unit 241 further includes a gray code counter (one of gray code counters 252-1 through 252-K) for each of the plurality of column A/D conversion units 253 (i.e., for each of plural columns) as indicated by dotted lines 250-1 through 250-K (K: arbitrary natural number). In the following description, the respective gray code counters 252-1 through 252-K are collectively referred to as gray code counters 252 when no distinction between the gray code counters 252-1 through 252-K is needed in the description.

The A/D conversion unit 241 further includes a reference clock generation unit 251. The reference clock generation unit 251 generates a predetermined clock signal (reference clock), and supplies the generated clock signal to each of the gray code counters 252. Each of the gray code counters 252 generates a gray code clock having a predetermined number of bits (one bit or a plurality of bits), and supplies the generated gray code clock to each of the column A/D conversion units 253 in accordance with timing of the reference clock. For example, the gray code counter 252 generates a 5-bit gray code clock, and supplies the generated gray code clock to the column A/D conversion unit 253.

Each of the column A/D conversion units 253 generates lower bits of a result of A/D conversion (count value) on the basis of the gray code clock supplied from the corresponding gray code counter 252. In addition, each of the column A/D conversion units 253 generates higher bits of a result of A/D conversion (count value) on the basis of a binary counter similarly to the column A/D conversion units 181.

<Column A/D Conversion Unit>

Figure 13:
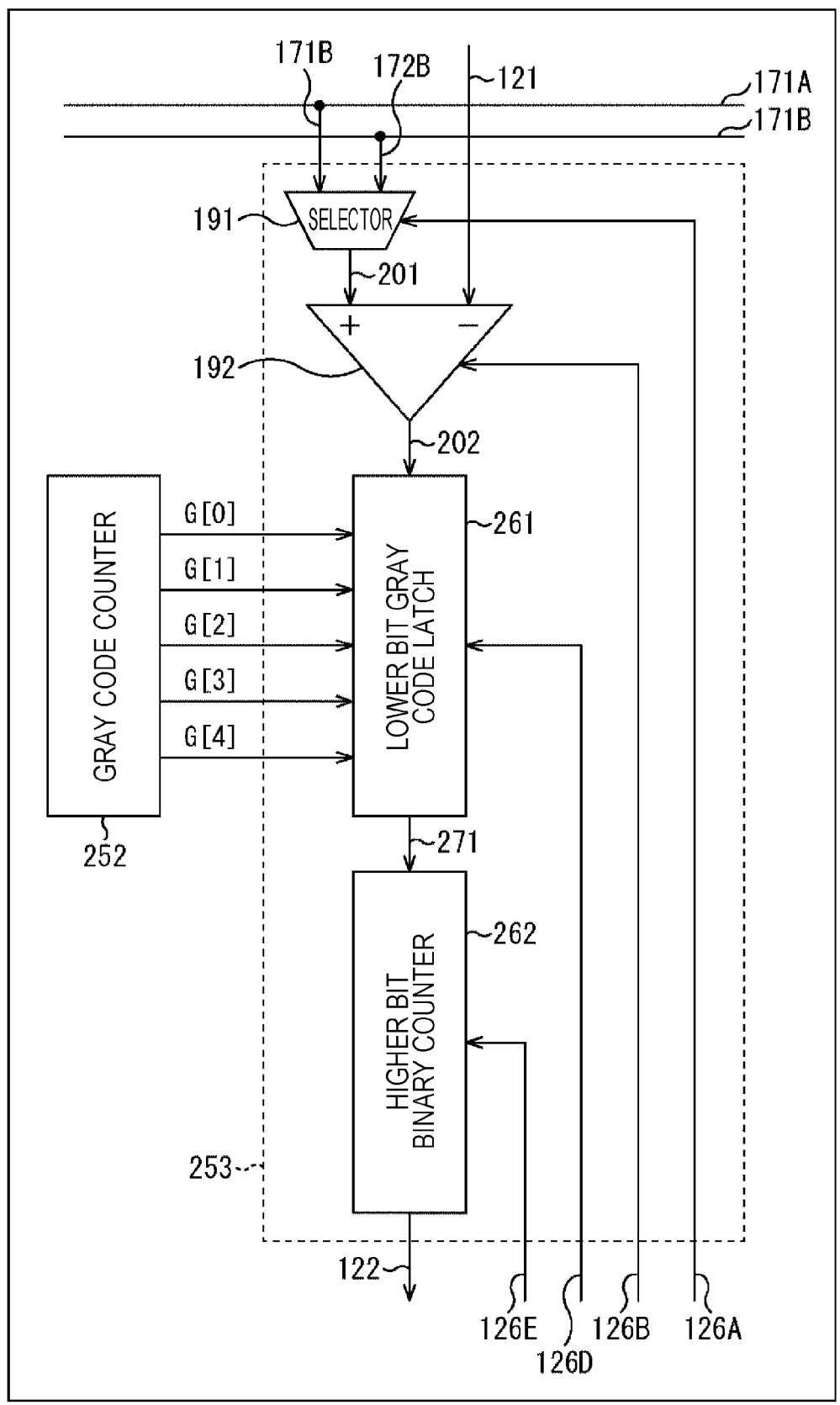
FIG. 13 is a view illustrating an example of a main configuration of a column A/D conversion unit.

FIG. 13 illustrates an example of a main configuration of each of the column A/D conversion units 253. As illustrated in FIG. 13, the column A/D conversion unit 253 includes the selector 191, the comparison unit 192, a lower bit gray code latch 261, and a higher bit binary counter 262.

Gray code clocks (G[0] through G[4]) generated by the gray code counter 252 are supplied to the lower bit gray code latch 261. The lower bit gray code latch 261 generates gray codes on the basis of the gray code clocks (G[0] through G[4]), and converts the gray codes into binary codes to generate lower 5-bit binary codes. The lower bit gray code latch 261 supplies the generated binary codes (lower 5 bits) to the higher bit binary counter 262 via a signal line 263. The lower bit gray code latch 261 further supplies a carry signal synchronous with the clock of G[4] to the higher bit binary counter 262 via the signal line 263. Note that the lower bit gray code latch 261 is driven in accordance with a control signal supplied from the column-scanning unit 113 via the control line 126D (i.e., control by column-scanning unit 113).

The higher bit binary counter 262 has a configuration similar to the configuration of the counter 193 (FIG. 6), and performs a process similar to the process of the counter 193 (FIG. 6) on the basis of the carry signal supplied from the lower bit gray code latch 261 to generate remaining higher-bit binary codes. The higher bit binary counter 262 calculates the sum of the generated higher-bit binary codes and lower 5-bit binary codes supplied from the lower bit gray code latch 261, and generates and outputs binary codes of all the bits. Note that the higher bit binary counter 262 is driven in accordance with a control signal supplied from the column-scanning unit 113 via the control line 126E (i.e., control by column-scanning unit 113).

<Lower Bit Gray Code Latch>

Figure 14:
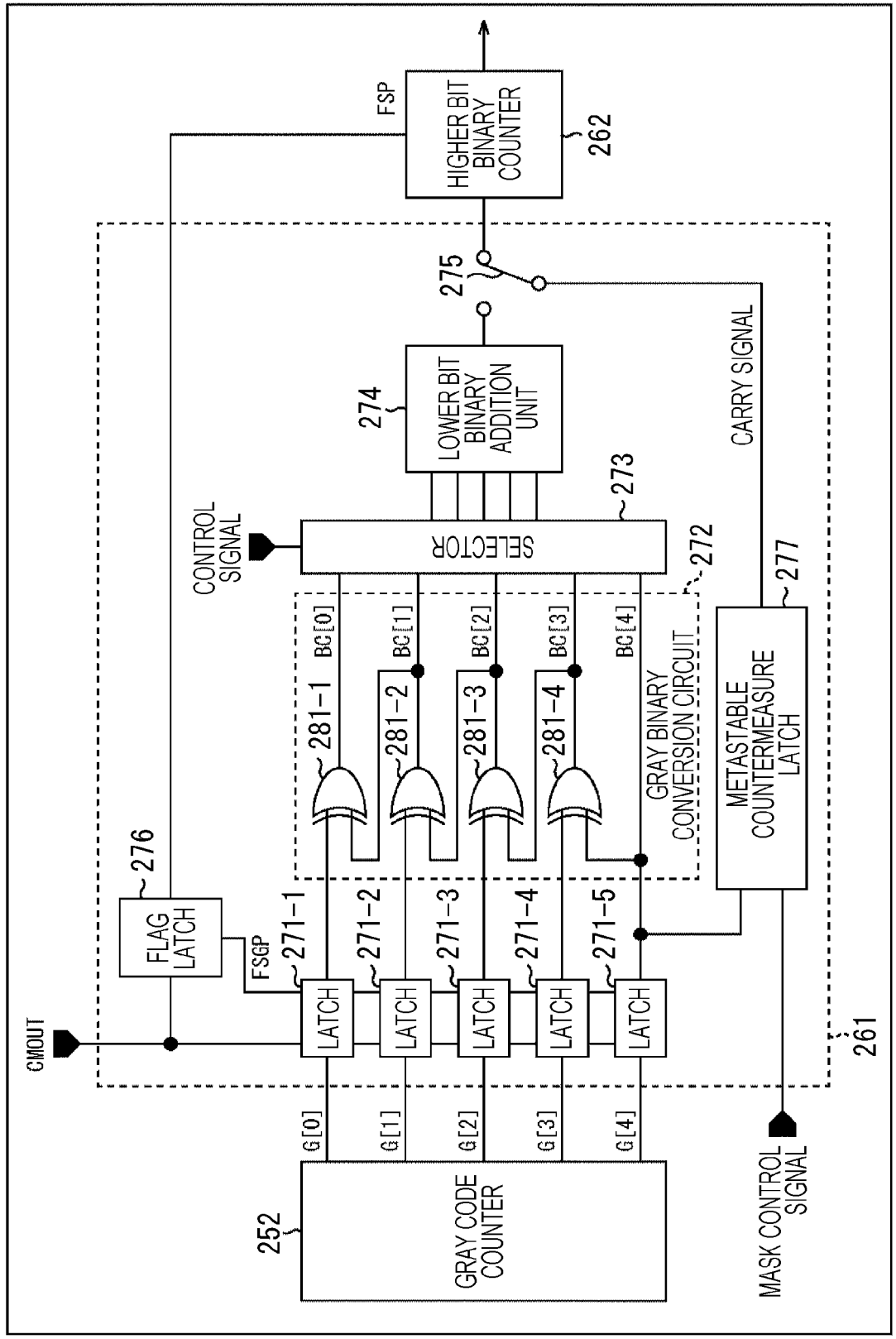
FIG. 14 is a view illustrating an example of a main configuration of a lower bit gray code latch.

FIG. 14 illustrates an example of a main configuration of the lower bit gray code latch 261. As illustrated in FIG. 14, the lower bit gray code latch 261 includes latches 271-1 through 271-5, a gray binary conversion unit 272, a selector 273, a lower bit binary addition unit 274, a switch 275, a flag latch 276, and a metastable countermeasure latch 277.

Each of the latches 271-1 through 271-5 is constituted by a similar processing unit, and has a similar configuration. The respective latches 271-1 through 271-5 are collectively referred to as latches 271 when no distinction between the latches 271-1 through 271-5 is needed in the description. Respective bits of the gray code clocks (G[0] through G[4]) supplied from the gray code counter 252 are supplied to the corresponding latches 271. Accordingly, there are provided the same number of the latches 271 as the number of bits of the gray code clocks. The respective latches 271 latch gray codes at the inversion timing of the output CMOUT from the comparison unit 192.

Note that the G[4] clock is supplied to the metastable countermeasure latch 277. The metastable countermeasure latch 277 supplies a carry signal to the higher bit binary counter 262 via the switch 275 as an input clock of the lowest bit in the higher bits in synchronization with a metastable mask period. The carry signal requires a countermeasure for bit inconsistency (metastable). Bit inconsistency in this context refers to data missing of 32LSB caused by carry of BC[5] on the binary code side even in a state of no carry on the gray code side when an edge of the carry signal and the timing of data inversion of output from the comparison unit 192 are close to each other, for example. As described above, generation of bit inconsistency is avoidable by providing the metastable countermeasure latch 277 to secure a mask period for the edge timing.

In this case, the respective bits of the gray codes latched in the latches 271 are supplied to the gray binary conversion unit 272.

As illustrated in FIG. 14, the gray binary conversion unit 272 includes XOR gates 281-1 through 281-4. The respective XOR gates 281-1 through 281-4 are collectively referred to as XOR gates 281 when no distinction between the XOR gates 281-1 through 281-4 is needed in the description. The gray binary conversion unit 272 converts the gray codes supplied from the latches 271 into the same bit number of binary codes (BC[0] through BC[4]) as the bit number of the gray codes (such as 5 bits) by using a logic circuit constituted by the number of XOR gates 281 smaller than the bit number of the gray codes (such as 5 bits) by one as illustrated in FIG. 14. The gray binary conversion unit 272 supplies the converted binary codes (BC[0] through BC[4]) to the lower bit binary addition unit 274 via the selector 273.

The selector 273 supplies the binary codes (BC[0] through BC[4]) to the lower bit binary addition unit 274 at timing corresponding to an input control signal.

The lower bit binary addition unit 274 performs digital CDS for lower bits.

On the other hand, the flag signal (F) supplied from the comparison unit 192 is stored and retained in the flag latch 276. The flag signal (F) retained in the flag latch 276 is ANDed to a flag enable period, and supplied to each of the latches 271 as a signal FSGP. In addition, the flag signal (F) retained in the flag latch 276 is supplied to the higher bit binary counter 262 as the signal FSP.

<Latch>

Figure 15:
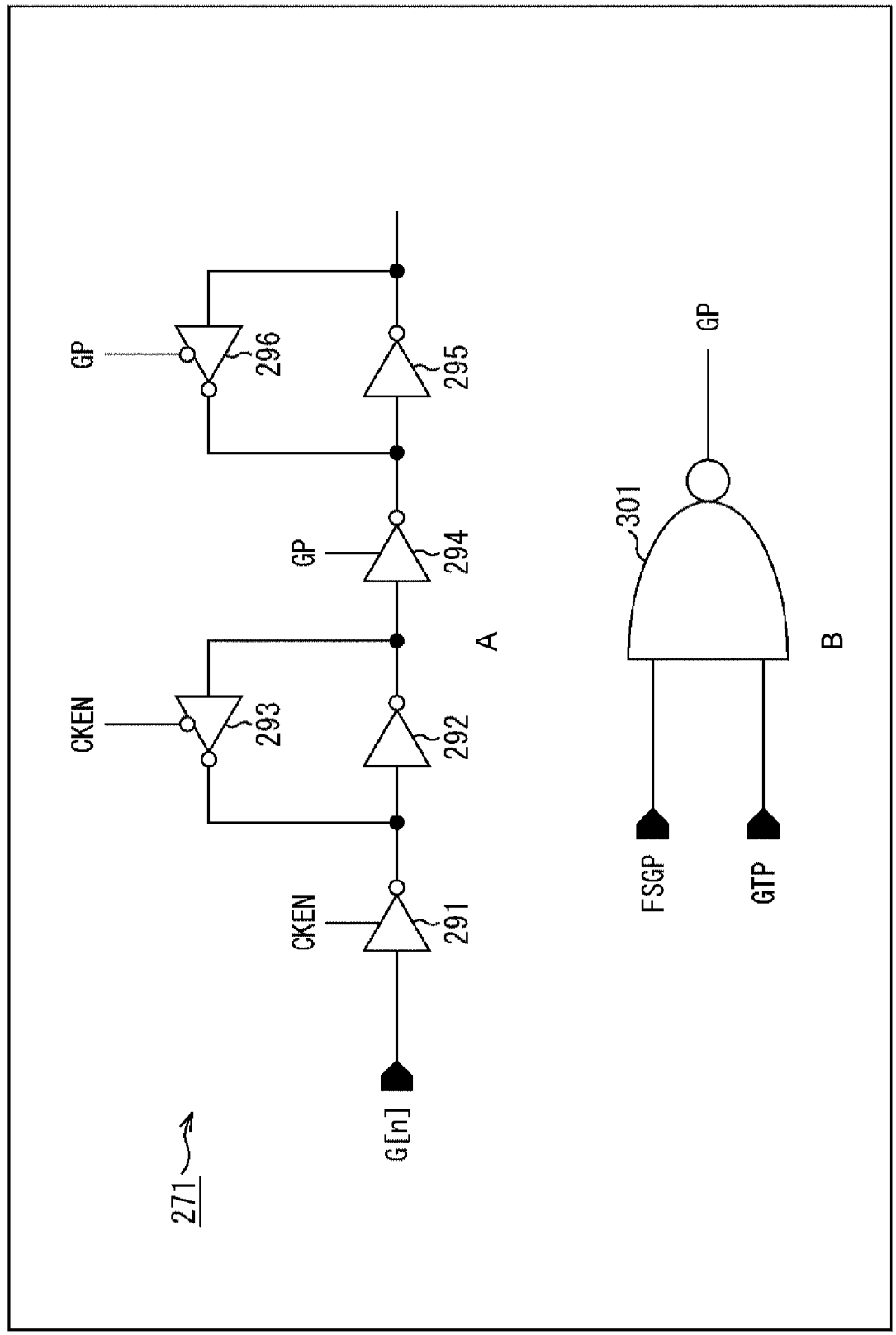
FIG. 15 is a view illustrating an example of a main configuration of a latch.

A of FIG. 15 is a view illustrating an example of a main configuration of the latch 271. As illustrated in A of FIG. 15, the latch 271 includes NOT gates 291 through 296 configured as illustrated in A of FIG. 15. According to the example in A of FIG. 15, the NOT gates 292 and 293 constitute a latch. Similarly, the NOT gates 295 and 296 constitute a latch. Accordingly, a plurality of latches are connected in series (multiple stages of latches are provided) in the latch 271.

Note that a control signal GP for controlling the NOT gate 294 and the NOT gate 296 is generated from the control signal FSGP and a control signal GTP by using a logic circuit constituted by an AND gate 301 as illustrated in B of FIG. 15.

A gray code clock (G[n]) supplied to the latch 271 is input to the latch in the first stage (latch constituted by NOT gates 292 and 293). The latch in the first stage toggles during H of a control signal CKEN controlling the NOT gates 291 and 293 to retain the gray code at the time of inversion of the control signal CKEN to L. When the control signal GP becomes H at predetermined timing (for example, after obtainment of first reset signal (P1)), the gray code retained in the latch in the first stage (such as gray code of first reset signal (P1)) is transferred to the latch in the second stage (latch constituted by NOT gates 295 and 296). This gray code is retained in the latch in the second stage by a change of the control signal GP to L.

A new gray code (such as gray code of second reset signal (P2)) is similarly retained in the latch in the first stage in the state that the gray code (such as gray code of first reset signal (P1)) is retained in the latch in the second stage as described above.

Further, when the flag signal (F) is H (high illuminance determination), the second reset signal (P2) is set to an initial value of the D-phase. Accordingly, the gray code of the second reset signal (P2) is output from the latch 271. More specifically, when the control signal GP becomes H, the gray code retained in the latch in the first stage (such as gray code of second reset signal (P2)) is transferred to the latch in the second stage (gray code of second reset signal (P2) is overwritten on value of latch in second stage). Then, the gray code is output from the latch in the second stage to the gray binary conversion unit 272.

On the other hand, when the flag signal (F) is L (low illuminance determination), the first reset signal (P2) is set to an initial value of the D-phase. In this case, transfer from the latch in the first stage to the latch in the second stage is omitted by masking the control signal GTP with the control signal FSGP even when the control signal GTP becomes H. Then, the gray code retained in the latch in the second stage (such as gray code of first reset signal (P1)) is output to the gray binary conversion unit 272.

<Flag Latch>

Figure 16:
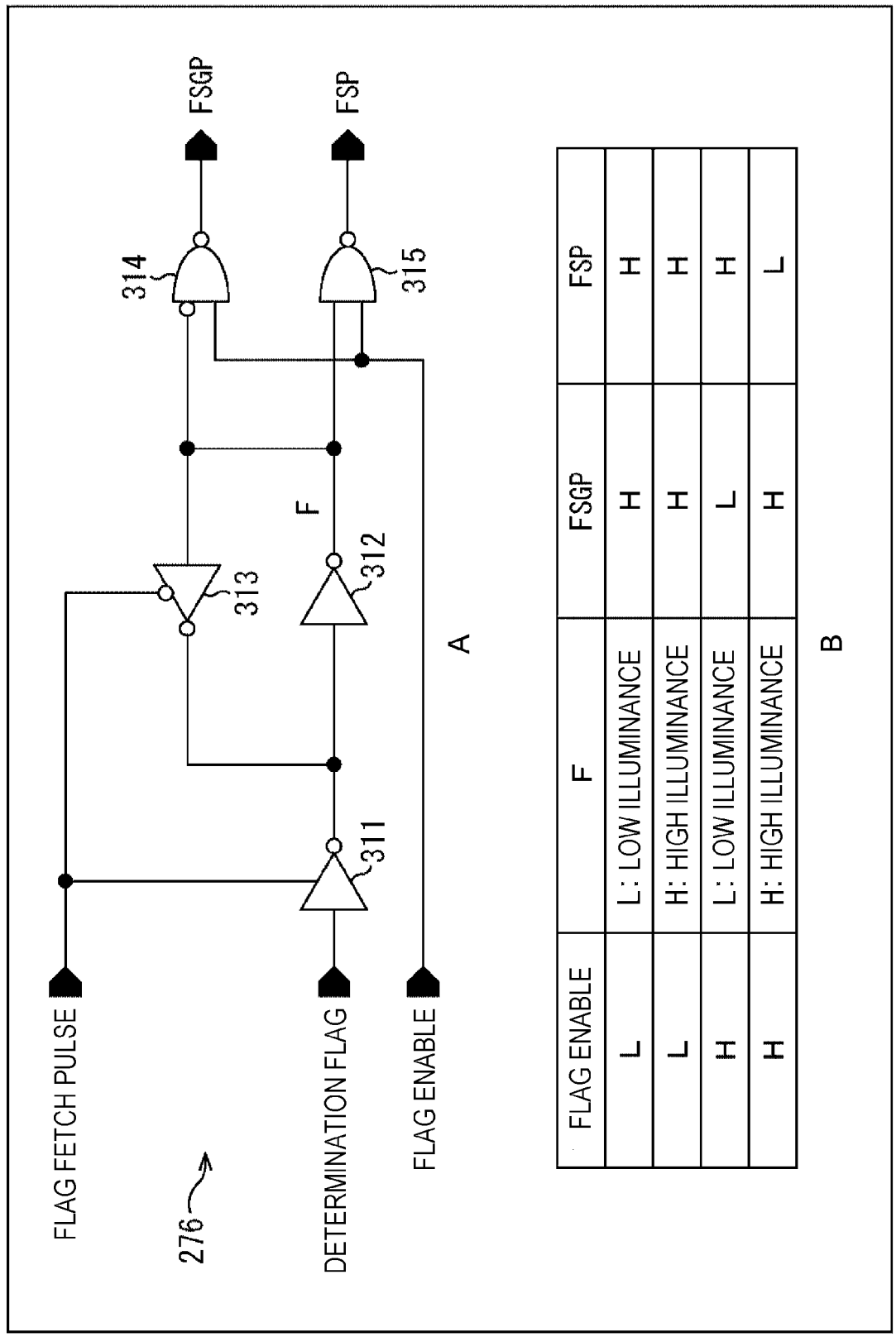
FIG. 16 is a view illustrating an example of a main configuration of a flag latch.

A of FIG. 16 illustrates an example of a main configuration of the flag latch 276. For example, the flag latch 276 includes NOT gates 311 through 313, and NAND gates 314 and 315 configured as illustrated in A of FIG. 16. The NOT gates 312 and 313 constitute a latch. The flag signal (F) is stored and retained in this latch.

The flag latch 276 retains the flag signal (F) by using this logic circuit in accordance with a flag fetch pulse or a flag enable signal, and outputs the retained flag signal (F) as the control signal FSGP or the control signal FSP.

B of FIG. 16 shows a correspondence table of the flag enable, flag signal (F), control signal FSGP, and control signal FSP.

The latch 271 retains a plurality of values, selects a desired value from the retained values, and outputs the selected value by driving the foregoing multiple stage latch 271 on the basis of the control signal FSGP generated by the flag latch 276. Accordingly, the lower bit gray code latch 261 including the latch 271 described above retains both a count value of a comparison result based on a reference signal generated by the P-phase reference signal generation unit 171, and a count value of a comparison result based on a reference signal generated by the P-phase reference signal generation unit 172, and selects and uses the desired one of these values in the D-phase at the time of digital CDS. For example, the lower bit gray code latch 261 selects and outputs the value corresponding to a signal level of a pixel signal.

The higher bit binary counter 262 sets an initial value corresponding to a signal level of a pixel signal for counting in the D-phase of digital CDS similarly to the counter 193 described above.

Accordingly, the column A/D conversion unit 253 sets an initial value corresponding to a signal level of a pixel signal for counting in the D-phase of digital CDS. More specifically, the column A/D conversion unit 253 sets a more appropriate initial value at the time of A/D conversion of a pixel signal on the basis of a reference signal corresponding to the signal level of the pixel signal in the D-phase. Accordingly, the column A/D conversion unit 253 is capable of more accurately performing high speed and high dynamic range A/D conversion in the manner described above.

In addition, the A/D conversion described above is realizable by a slight change of the latches 271 and the flag latch 276, wherefore increase in the circuit scale (area necessary for installation) of the column A/D conversion unit 253 is avoidable. When the circuit scale of the column A/D conversion unit 253 increases, the circuit scale of the image sensor 100 similarly increases. The column A/D conversion unit 253 (i.e., A/D conversion unit 241) having the foregoing configuration reduces increase in the circuit scale. In this case, high speed and high dynamic range A/D conversion is more accurately realizable while reducing a rise of costs. Accordingly, the image sensor 100 including the column A/D conversion unit 253 (i.e., A/D conversion unit 241) according to the present technology achieves reduction of a rise of costs even when the counter is constituted by a hybrid-type counter.

<Flow of A/D Conversion Process>

An example of a flow of an A/D conversion process executed by the column A/D conversion unit 253 of the image sensor 100 having the foregoing configuration is now described with reference to a flowchart shown in FIGS. 17 and 18.

Figure 17:
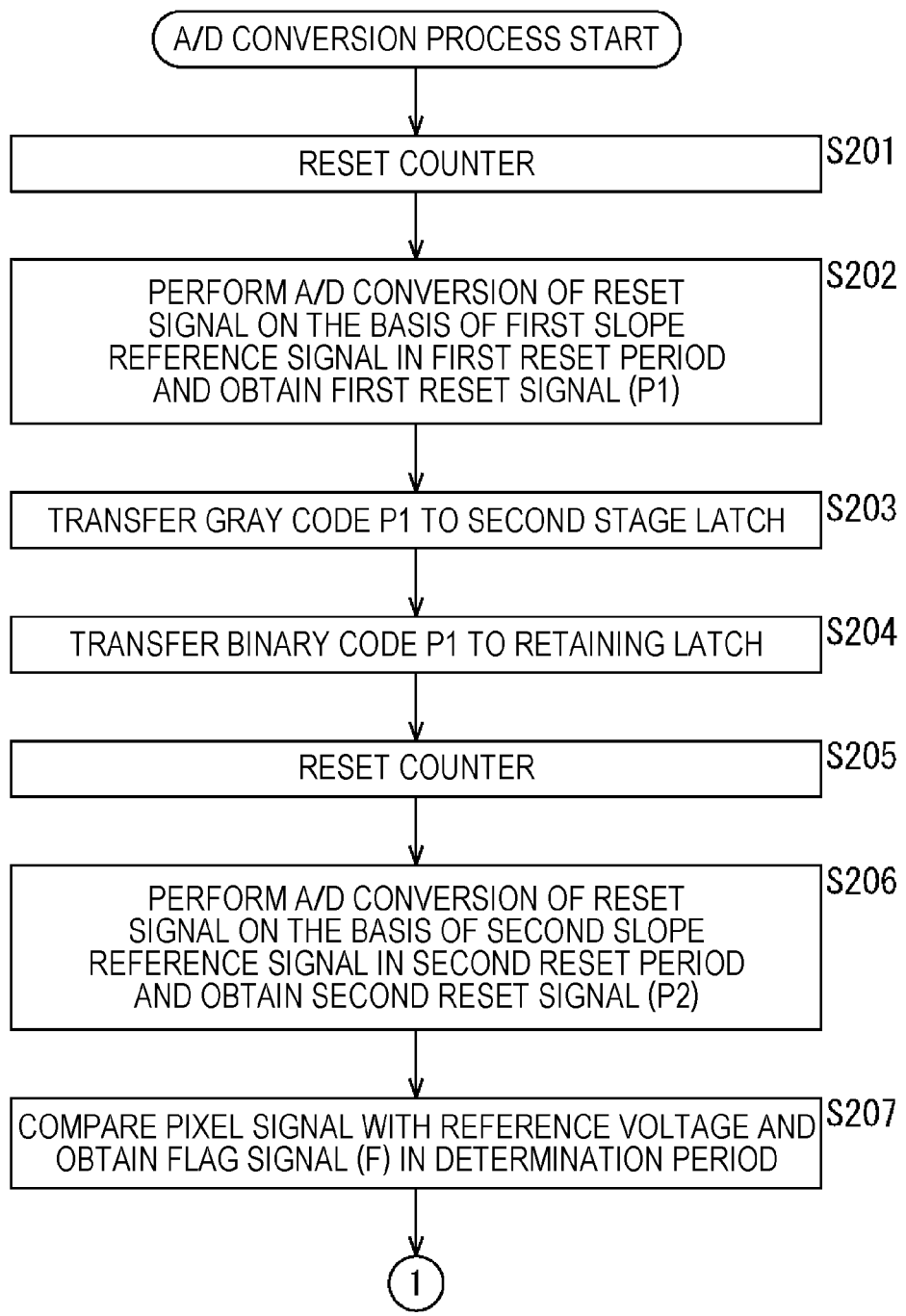
FIG. 17 is a flowchart showing an example of a flow of an A/D conversion process.

In step S201 in FIG. 17, the column A/D conversion unit 253 resets (initializes) the higher bit binary counter 262, and sets a predetermined initial value (such as "0") for each of the D flip-flops 212 in response to a start of the A/D conversion process.

In step S102, the column A/D conversion unit 253 performs A/D conversion of a reset signal read from the unit pixel 141 on the basis of a first slope reference signal (having gentle slope, for example) in a first reset period (first P-phase). Each of the lower bit gray code latch 261 and the higher bit binary counter 262 obtains a first reset signal (P1) corresponding to a result of the A/D conversion (digital data). In this case, the lower bit gray code latch 261 obtains lower bits (5 bits) of the first reset signal (P1) in gray codes. On the other hand, the higher bit binary counter 262 obtains the remaining higher bits of the first reset signal (P1) in binary codes.

The column A/D conversion unit 253 allows the latch in the first stage of each of the latches 271 of the lower bit gray code latch 261 to retain the gray codes of the lower bits (5 bits) of the obtained first reset signal (P1). On the other hand, the column A/D conversion unit 253 allows the latch of the higher bit binary counter 262 to retain the binary codes of the remaining higher bits of the obtained first reset signal (P1).

In step S203, the column A/D conversion unit 253 transfers, for each of the latches 271 of the lower bit gray code latch 261, the gray codes of the lower bits of the first reset signal (P1) retained in the latch in the first stage to the latch in the second stage, and allows the latch in the second stage to retain the gray codes.

Further, in step S204, the column A/D conversion unit 253 brings the switch 227 of each of the D flip-flops 212 of the higher bit binary counter 262 into an on-state, transfers the binary codes of the higher bits of the first reset signal (P1) retained in the latch of the higher bit binary counter 262 to the save latch, and allows the save latch to retain the binary codes.

In step S205, the column A/D conversion unit 253 brings the switch 227 of each of the D flip-flops 212 of the higher bit binary counter 262 into an off-state. Thereafter, the column A/D conversion unit 253 resets (initializes) the counter 193, and sets a predetermined initial value (such as "0") for each of the D flip-flops 212.

In step S206, the column A/D conversion unit 253 performs A/D conversion of a reset signal read from the unit pixel 141 on the basis of a second slope reference signal (having sharp slope, for example) in a second reset period (second P-phase). The higher bit binary counter 262 obtains binary codes of higher bits of the second reset signal (P2) corresponding to a result of the A/D conversion (digital data).

The column A/D conversion unit 253 allows the latch in the first stage of each of the latches 271 of the lower bit gray code latch 261 to retain the obtained gray codes of the lower bits (5 bits) of the second reset signal (P2). On the other hand, the column A/D conversion unit 253 allows the latch of the higher bit binary counter 262 to retain the obtained binary codes of the remaining higher bits of the second reset signal (P2).

In this state, the higher bit binary counter 262 retains both the first reset signal (P1) and the second reset signal (P2) (binary codes of higher bits of both reset signals P1 and P2). More specifically, each of the D flip-flops 212 retains both a bit value indicating the first reset signal (P1) and associated with the corresponding D flip-flop 212, and a bit value indicating the second reset signal (P2) and associated with the corresponding D flip-flop 212.

Similarly, the lower bit gray code latch 261 retains both the first reset signal (P1) and the second reset signal (P2) (gray codes of lower bits of both reset signals P1 and P2) in this state. More specifically, each of the latches 271 of the lower bit gray code latch 261 retains both values of bits associated with the corresponding latch 271 in the first reset signal (P1), and values of bits associated with the corresponding latch 271 in the second reset signal (P2).

In step S207, the comparison unit 192 of the column A/D conversion unit 253 compares the pixel signal read from the unit pixel 141 with a predetermined reference voltage in a determination period, and obtains a result of the comparison as a flag signal (F).

Figure 18:
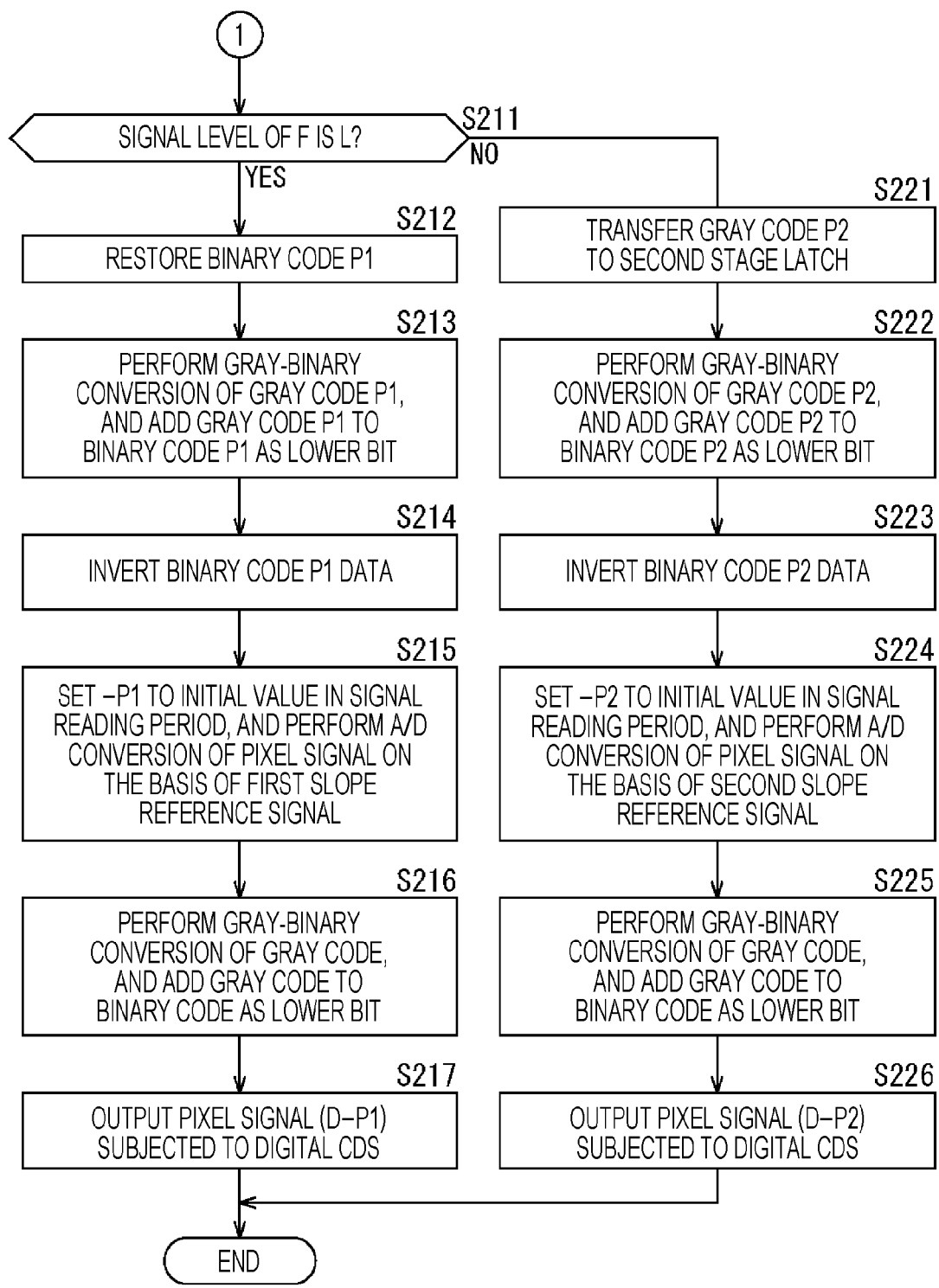
FIG. 18 is a flowchart continuing from the flowchart of FIG. 17, and showing the example of the flow of the A/D conversion process.

After completion of processing in step S207, the process proceeds to FIG. 18.

In step S211 in FIG. 18, the column A/D conversion unit 253 determines whether or not the signal level of the flag signal (F) is L. When low illuminance of the pixel signal is determined on the basis of determination of the signal level of the flag signal (F) as L, the process proceeds to step S212.

In step S212, the column A/D conversion unit 253 brings the switch 227 of each of the D flip-flops 212 of the higher bit binary counter 262 to the on-state to restore the binary codes of the higher bits of the first reset signal (P1) retained in the save latch.

In step S213, the column A/D conversion unit 253 reads the gray codes of the lower bits of the first reset signal (P1) retained in the second latch from the latch 271. The gray binary conversion unit 272 converts the gray codes into binary codes.

In step S214, each of the D flip-flops 212 of the higher bit binary counter 262 of the column A/D conversion unit 253 inverts data indicating the binary codes of the higher bits of the restored first reset signal (P1) by switching the control signal xCKL to L and the control signal CKH to H while locking the D flip-flop 212. On the other hand, the lower bit binary addition unit 274 of the lower bit gray code latch 261 of the column A/D conversion unit 253 inverts data indicating the binary codes of the lower bits of the first reset signal (P1) obtained by gray-binary conversion. More specifically, an initial value "−P1" is set to the column A/D conversion unit 253.

In step S215, the column A/D conversion unit 253 performs A/D conversion of a pixel signal read from the unit pixel 141 by using the initial value "−P1" on the basis of a first slope reference signal (reference signal having gentle slope, for example), in a signal reading period (D-phase).

As a result of this A/D conversion, the lower bit gray code latch 261 obtains lower 5 bits of the pixel signal (D) in digital data, while the higher bit binary counter 262 obtains the remaining higher bits of the pixel signal (D).

In step S216, the gray binary conversion unit 272 of the column A/D conversion unit 253 performs gray-binary conversion of gray codes of the lower 5 bits of the pixel signal (D) in digital data to obtain binary codes of the lower 5 bits of the pixel signal (D) in digital data. The lower bit binary addition unit 274 adds the initial value "−P1" to the obtained binary codes of the lower 5 bits of the pixel signal (D) in digital data to obtain binary codes of lower 5 bits of a pixel signal (D-P1) subjected digital CDS.

On the other hand, the higher bit binary counter 262 adds the initial value "−P1" to the binary codes of the remaining higher bits of the pixel signal (D) to obtain binary codes of the higher bits of the pixel signal (D-P1) subjected to digital CDS. The column A/D conversion unit 253 calculates the sum of the binary codes of the lower 5 bits of the pixel signal (D-P1) subjected to digital CDS and the binary codes of the higher bits of the pixel signal (D-P1) subjected to digital CDS to obtain binary codes of all bits of the pixel signal (D-P1) subjected to digital CDS.

In step S217, the column A/D conversion unit 253 outputs the pixel signal (D-P1) subjected to digital CDS.

After completion of processing in step S217, the A/D conversion process ends.

On the other hand, when high illuminance of the pixel signal is determined on the basis of determination of the signal level of the flag signal (F) as H in step S211 in FIG. 18, the process proceeds to step S221.

In step S221, the column A/D conversion unit 253 transfers, for each of the latches 271 of the lower bit gray code latch 261, the gray codes of the lower bits of the second reset signal (P2) retained in the latch in the first stage to the latch in the second stage, and allows the latch in the second stage to retain the gray codes.

In step S222, the column A/D conversion unit 253 reads the gray codes of the lower bits of the second reset signal (P2) retained in the latch in the second stage from the latch 271. The gray binary conversion unit 272 converts the gray codes into binary codes.

In step S223, each of the D flip-flops 212 of the higher bit binary counter 262 of the column A/D conversion unit 253 inverts data indicating the binary codes of the higher bits of the second reset signal (P2) by switching the control signal xCKL to L and the control signal CKH to H while locking the D flip-flop 212. In addition, the lower bit binary addition unit 274 of the lower bit gray code latch 261 of the column A/D conversion unit 253 inverts data indicating the binary codes of the lower bits of the second reset signal (P2) obtained by gray-binary conversion. More specifically, an initial value "−P2" is set to the column A/D conversion unit 253.

In step S224, the column A/D conversion unit 253 performs A/D conversion of a pixel signal read from the unit pixel 141 by using the initial value "−P2" on the basis of a second slope reference signal (reference signal having gentle slope, for example), in a signal reading period (D-phase).

As a result of this A/D conversion, the lower bit gray code latch 261 obtains lower 5 bits of the pixel signal (D) in digital data, while the higher bit binary counter 262 obtains the remaining higher bits of the pixel signal (D).

In step S225, the gray binary conversion unit 272 of the column A/D conversion unit 253 performs gray-binary conversion of gray codes of the lower 5 bits of the pixel signal (D) in digital data to obtain binary codes of the lower 5 bits of the pixel signal (D) in digital data. The lower bit binary addition unit 274 adds the initial value "−P2" to the obtained binary codes of the lower 5 bits of the pixel signal (D) in digital data to obtain binary codes of lower 5 bits of a pixel signal (D-P2) subjected digital CDS.

On the other hand, the higher bit binary counter 262 adds the initial value "−P2" to the binary codes of the remaining higher bits of the pixel signal (D) to obtain binary codes of higher bits of the pixel signal (D-P2) subjected to digital CDS. The column A/D conversion unit 253 calculates the sum of the binary codes of the lower 5 bits of the pixel signal (D-P2) subjected to digital CDS and the binary codes of the higher bits of the pixel signal (D-P2) subjected to digital CDS to obtain binary codes of all bits of the pixel signal (D-P2) subjected to digital CDS.

In step S226, the column A/D conversion unit 253 outputs the pixel signal (D-P2) subjected to digital CDS.

After completion of processing in step S226, the A/D conversion process ends.

Figure 19:
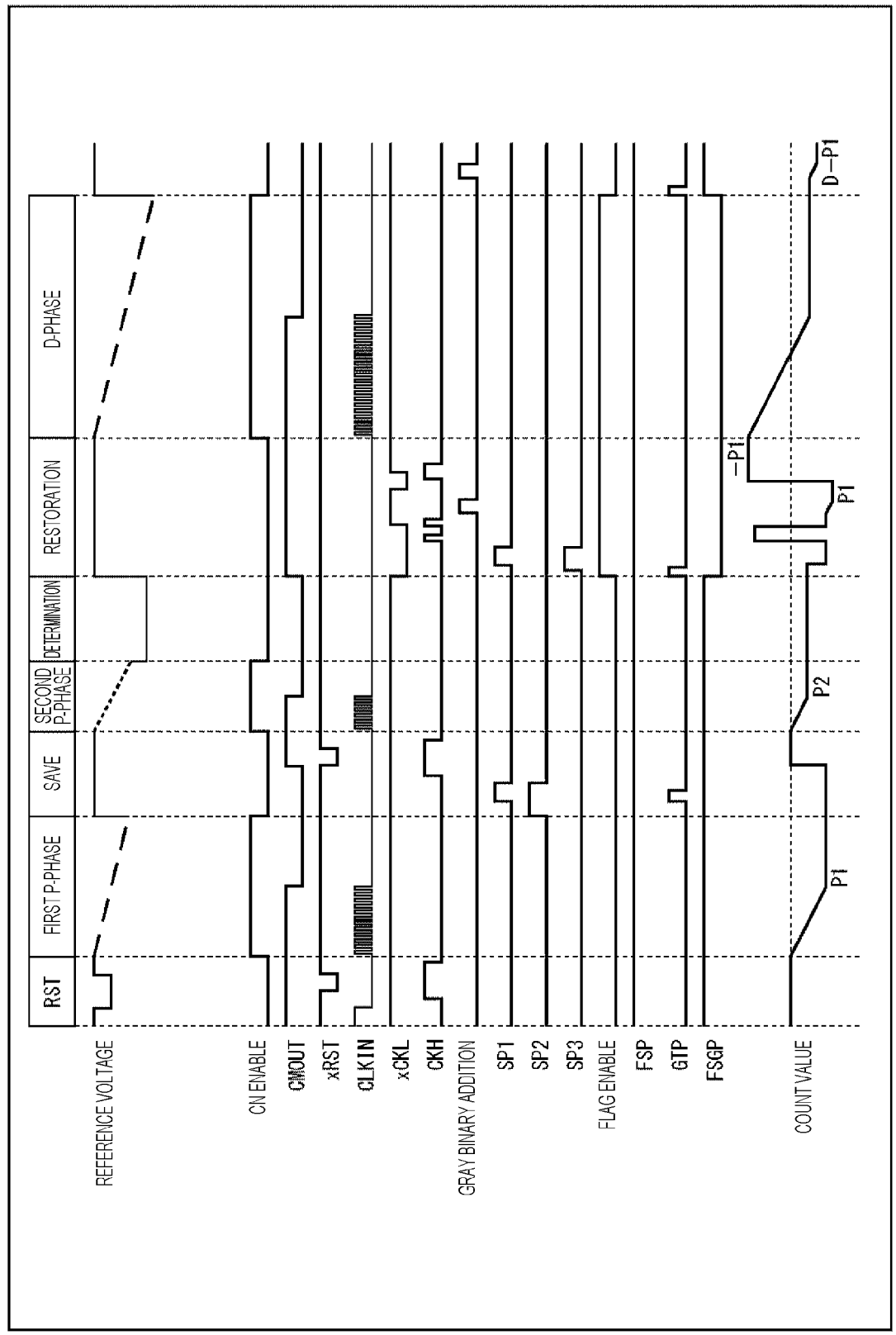
FIG. 19 is a timing chart showing an example of changes of A/D conversion.

FIG. 19 is a view showing an example of a timing chart when low illuminance is determined in the D-phase on the basis of determination of the flag signal (F) in the A/D conversion process described above. After the higher bit binary counter 262 is reset during a period (RST), the first reset signal (P1) is obtained in a period (first P-phase). In a subsequent period (save), binary codes of the higher bits of the first reset signal (P1) are transferred to the save latch of the D flip-flop 212. On the other hand, gray codes of the lower bits are transferred to the latch in the second stage of the latch 271. After the higher bit binary counter 262 is reset, binary codes of the higher bits and gray codes of the lower bits of the second reset signal (P2) are obtained in a period (second P-phase).

In a period (determination), the flag signal (F) is obtained by the comparison unit 192, and stored in the flag latch 213 of the higher bit binary counter 262. The signal level of the flag signal (F) is determined as L. Accordingly, in a period (restoration), the control signal GTP is masked, in which condition gray-binary conversion and data inversion of the gray codes of the lower bits of the first reset signal (P1) retained in the latch in the second stage of the latch 271 are performed. In addition, the D flip-flop 212 restores the binary codes of the higher bits of the first reset signal (P1), and inverts data.

More specifically, an initial value "−P1" is set for the D-phase. Thereafter, in a period (D-phase), A/D conversion of the pixel signal read from the unit pixel 141 is performed on the basis of a first slope reference signal (reference signal having gentle slope, for example) to obtain a pixel signal (D). More specifically, a pixel signal (D-P1) subjected to digital CDS is obtained.

Figure 20:
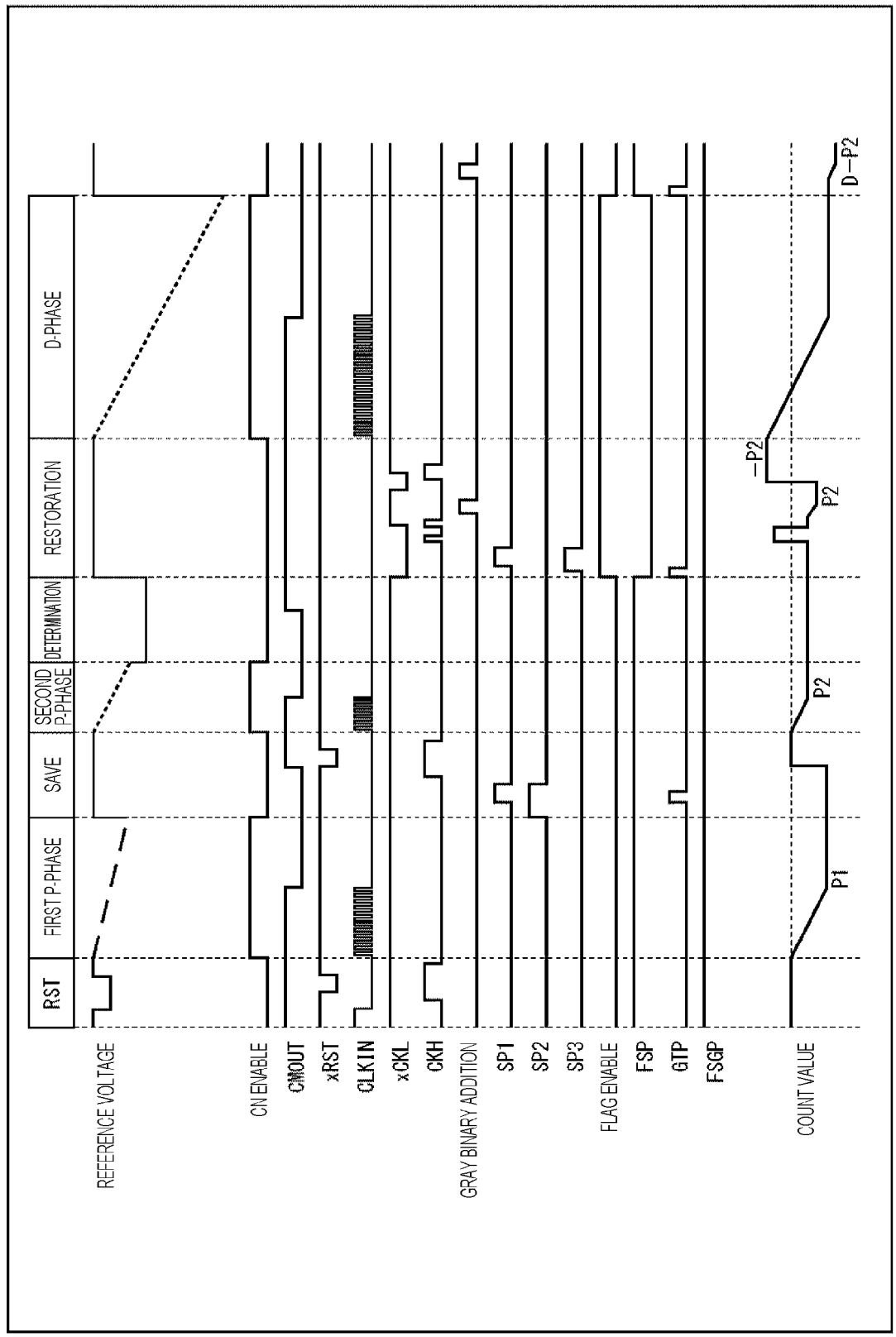
FIG. 20 is a timing chart showing another example of changes of A/D conversion.

FIG. 20 is a view showing an example of a timing chart when high illuminance of the D-phase is determined in determination of the flag signal (F) in the A/D conversion process described above. The example illustrated in FIG. 19 is applicable to the example of FIG. 20 in a period until the period (second P-phase). The signal level of the flag signal (F) is determined as H in a period (determination), in which condition the gray codes of the lower bits of the second reset signal (P2) retained in the latch in the first stage of the latch 271 are transferred to the latch in the second stage and retained therein in a period (restoration). Gray-binary conversion and data inversion of the transferred gray codes are performed. In addition, the D flip-flop 212 inverts data indicating the binary codes of the higher bits of the second reset signal (P2).

More specifically, an initial value "−P2" is set for the D-phase. Thereafter, in a period (D-phase), A/D conversion of a pixel signal read from the unit pixel 141 is performed on the basis of a second slope reference signal (reference signal having sharp slope, for example) to obtain a pixel signal (D). More specifically, a pixel signal (D-P2) subjected to digital CDS is obtained.

Each of the column A/D conversion units 253 executes the A/D conversion process described above every time a unit pixel corresponding to a processing target changes.

The column A/D conversion unit 253 (i.e., A/D conversion unit 241) executing the A/D conversion process is capable of more accurately performing high speed and high dynamic range A/D conversion while reducing a rise of costs. Accordingly, the image sensor 100 including the column A/D conversion unit 253 (i.e., A/D conversion unit 241) to which the present technology has been applied is capable of reducing a rise of costs.

3. Third Embodiment

<Gray Code Counter>

Note that the measurement unit may obtain all bits of a measured value in gray codes in the measurement described above. In this case, the measurement unit may convert gray codes of a measured value corresponding to a signal level of an obtained second signal into binary codes, invert data indicating the obtained binary codes of the measured value, and set the resultant binary codes to an initial value.

<Column A/D Conversion Unit 253>

Figure 21:
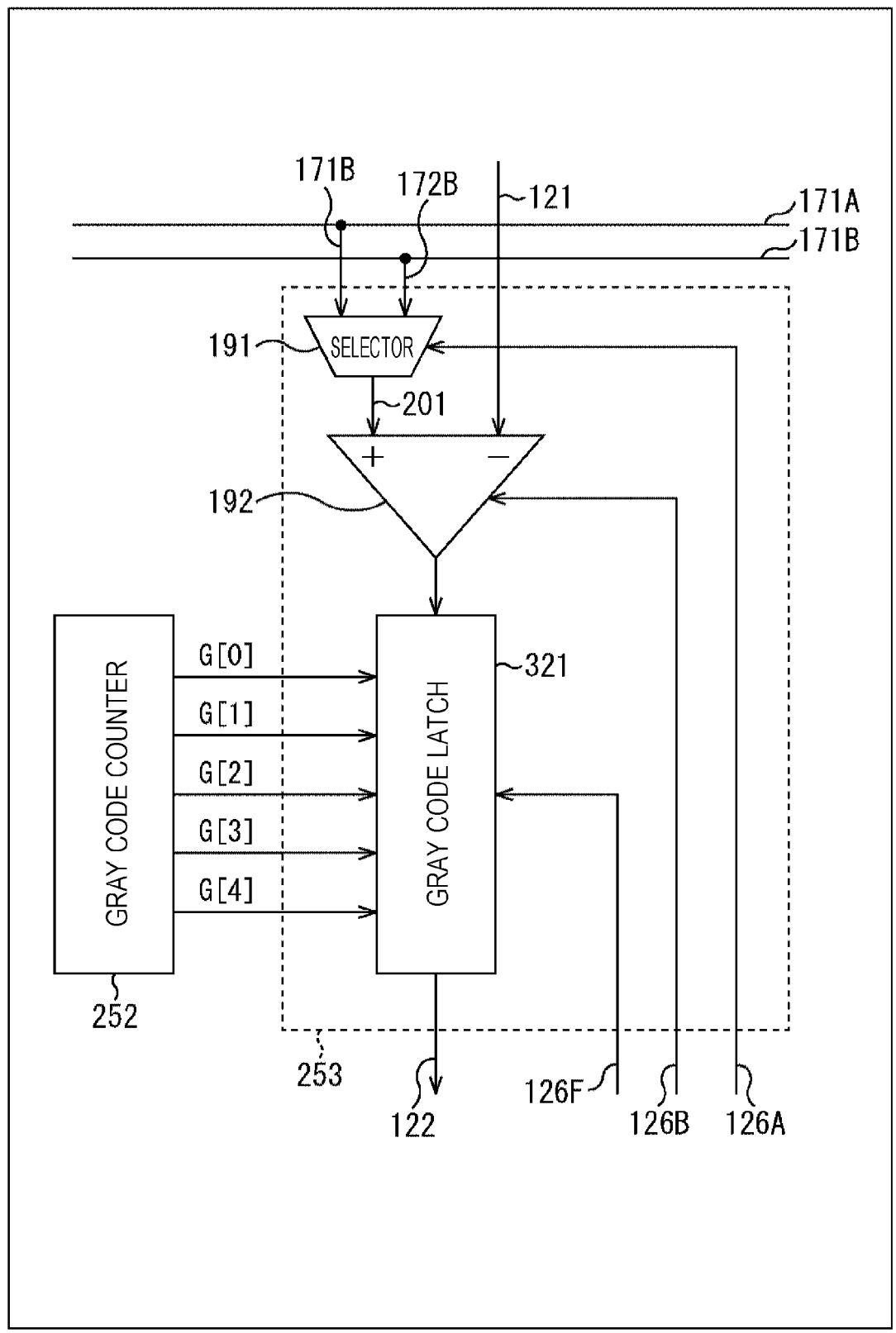
FIG. 21 is a view illustrating an example of a main configuration of the column A/D conversion unit.

The column-parallel processing unit 102 thus configured has a configuration similar to the configuration of the example illustrated in FIG. 12. FIG. 21 illustrates an example of a main configuration of the column A/D conversion unit 253 thus configured.

In this case, the column A/D conversion unit 253 includes a gray code latch 321 as illustrated in FIG. 21 in place of the lower bit gray code latch 261 and the higher bit binary counter 262 included in the example of FIG. 13.

Gray code clocks (G[0] through G[n]) constituted by (n+1) bits and generated by the gray code counter 252 are supplied to the gray code latch 321. The gray code latch 321 generates gray codes from the gray code clocks (G[0] through G[n]), and converts the generated gray codes into binary codes. The gray code latch 321 supplies the generated binary codes (such as (n+1) bits) to the outside of the column A/D conversion unit 253 (such as transfer unit 103) via the signal line 122. Note that the gray code latch 321 is driven in accordance with a control signal supplied from the column-scanning unit 113 via the control line 126F (i.e., control by column-scanning unit 113).

<Gray-Code Latch>

Figure 22:
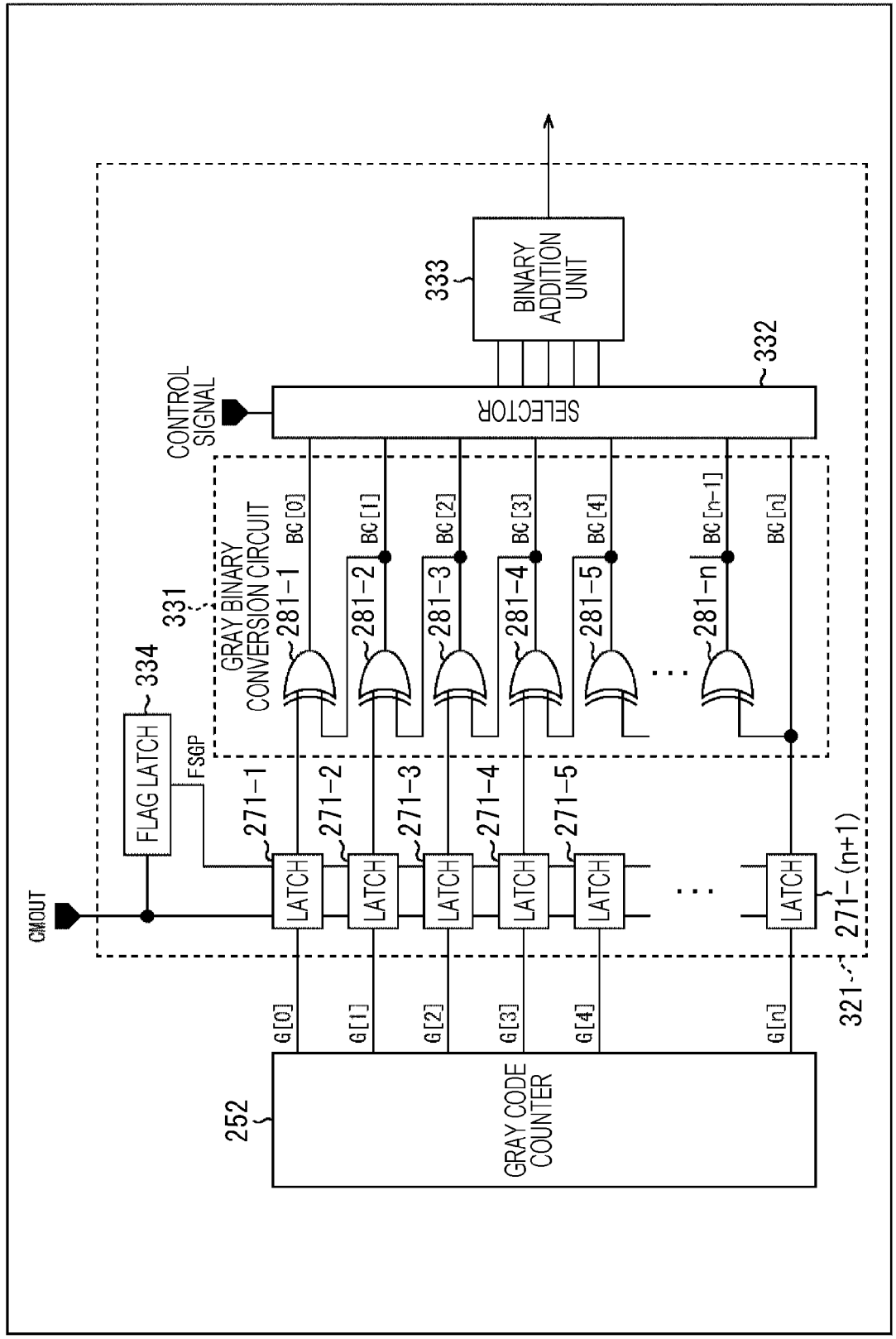
FIG. 22 is a view illustrating an example of a main configuration of a gray code latch.

FIG. 22 illustrates an example of a main configuration of the gray code latch 321. As illustrated in FIG. 22, the gray code latch 321 has a basic configuration similar to the configuration of the lower bit gray code latch 261. However, the gray code latch 321 includes (n+1) latches 271 (latches 271-1 through 271-(n+1)).

In addition, the gray code latch 321 includes a gray binary conversion unit 331 in place of the gray binary conversion unit 272 included in the example of FIG. 14. As illustrated in FIG. 22, the gray binary conversion unit 331 includes n XOR gates 281 (XOR gates 281-1 through 281-n). The gray binary conversion unit 331 converts the (n+1)-bit gray codes (G[0] through G[n]) into (n+1)-bit binary codes (BC[0] through BC[n]) by using this logic circuit.

The gray code latch 321 includes a selector 332 in place of the selector 273 included in the example of FIG. 14. The selector 332 supplies the binary codes (BC[0] through BC[n]) to the binary addition unit 333 at timing corresponding to an input control signal. More specifically the gray code latch 321 includes a binary addition unit 333 in place of the lower bit binary addition unit 274 included in the example of FIG. 14.

The binary addition unit 333 performs digital CDS.

The gray code latch 321 further includes a flag latch 334. The flag latch 334 stores and retains a flag signal (F) supplied from the comparison unit 192 similarly to the flag latch 276 of FIG. 14. The flag latch 334 may have a configuration similar to the configuration of the flag latch 276. However, the flag latch 334 supplies the flag signal (F) to each of the latch 271 only as the signal FSGP, not as the signal FSP.

Further, in case of the example illustrated in FIG. 22, the higher bit binary counter 262 is eliminated. Accordingly, supply of a carry signal from the gray code latch 321 to the higher bit binary counter 262 is omitted. More specifically, the switch 275 and the metastable countermeasure latch 277 included in the example of FIG. 14 are eliminated from the gray code latch 321.

The gray code latch 321 in the example of FIG. 22 includes the latches 271 similarly to the example of FIG. 14, wherefore the column A/D conversion unit 253 sets an initial value corresponding to a signal level of a pixel signal for counting in the D-phase of digital CDS. More specifically, the column A/D conversion unit 253 sets a more appropriate initial value at the time of A/D conversion of a pixel signal on the basis of a reference signal corresponding to the signal level of the pixel signal in the D-phase. Accordingly, the column A/D conversion unit 253 is capable of more accurately performing high speed and high dynamic range A/D conversion in the manner described above.

Moreover, according to this example, A/D conversion described above is similarly realizable by a slight change of the latches 271 and the flag latch 276, wherefore increase in the circuit scale (area necessary for installation) of the column A/D conversion unit 253 is avoidable. When the circuit scale of the column A/D conversion unit 253 increases, the circuit scale of the image sensor 100 similarly increases. The column A/D conversion unit 253 (i.e., A/D conversion unit 241) having the foregoing configuration reduces increase in the circuit scale. In this case, high speed and high dynamic range A/D conversion is more accurately realizable while reducing a rise of costs. Accordingly, the image sensor 100 including the column A/D conversion unit 253 (i.e., A/D conversion unit 241) according to the present technology achieves reduction of a rise of costs even when the counter is constituted by a hybrid-type counter.

<Flow of A/D Conversion Process>

An example of a flow of an A/D conversion process executed by the column A/D conversion unit 253 of the image sensor 100 having the foregoing configuration is now described with reference to a flowchart shown in FIGS. 23 and 24.

Figure 23:
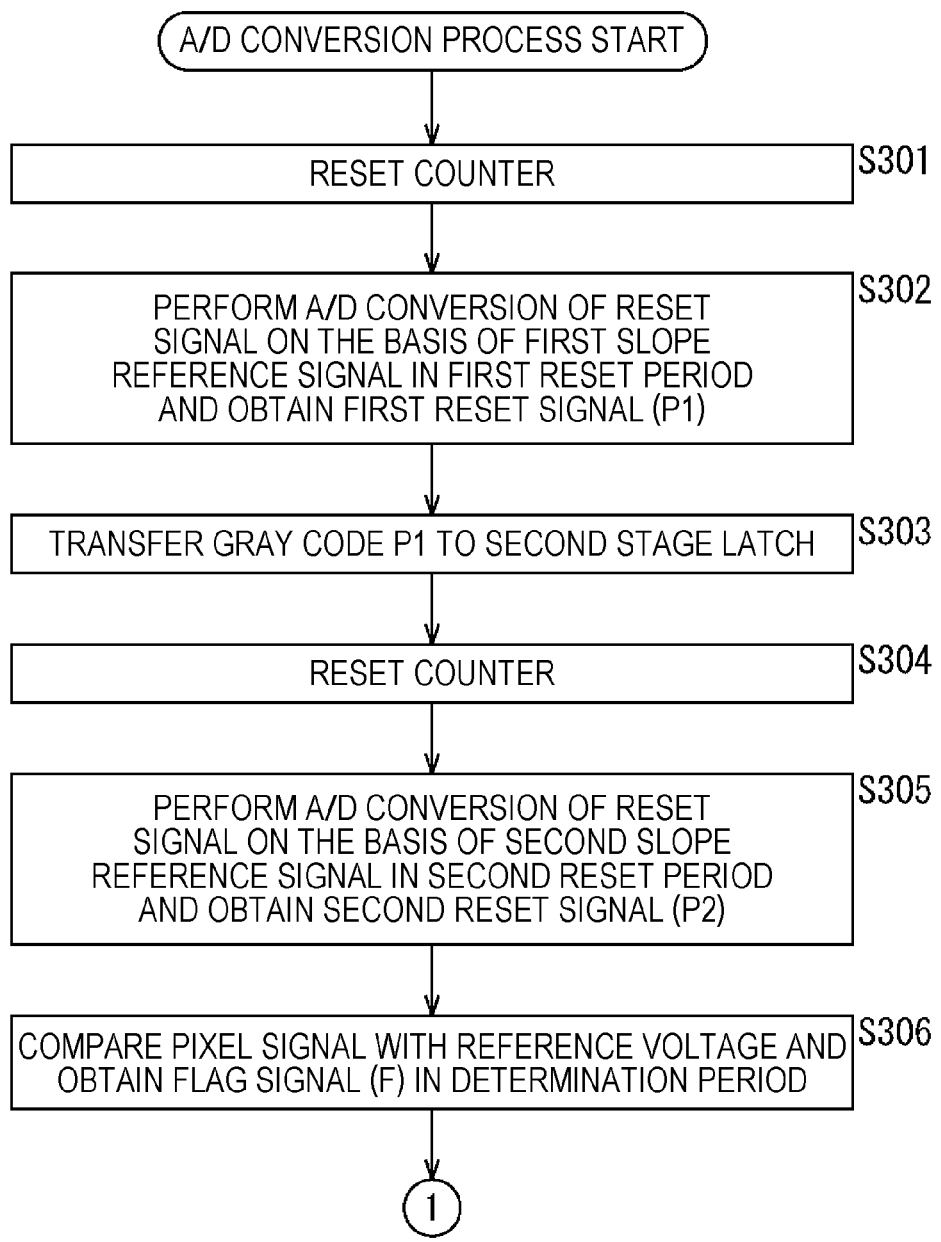
FIG. 23 is a flowchart showing an example of a flow of an A/D conversion process.

In step S301 in FIG. 23, the column A/D conversion unit 253 resets (initializes) the gray code latch 321, and sets the binary addition unit 333 to a predetermined initial value (such as "0") in response to a start of the A/D conversion process.

In step S302, the column A/D conversion unit 253 performs A/D conversion of a reset signal read from the unit pixel 141 on the basis of a first slope reference signal (having gentle slope, for example) in a first rest period (first P-phase). The gray code latch 321 obtains gray codes of a first reset signal (P1) corresponding to a result of the A/D conversion (digital data).

The column A/D conversion unit 253 allows the latch in the first stage of each of the latches 271 of the gray code latch 321 to retain the obtained gray codes of the first reset signal (P1).

In step S303, each of the latches 271 of the gray code latch 321 of the column A/D conversion unit 253 transfers the gray codes of the first reset signal (P1) retained in the latch in the first stage to the latch in the second stage, and allows the latch in the second stage to retain the gray codes.

Further, in step S304, the column A/D conversion unit 253 resets (initializes) the gray code latch 321, and sets the binary addition unit 333 to the predetermined initial value (such as "0").

In step S305, the column A/D conversion unit 253 performs A/D conversion of a reset signal read from the unit pixel 141 on the basis of a second slope reference signal (having sharp slope, for example) in a second reset period (second P-phase) to obtain gray codes of the second reset signal (P2). The column A/D conversion unit 253 allows the latch in the first stage of each of the latches 271 of the gray code latch 321 to retain the obtained gray codes of the second reset signal (P2).

In this state, the gray code latch 321 retains both (gray codes) of the first reset signal (P1) and the second reset signal (P2). More specifically, each of the latches 271 of the gray code latch 321 retains both a bit value contained in the first reset signal (P1) and associated with the corresponding latch 271, and a bit value contained in the second reset signal (P2) and associated with the corresponding to the latch 271.

In step S306, the comparison unit 192 of the column A/D conversion unit 253 compares a pixel signal read from the unit pixel 141 with a predetermined reference voltage, and obtains a result of the comparison as a flag signal (F).

After completion of processing in step S306, the process proceeds to FIG. 18.

Figure 24:
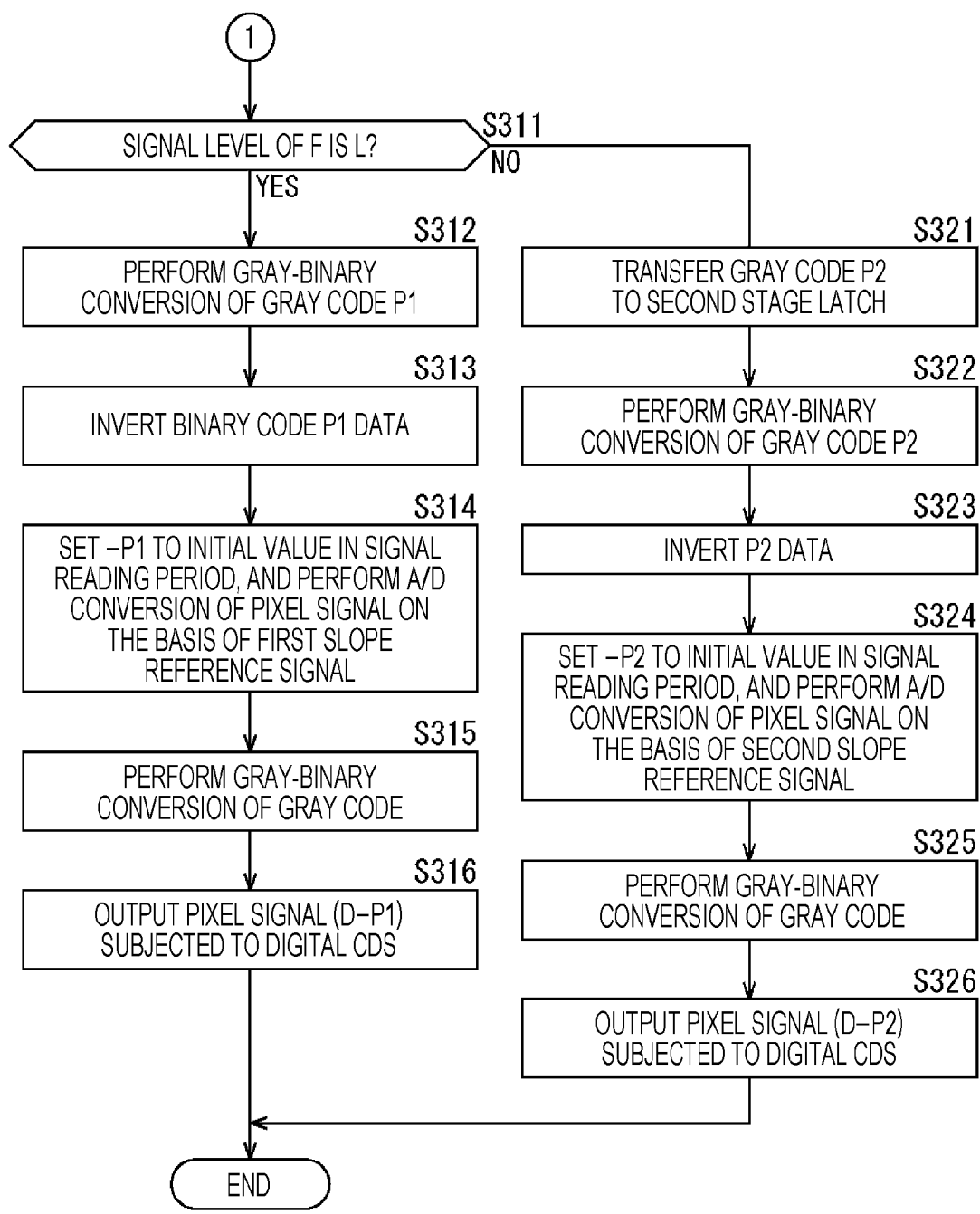
FIG. 24 is a flowchart continuing from the flowchart of FIG. 23, and showing the example of the flow of the A/D conversion process.

In step S311 in FIG. 24, the column A/D conversion unit 253 determines whether or not the signal level of the flag signal (F) is L. When it is determined that the pixel signal has low illuminance on the basis of determination of the signal level of the flag signal (F) as L, the process proceeds to step S312.

In step S312, the column A/D conversion unit 253 reads gray codes of the lower bits of the first reset signal (P1) retained in the latch in the second stage from each of the latches 271. The gray binary conversion unit 331 converts the gray codes into binary codes.

In step S313, the lower bit binary addition unit 333 of the gray code latch 321 of the column A/D conversion unit 253 inverts data indicating the binary codes of the first reset signal (P1) obtained by gray-binary conversion. More specifically, an initial value "−P1" is set to the column A/D conversion unit 253.

In step S314, the column A/D conversion unit 253 performs A/D conversion of a pixel signal read from the unit pixel 141 by using the initial value "−P1" on the basis of a first slope reference signal (reference signal having gentle slope, for example) in a signal reading period (D-phase).

The gray code latch 321 obtains gray codes of the pixel signal (D) in digital data by this A/D conversion.

In step S315, the gray binary conversion unit 331 of the column A/D conversion unit 253 performs gray-binary conversion of the gray codes of the pixel signal (D) in digital data to obtain binary codes of the pixel signal (D) in digital data. The binary addition unit 333 adds the initial value "−P1" to the obtained binary codes of the pixel signal (D) in digital data to obtain binary codes of a pixel signal (D-P1) subjected to digital CDS.

In step S316, the column A/D conversion unit 253 outputs the pixel signal (D-P1) subjected to digital CDS.

After completion of processing in step S316, the A/D conversion process ends.

On the other hand, when it is determined that the pixel signal has high illuminance on the basis of determination of the signal level of the flag signal (F) as H in S311 in FIG. 24, the process proceeds to step S321.

In step S321, the column A/D conversion unit 253 transfers gray codes of the second reset signal (P2) retained in the latch in the first stage in each of the latches 271 of the gray code latch 321 to the latch in the second stage, and allows the latch in the second stage to retain the gray codes.

In step S322, the column A/D conversion unit 253 reads the gray codes of the lower bits of the second reset signal (P2) retained in the latch in the second stage from the latch 271. The gray binary conversion unit 331 converts the gray codes into binary codes.

In step S323, the binary addition unit 333 of the gray code latch 321 of the column A/D conversion unit 253 inverts data indicating the binary codes of the second reset signal (P2) obtained by gray-binary conversion. More specifically, an initial value "−P2" is set to the column A/D conversion unit 253.

In step S324, the column A/D conversion unit 253 performs A/D conversion of a pixel signal read from the unit pixel 141 by using the "−P2" as the initial value on the basis of a second slope reference signal (reference signal having gentle slope, for example) in the signal reading period (D-phase). The gray code latch 321 obtains a pixel signal (D) in digital data by this A/D conversion.

In step S325, the gray binary conversion unit 331 of the column A/D conversion unit 253 performs gray-binary conversion of gray codes of the pixel signal (D) in digital data to obtain binary codes of the pixel signal (D) in digital data. The binary addition unit 333 adds the initial value "−P2" to the obtained binary codes of the pixel signal (D) in digital data to obtain binary codes of a pixel signal (D-P2) subjected to digital CDS.

In step S326, the column A/D conversion unit 253 outputs the pixel signal (D-P2) subjected to digital CDS.

After completion of processing in step S326, the A/D conversion process ends.

Figure 25:
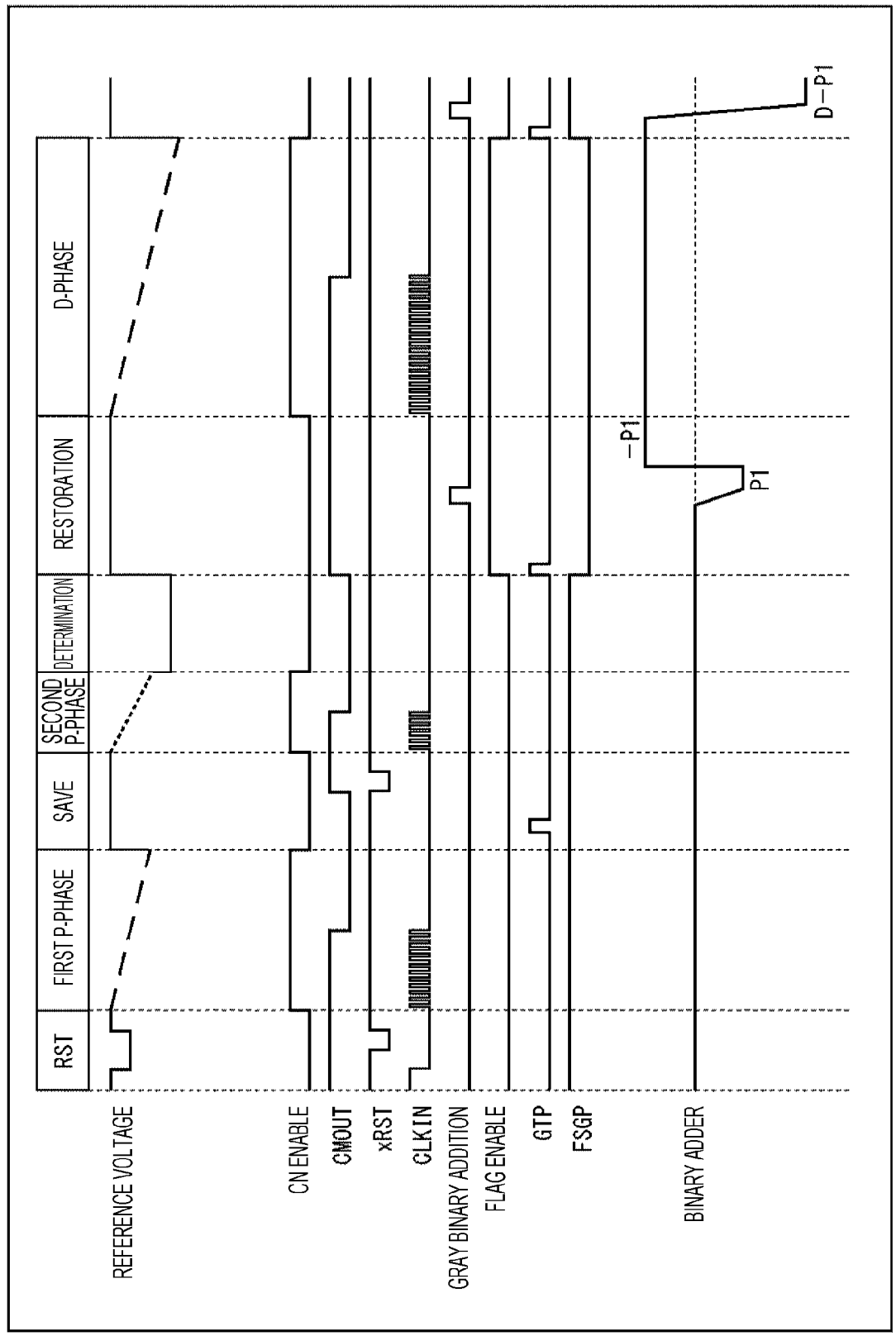
FIG. 25 is a timing chart showing an example of changes of A/D conversion.

FIG. 25 is a view showing an example of a timing chart when low illuminance of the D-phase is determined on the basis of determination of the flag signal (F) in the A/D conversion process described above. After the gray code latch 321 is reset during a period (RST), gray codes of the first reset signal (P1) are obtained in a period (first P-phase). In a period (save), the gray codes of the first reset signal (P1) are transferred to the latch in the second stage of the latch 271. After the gray code latch 321 is reset, gray codes of the second reset signal (P2) are obtained in a period (second P-phase).

In a period (determination), the flag signal (F) is obtained by the comparison unit 192. The signal level of the flag signal (F) is determined as L. Accordingly, in a period (restoration), the control signal GTP is masked, in which condition gray-binary conversion and data inversion are performed for the gray codes of the first reset signal (P1) retained in the latch in the second stage of the latch 271.

More specifically, an initial value "−P1" is set for the D-phase. Thereafter, in a period (D-phase), A/D conversion of the pixel signal read from the unit pixel 141 is performed on the basis of a first slope reference signal (reference slope having gentle slope, for example) to obtain a pixel signal (D). More specifically, a pixel signal (D-P1) subjected to digital CDS is obtained.

Figure 26:
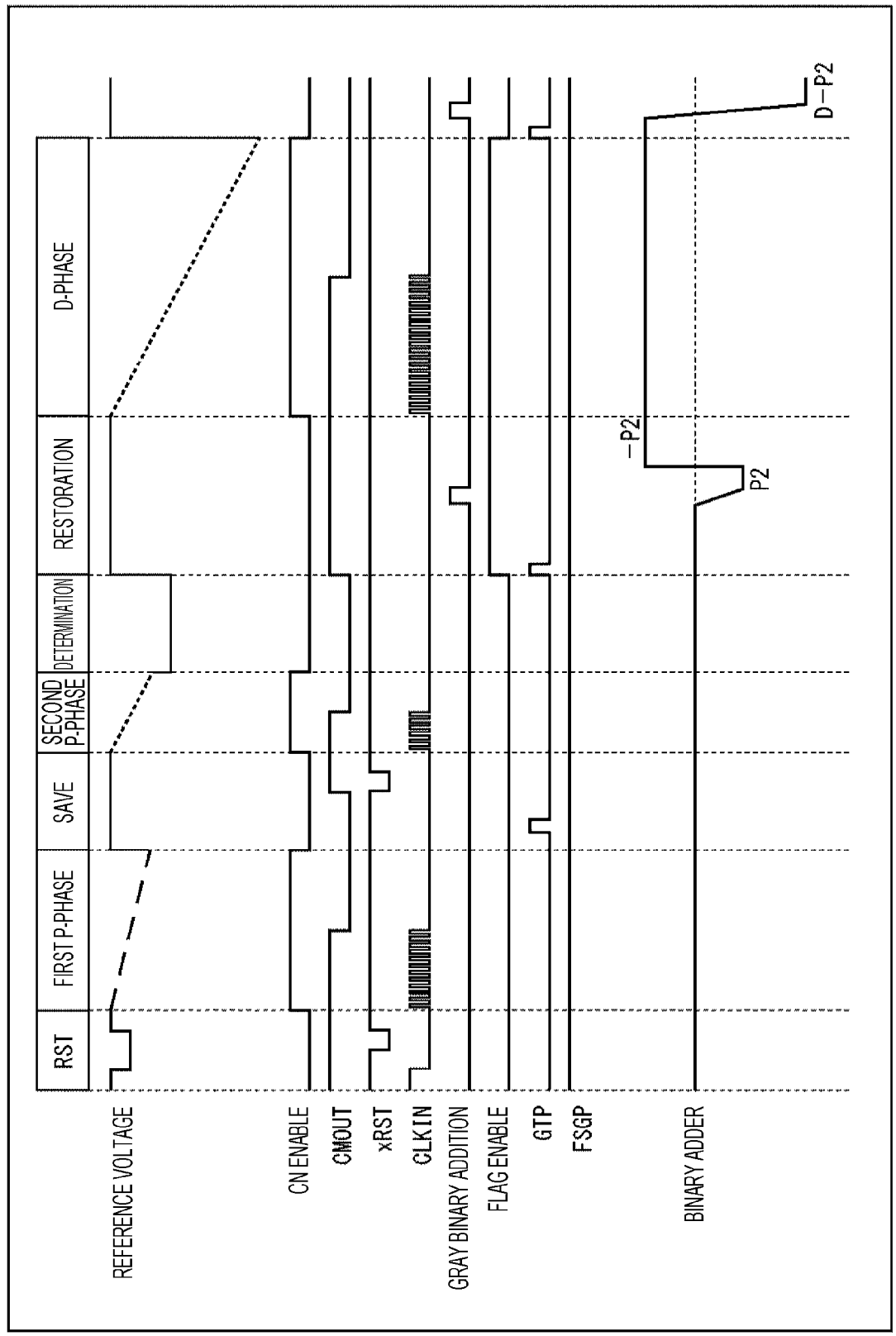
FIG. 26 is a timing chart showing another example of changes of A/D conversion.

FIG. 26 is a view showing an example of a timing chart when high illuminance is determined in the D-phase on the basis of determination of the flag signal (F) in the A/D conversion process described above. The example illustrated in FIG. 25 is applicable to the example of FIG. 26 in a period until the second P-phase. The signal level of the flag signal (F) is determined as H in the period (determination). Accordingly, the gray codes of the second reset signal (P2) retained in the latch in the first stage of the latch 271 are transferred to the latch in the second stage and retained therein in the period (restoration). Thereafter, gray-binary conversion and data inversion are performed for the gray codes.

More specifically, an initial value "−P2" is set for the D-phase. Thereafter, in the period (D-phase), A/D conversion of a pixel signal read from the unit pixel 141 is performed on the basis of a second slope reference signal (reference signal having sharp slope, for example) to obtain a pixel signal (D). More specifically, a pixel signal (D-P2) subjected to digital CDS is obtained.

Each of the column A/D conversion units 253 executes the A/D conversion process described above every time a unit pixel corresponding to a processing target changes.

The column A/D conversion unit 253 (i.e., A/D conversion unit 241) executing the A/D conversion process is capable of more accurately performing high speed and high dynamic range A/D conversion while reducing a rise of costs. Accordingly, the image sensor 100 including the column A/D conversion unit 253 (i.e., A/D conversion unit 241) to which the present technology has been applied is capable of reducing a rise of costs.

4. Fourth Embodiment

<Latches for 3 Sets or More of Data>

Note that the signal processing device such as a flip-flop may include a first latch which retains an input signal and outputs a retained signal, a plurality of second latches each of which obtains the signal retained in the first latch and retains the obtained signal, and further supplies the retained signal to the first latch to allow the first latch to retain the supplied signal, and a transfer control unit which controls transfer of a signal between the first latch and the second latches. The signal processing device thus configured is capable of retaining three or more values, selecting a desired value from the retained values, and outputting the selected value.

Moreover, the signal processing device such as a latch may include three or more latches each of which is connected in series and retaining a signal, for example. In this case, the signal processing device may further include a control unit which transfers a signal retained in a desired latch to a latch in a final stage, and outputs the signal from the latch in the final stage. The signal processing device thus configured is capable of retaining three or more values, selecting a desired value from the retained values, and outputting the selected value.

<D Flip-Flop>

Figure 27:
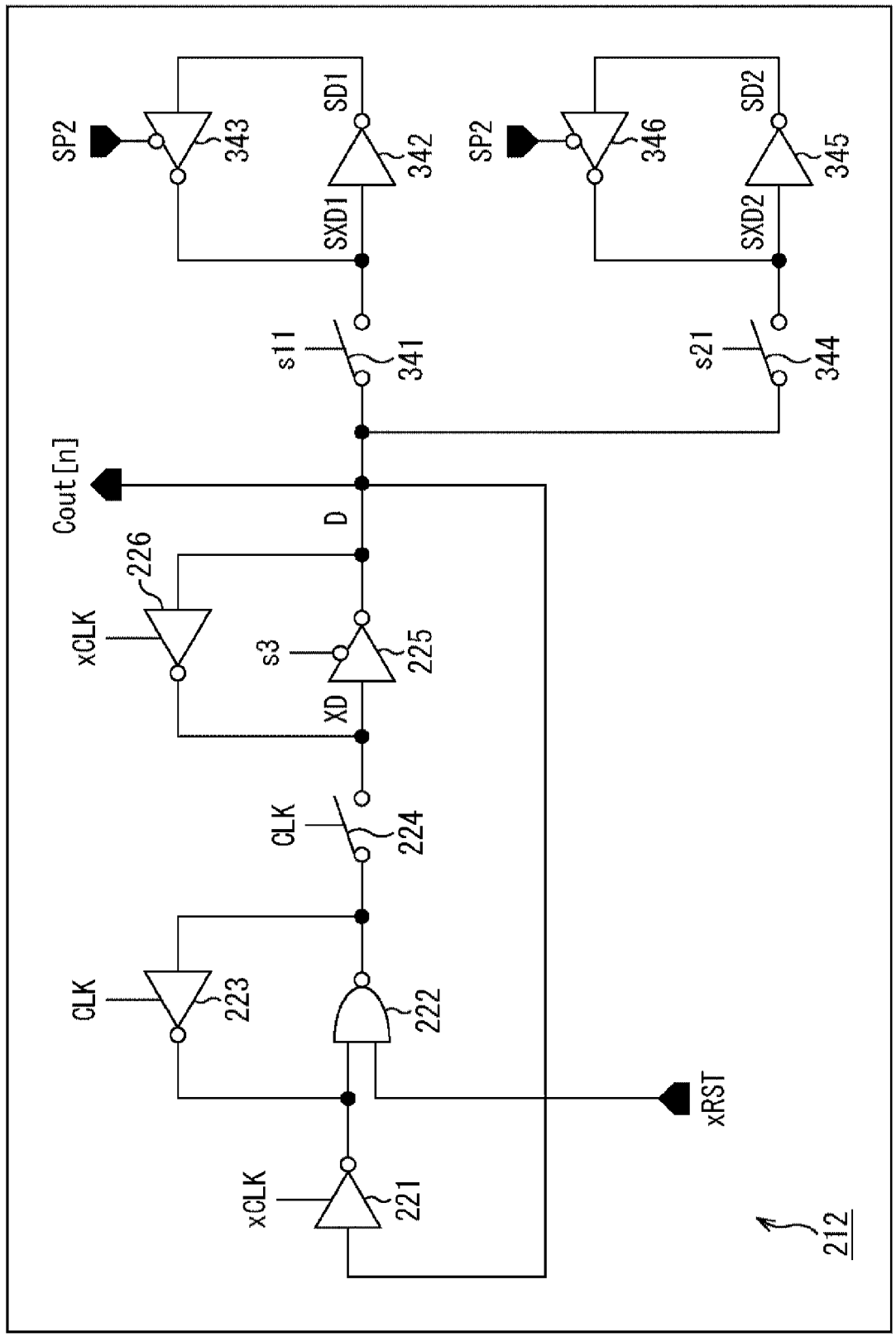
FIG. 27 is a view illustrating an example of a main configuration of the flip-flop.

For example, in a case where only a binary counter is used, each of the D flip-flops 212 may be configured to retain three or more signals as described above. FIG. 27 illustrates an example of a main configuration of the D flip-flop 212 thus configured. As illustrated in FIG. 27, the D flip-flop 212 thus configured includes a first save latch constituted by NOT gates 342 and 343, a switch 341 which controls transfer of a signal to the first save latch in accordance with a value of a control signal s11, a second wave latch constituted by NOT gates 345 and 346, and a switch 344 which controls transfer of a signal to the second save latch in accordance with a value of a control signal s21.

The control signal CLK controlling the NOT gate 223 and the switch 224, and the control signal xCLK corresponding to an inverted value of the control signal CLK and controlling the NOT gates 221 and 226 are generated from the control signal CKH, the control signal xCKL, and the Cin[n] by using a logic circuit constituted by the AND gate 231, the NOR gate 232, and the NOT gate 233 illustrated in A of FIG. 28.

On the other hand, the control signal s11 controlling the switch 341, the control signal s21 controlling the switch 344, and the control signal s3 controlling the NOT gate 225 are generated from a control signal SP11, a control signal FSP1, a control signal SP21, a control signal FSP2, and a control signal SP3 by using a logic circuit constituted by AND gates 351 and 352, an OR gate 353, and an AND gate 354 illustrated in B of FIG. 28.

The D flip-flop 212 (FIG. 27) transfers a signal retained in Cout[n] to the first save latch (latch constituted by NOT gates 342 and 343), and allows the first save latch to retain the transferred signal under control by the control signal s11, for example. Similarly, the D flip-flop 212 (FIG. 27) transfers a signal retained in Cout[n] to the second save latch (latch constituted by NOT gates 345 and 346), and allows the second save latch to retain the transferred signal under control by the control signal s21, for example.

In other words, the D flip-flop 212 (FIG. 27) retains three signals, and therefore is capable of selecting an arbitrary signal from the three signals, and outputting the selected signal from Cout[n].

The counter 193 including the D flip-flop 212 thus configured is allowed to retain three or more count values (respective bits of count values). Accordingly, the column A/D conversion unit 181 including the counter 193 thus configured is capable of selecting a reference signal corresponding to a signal level of a pixel signal from three or more reference signals in the D-phase, and performing A/D conversion of the pixel signal on the basis of the selected reference signal. In addition, the column A/D conversion unit 181 is capable of setting a more appropriate initial value at the time of the A/D conversion. The column A/D conversion unit 181 is therefore capable of performing high dynamic range A/D conversion in this manner more accurately at high speed.

In addition, the D flip-flop 212 thus configured is similarly capable of inverting data indicating a signal retained in the first latch. Accordingly, the column A/D conversion unit 181 thus configured is capable of performing high dynamic range A/D conversion more accurately at high speed.

Furthermore, only slight addition to the D flip-flop 212 is needed in this configuration similarly to the above examples. Accordingly, the image sensor 100 is capable of reducing a rise of costs.

<Latch>

Figure 29:
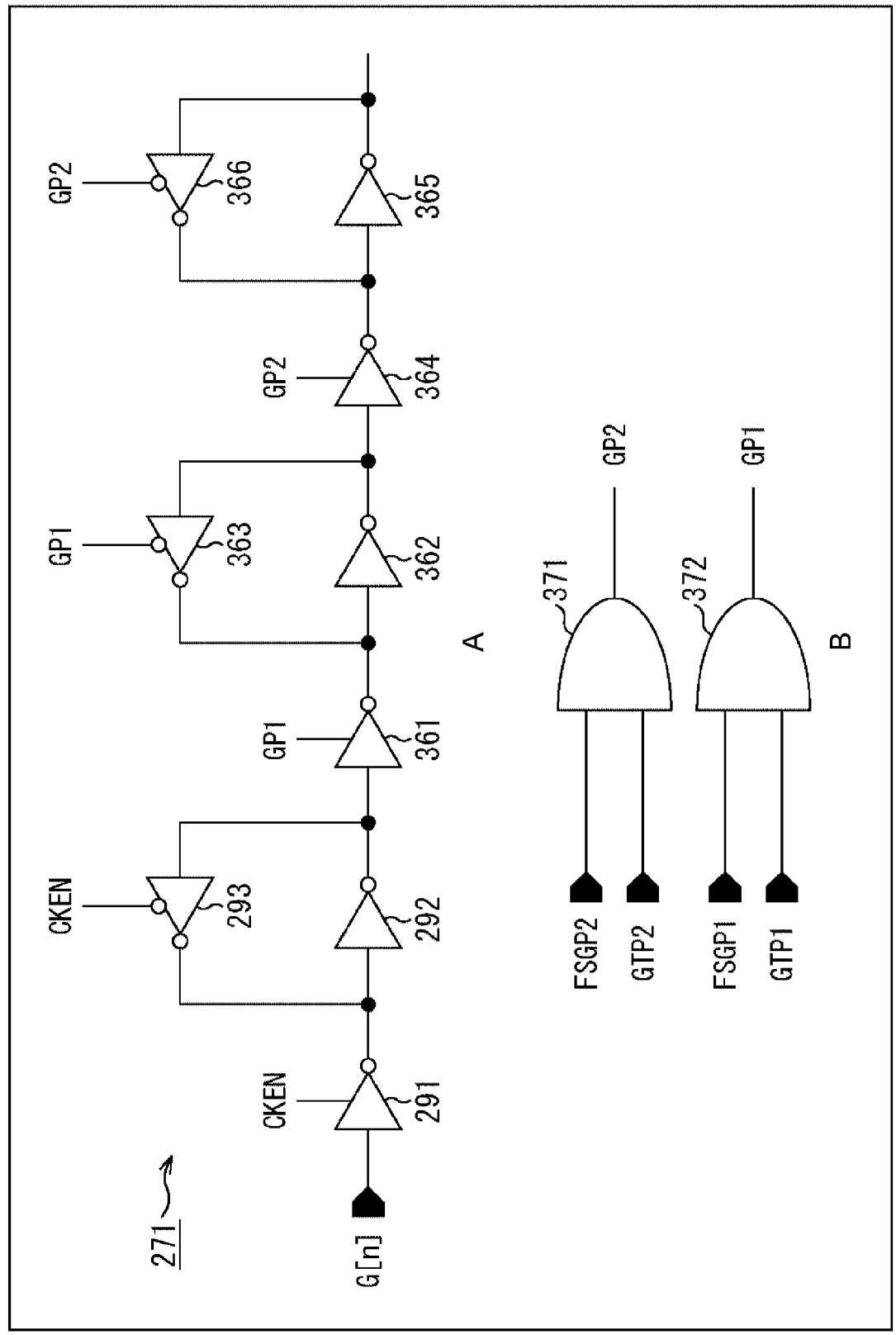
FIG. 29 is a view illustrating an example of a main configuration of the latch.

In case of use of a gray code counter, for example, each of the latches 271 may be configured to retain three or more signals as described above. FIG. 29 illustrates an example of a main configuration of the latch 271 thus configured. As illustrated in A of FIG. 29, the latch 271 thus configured includes the NOT gates 291 through 293, and NOT gates 361 through 366 configured as illustrated in A of FIG. 29.

The latch 271 of the example illustrated in FIG. 15 includes two latches connected in series as described above. However, the latch 271 of the example illustrated in A of FIG. 29 includes three or more latches connected in series. In A of FIG. 29, the latch 271 of the example illustrated in A of FIG. 29 includes a latch in the first stage constituted by the NOT gates 292 and 293, a latch in the second stage constituted by the NOT gates 362 and 363, and a latch in the third stage constituted by the NOT gates 365 and 366.

Note that a control signal GP1 controlling the NOT gates 361 and 363, and a control signal GP2 controlling the NOT gates 364 and 366 are generated from a control signal FSGP1, a control signal GTP1, a control signal FSGP2, and a control signal GTP2 by using a logic circuit constituted by AND gate 371 and A/D gate 372 as illustrated in B of FIG. 29.

Each of the lower bit gray code latch 261 and the gray code latch 321 including the latch 271 thus configured is allowed to retain three or more count values (respective bits of count values). More specifically, the column A/D conversion unit 253 including the latch 271 thus configured is capable of selecting a reference signal corresponding to a signal level of a pixel signal from three or more reference signals, and performing A/D conversion of the pixel signal on the basis of the selected reference signal in the D-phase. In addition, the column A/D conversion unit 181 is capable of setting a more appropriate initial value at the time of the A/D conversion. Accordingly, the column A/D conversion unit 253 is capable of performing high dynamic range A/D conversion in this manner more accurately at high speed.

In addition, the A/D conversion described above is realizable by a slight change of the latches 271 and the flag latch 276, wherefore increase in the circuit scale (area necessary for installation) of the column A/D conversion unit 253 is avoidable. Accordingly, the image sensor 100 is capable of reducing a rise of costs.

<Flow of A/D Conversion Process>

An example of a flow of an A/D conversion process executed by the column A/D conversion unit 253 of the image sensor 100 thus configured is now described with reference to a flowchart shown in FIGS. 30 through 32.

Figure 30:
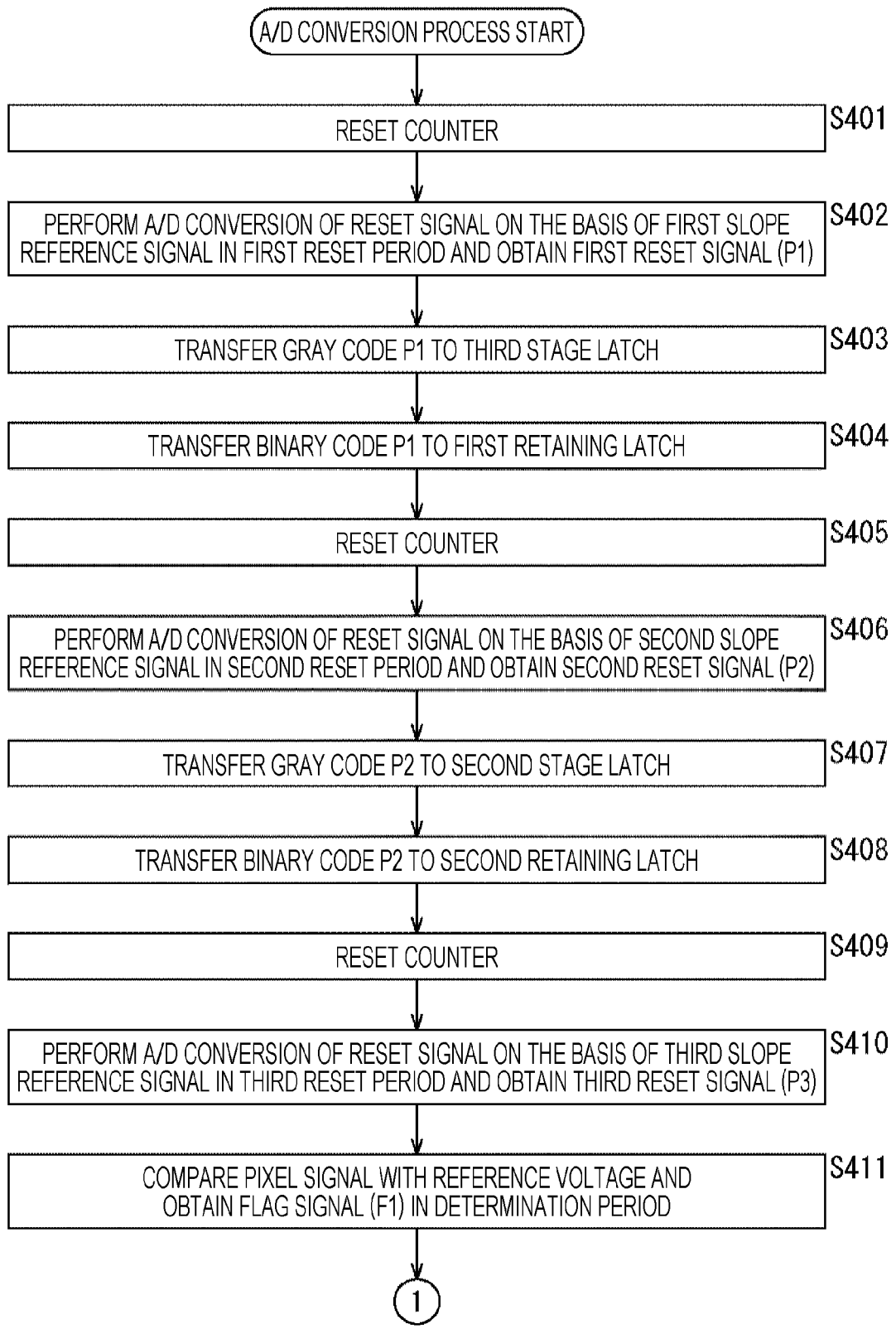
FIG. 30 is a flowchart showing an example of a flow of an A/D conversion process.

In step S401 in FIG. 30, the column A/D conversion unit 253 resets (initializes) the higher bit binary counter 262 and the like, and sets each of the D flip-flops 212 to a predetermined initial value (such as "0") in response to a start of the A/D conversion process.

In step S402, the column A/D conversion unit 253 performs A/D conversion of a reset signal read from the unit pixel 141 on the basis of a first slope reference signal (having gentle slope, for example) in a first rest period (first P-phase). Each of the lower bit gray code latch 261 and the higher bit binary counter 262 obtains a first reset signal (P1) corresponding to a result of the A/D conversion (digital data).

The column A/D conversion unit 253 allows the latch in the first stage of each of the latches 271 of the lower bit gray code latch 261 to retain the gray codes of the lower bits (5 bits) of the obtained first reset signal (P1). On the other hand, the column A/D conversion unit 253 allows the latch of the higher bit binary counter 262 to retain the binary codes of the remaining higher bits of the obtained first reset signal (P1).

In step S403, each of the latches 271 of the lower bit gray code latch 261 of the column A/D conversion unit 253 transfers gray codes of the lower bits of the first reset signal (P1) retained in the latch in the first stage to the latch in the third stage, and allows the latch in the third stage to retain the gray codes.

Further, in step S404, the column A/D conversion unit 253 brings the switch 227 of each of the D flip-flops 212 of the higher bit binary counter 262 to the on-state. Thereafter, the column A/D conversion unit 253 transfers the binary codes of the higher bits of the first reset signal (P1) retained in the latch of the higher bit binary counter 262 to the first save latch, and allows the first save latch to retain the binary codes.

In step S405, the column A/D conversion unit 253 resets (initializes) the counter 193, and sets each of the D flip-flops 212 to the predetermined initial value (such as "0").

In step S406, the column A/D conversion unit 253 performs A/D conversion of a reset signal read from the unit pixel 141 on the basis of a second slope reference signal (having sharp slope, for example) in a second reset period (second P-phase). Each of the lower bit gray code latch 261 and the higher bit binary counter 262 obtains a second reset signal (P2) corresponding to a result of the A/D conversion (digital data).

The column A/D conversion unit 253 allows the latch in the first stage of each of the latches 271 of the lower bit gray code latch 261 to retain the obtained gray codes of the lower bits (5 bits) of the second reset signal (P2). On the other hand, the column A/D conversion unit 253 allows the latch of the higher bit binary counter 262 to retain the obtained binary codes of the remaining higher bits of the second reset signal (P2).

In step S407, each of the latches 271 of the lower bit gray code latch 261 of the column A/D conversion unit 253 transfers gray codes of the lower bits of the second reset signal (P2) retained in the latch in the first stage to the latch in the second stage, and allows the latch in the second stage to retain the gray codes.

Moreover, in step S408, each of the D flip-flops 212 of the higher bit binary counter 262 of the column A/D conversion unit 253 transfers binary codes of the higher bits of the second reset signal (P2) retained in the latch of the higher bit binary counter 262 to the second save latch, and allows the second save latch to retain the binary codes.

In step S409, the column A/D conversion unit 253 the column A/D conversion unit 253 resets (initializes) the higher bit binary counter 262 and the like, and sets each of the D flip-flops 212 to the predetermined initial value (such as "0").

In step S410, the column A/D conversion unit 253 performs A/D conversion of a reset signal read from the unit pixel 141 on the basis of a third slope reference signal (having a sharper slope, for example) in a third reset period (third P-phase). Each of the lower bit gray code latch 261 and the higher bit binary counter 262 obtains a third reset signal (P3) corresponding to a result of the A/D conversion (digital data).

The column A/D conversion unit 253 allows the latch in the first stage of each of the latches 271 of the lower bit gray code latch 261 to retain gray codes of lower bits (5 bits) of the obtained third reset signal (P3). The column A/D conversion unit 253 further allows the latch of the higher bit binary counter 262 to retain binary codes of the remaining higher bits of the obtained third reset signal (P3).

In this state, the higher bit binary counter 262 retains the first reset signal (P1) through the third reset signal (P3) (binary codes of higher bits of first reset signal (P1) through third reset signal (P3)). More specifically, each of the D flip-flops 212 retains all of bit values corresponding to the first reset signal (P1) and associated with the corresponding D flip-flop 212, bit values corresponding to the second reset signal (P2) and associated with the corresponding D flip-flop 212, and bit values corresponding to the third reset signal (P3) and associated with the corresponding D flip-flop 212.

Similarly, in this state, the lower bit gray code latch 261 retains the first reset signal (P1) through the third reset signal (P3) (gray codes of lower bits of first reset signal (P1) through third reset signal (P3)). More specifically, each of the latches 271 of the lower bit gray code latch 261 retains all of bit values corresponding to the first reset signal (P1) through the third reset signal (P3) and associated with the corresponding latch 271.

In step S411, the comparison unit 192 of the column A/D conversion unit 253 compares a pixel signal read from the unit pixel 141 with a predetermined reference voltage, and obtains a result of the comparison as a flag signal (F1).

Figure 31:
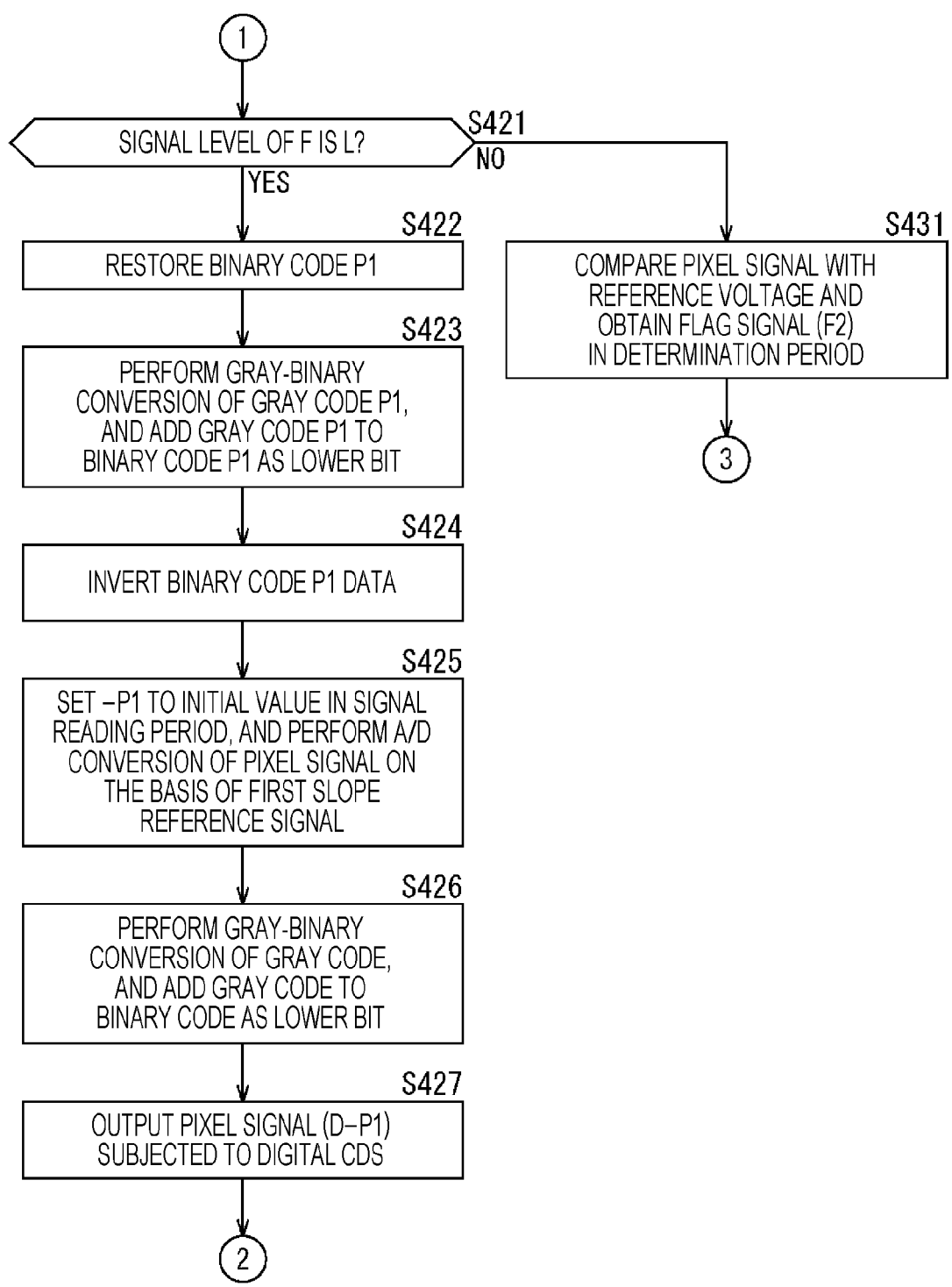
FIG. 31 is a flowchart continuing from the flowchart of FIG. 30, and showing the example of the flow of the A/D conversion process.

After completion of processing in step S411, the process proceeds to FIG. 31.

In step S421 in FIG. 31, the column A/D conversion unit 253 determines whether or not a signal level of the flag signal (F1) is L. When it is determined that the pixel signal has low illuminance on the basis of determination of the signal level of the flag signal (F1) as L, the process proceeds to step S422.

In step S422, each of the D flip-flops 212 of the higher bit binary counter 262 of the column A/D conversion unit 253 restores the binary codes of the higher bits of the first reset signal (P1) retained in the first save latch.

In step S423, the column A/D conversion unit 253 reads the gray codes of the lower bits of the first reset signal (P1) retained in the latch in the third stage from the latch 271. The gray binary conversion unit 272 converts the gray codes into binary codes.

In step S424, each of the D flip-flops 212 of the higher bit binary counter 262 of the column A/D conversion unit 253 inverts data indicating the binary codes of the higher bits of the restored first reset signal (P1). On the other hand, the lower bit binary addition unit 274 of the lower bit gray code latch 261 of the column A/D conversion unit 253 inverts data indicating the binary codes of the lower bits of the first reset signal (P1) obtained by gray-binary conversion. More specifically, an initial value "−P1" is set to the column A/D conversion unit 253.

In step S425, the column A/D conversion unit 253 performs A/D conversion of a pixel signal read from the unit pixel 141 by using the initial value "−P1" on the basis of a first slope reference signal (reference signal having gentlest slope, for example) in a signal reading period (D-phase).

As a result of this A/D conversion, the lower bit gray code latch 261 obtains lower 5 bits of the pixel signal (D) in digital data, while the higher bit binary counter 262 obtains the remaining higher bits of the pixel signal (D).

In step S426, the gray binary conversion unit 272 of the column A/D conversion unit 253 performs gray-binary conversion of gray codes of lower 5 bits of the pixel signal (D) in digital data to obtain binary codes of the lower 5 bits of the pixel signal (D) in digital data. The lower bit binary addition unit 274 adds the initial value "−P1" to the obtained binary codes of the lower 5 bits of the pixel signal (D) in digital data to obtain binary codes of lower 5 bits of a pixel signal (D-P1) subjected digital CDS.

On the other hand, the higher bit binary counter 262 adds the initial value "−P1" to the binary codes of the remaining higher bits of the pixel signal (D) to obtain binary codes of the higher bits of the pixel signal (D-P1) subjected to digital CDS. The column A/D conversion unit 253 calculates the sum of the binary codes of the lower 5 bits of the pixel signal (D-P1) subjected to digital CDS and the binary codes of the higher bits of the pixel signal (D-P1) subjected to digital CDS to obtain binary codes of all bits of the pixel signal (D-P1) subjected to digital CDS.

In step S427, the column A/D conversion unit 253 outputs the pixel signal (D-P1) subjected to digital CDS.

After completion of processing in step S427, the A/D conversion process ends.

On the other hand, when it is determined that the pixel signal is not a low-illuminance signal on the basis of determination of the signal level of the flag signal (F1) as H in step S421 in FIG. 31, the process proceeds to step S431.

In step S431, the comparison unit 192 of the column A/D conversion unit 253 compares the pixel signal read from the unit pixel 141 with a predetermined reference signal, and obtains a result of the comparison as a flag signal (F2).

Figure 32:
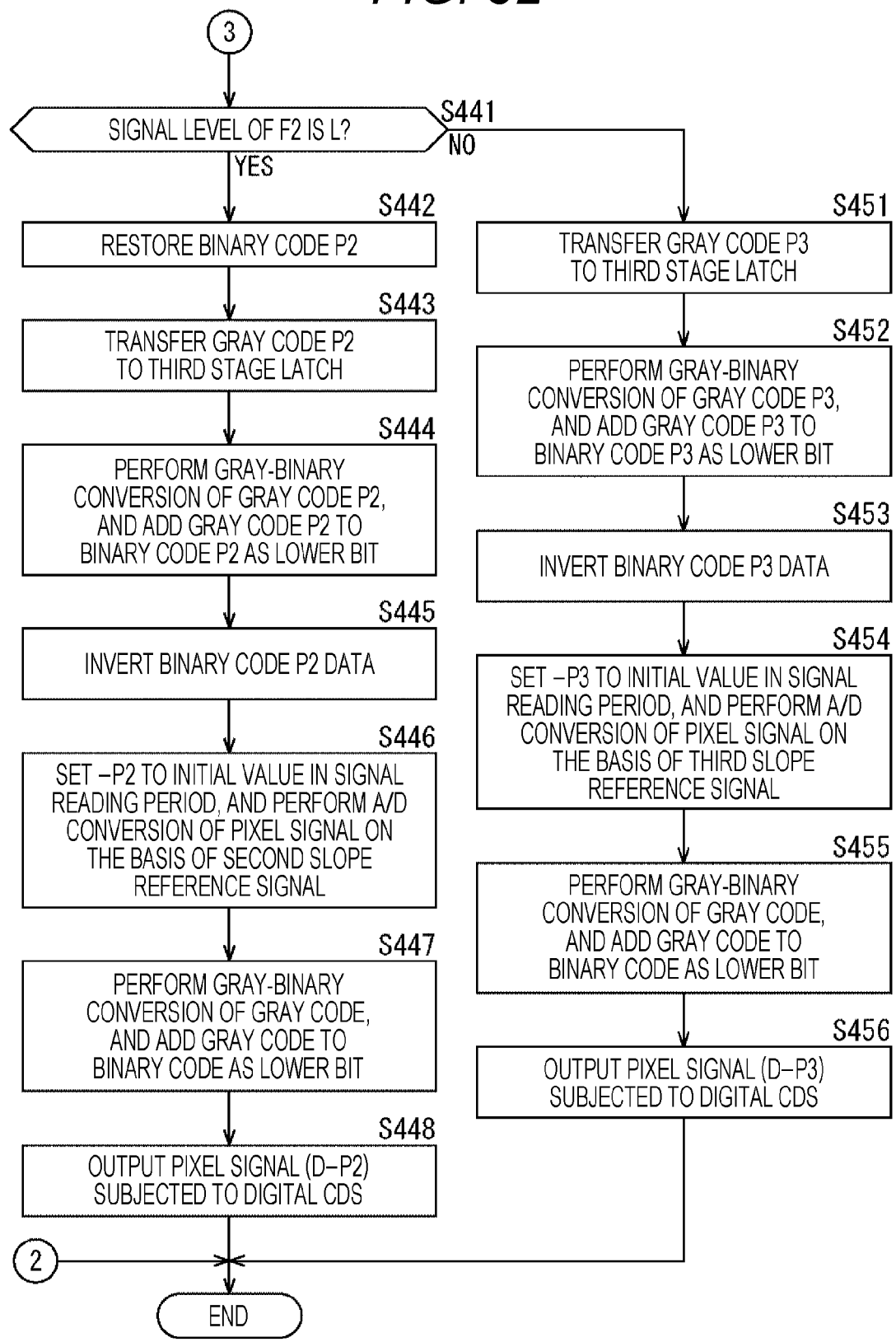
FIG. 32 is a flowchart continuing from the flowchart of FIG. 31, and showing the example of the flow of the A/D conversion process.

After completion of processing in step S431, the process proceeds to FIG. 32.

In step S441 in FIG. 32, the column A/D conversion unit 253 determines whether or not the signal level of the flag signal (F2) is L. When it is determined that the pixel signal is a medium-illuminance signal on the basis of determination of the signal level of the flag signal (F2) as L, the process proceeds to step S442.

In step S442, each of the D flip-flops 212 of the higher bit binary counter 262 of the column A/D conversion unit 253 restores the binary codes of the higher bits of the second reset signal (P2) retained in the second save latch.

In step S443, the column A/D conversion unit 253 transfers the gray codes of the lower bits of the second reset signal (P2) retained in the latch in the second stage from the latch 271 to the latch in the third stage, and allows the latch in the third stage of the latch 271 to retain the gray codes.

In step S444, the column A/D conversion unit 253 reads the gray codes of the lower bits of the second reset signal (P2) retained in the latch in the third stage from the latch 271. The gray binary conversion unit 272 converts the gray codes into binary codes.

In step S445, each of the D flip-flops 212 of the higher bit binary counter 262 of the column A/D conversion unit 253 inverts data indicating the binary codes of the higher bits of the restored second reset signal (P2). In addition, the lower bit binary addition unit 274 of the lower bit gray code latch 261 of the column A/D conversion unit 253 inverts data indicating the binary codes of the lower bits of the second reset signal (P2) obtained by gray-binary conversion. More specifically, an initial value "−P2" is set to the column A/D conversion unit 253.

In step S446, the column A/D conversion unit 253 performs A/D conversion of a pixel signal read from the unit pixel 141 by using the initial value "−P2" on the basis of a second slope reference signal (reference signal having medium slope, for example) in a signal reading period (D-phase).

As a result of this A/D conversion, the lower bit gray code latch 261 obtains lower 5 bits of the pixel signal (D) in digital data, while the higher bit binary counter 262 obtains the remaining higher bits of the pixel signal (D).

In step S447, the gray binary conversion unit 272 of the column A/D conversion unit 253 performs gray-binary conversion of gray codes of lower 5 bits of the pixel signal (D) in digital data to obtain binary codes of the lower 5 bits of the pixel signal (D) in digital data. The lower bit binary addition unit 274 adds the initial value "−P2" to the obtained binary codes of the lower 5 bits of the pixel signal (D) in digital data to obtain binary codes of lower 5 bits of a pixel signal (D-P2) subjected digital CDS.

On the other hand, the higher bit binary counter 262 adds the initial value "−P2" to the binary codes of the remaining higher bits of the pixel signal (D) to obtain binary codes of higher bits of the pixel signal (D-P2) subjected to digital CDS. The column A/D conversion unit 253 calculates the sum of the binary codes of the lower 5 bits of the pixel signal (D-P2) subjected to digital CDS and the binary codes of the higher bits of the pixel signal (D-P2) subjected to digital CDS to obtain binary codes of all bits of the pixel signal (D-P2) subjected to digital CDS.

In step S448, the column A/D conversion unit 253 outputs the pixel signal (D-P2) subjected to digital CDS.

After completion of processing in step S448, the A/D conversion process ends.

On the other hand, when it is determined that the pixel signal is a high illuminance signal on the basis of determination of the signal level of the flag signal (F2) as H in step S441 in FIG. 32, the process proceeds to step S451.

In step S451, the column A/D conversion unit 253 transfers the gray codes of the lower bits of the third reset signal (P3) retained in the latch in the first stage from the latch 271 to the latch in the third stage of the corresponding latch 271, and allows the latch in the third stage to retain the gray codes.

In step S452, the column A/D conversion unit 253 reads the gray codes of the lower bits of the third reset signal (P3) retained in the latch in the third stage from each of the latch 271. The gray binary conversion unit 272 converts the gray codes into binary codes.

In step S453, each of the D flip-flops 212 of the higher bit binary counter 262 of the column A/D conversion unit 253 inverts data indicating the binary codes of the higher bits of the third reset signal (P3) retained in the latch. In addition, the lower bit binary addition unit 274 of the lower bit gray code latch 261 of the column A/D conversion unit 253 inverts data indicating the binary codes of the lower bits of the third reset signal (P3) obtained by gray-binary conversion. More specifically, the initial value "−P3" is set to the column A/D conversion unit 253.

In step S454, the column A/D conversion unit 253 performs A/D conversion of a pixel signal read from the unit pixel 141 by using the initial value "−P3" on the basis of a third slope reference signal (reference signal having sharpest slope, for example) in a signal reading period (D-phase).

As a result of this A/D conversion, the lower bit gray code latch 261 obtains lower 5 bits of the pixel signal (D) in digital data, while the higher bit binary counter 262 obtains the remaining higher bits of the pixel signal (D).

In step S455, the gray binary conversion unit 272 of the column A/D conversion unit 253 performs gray-binary conversion of gray codes of lower 5 bits of the pixel signal (D) in digital data to obtain binary codes of the lower 5 bits of the pixel signal (D) in digital data. The lower bit binary addition unit 274 adds the initial value "−P3" to the obtained binary codes of the lower 5 bits of the pixel signal (D) in digital data to obtain binary codes of lower 5 bits of a pixel signal (D-P3) subjected to digital CDS.

On the other hand, the higher bit binary counter 262 adds the initial value "−P3" to the binary codes of the remaining higher bits of the pixel signal (D) to obtain binary codes of higher bits of the pixel signal (D-P3) subjected to digital CDS. The column A/D conversion unit 253 calculates the sum of the binary codes of the lower 5 bits of the pixel signal (D-P3) subjected to digital CDS, and the binary codes of the higher bits of the pixel signal (D-P3) subjected to digital CDS to obtain binary codes of all bits of the pixel signal (D-P3) subjected to digital CDS.

In step S456, the column A/D conversion unit 253 outputs the pixel signal (D-P3) subjected to digital CDS.

After completion of processing in step S456, the A/D conversion process ends.

Figure 33:
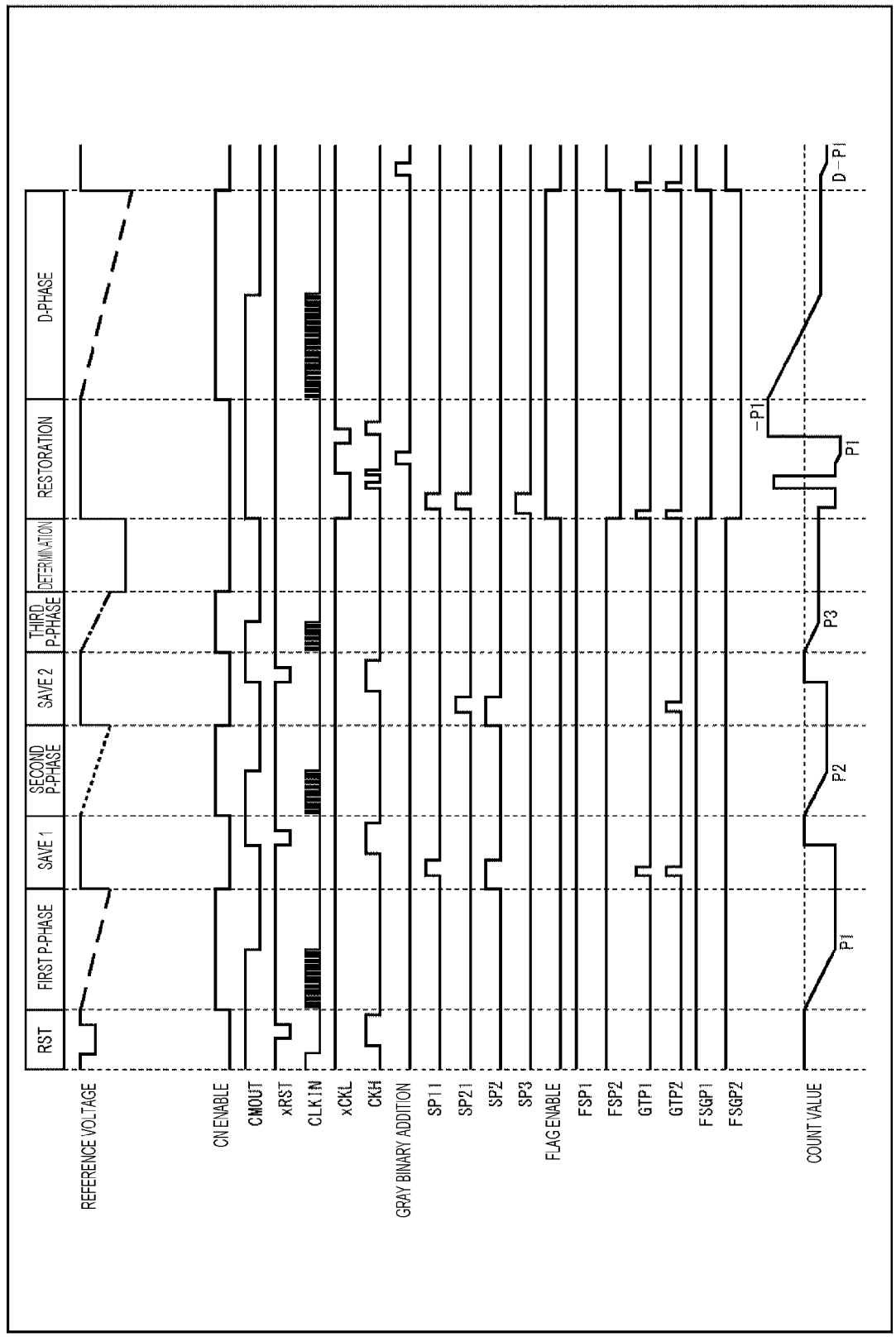
FIG. 33 is a timing chart showing an example of changes of A/D conversion.
Figure 34:
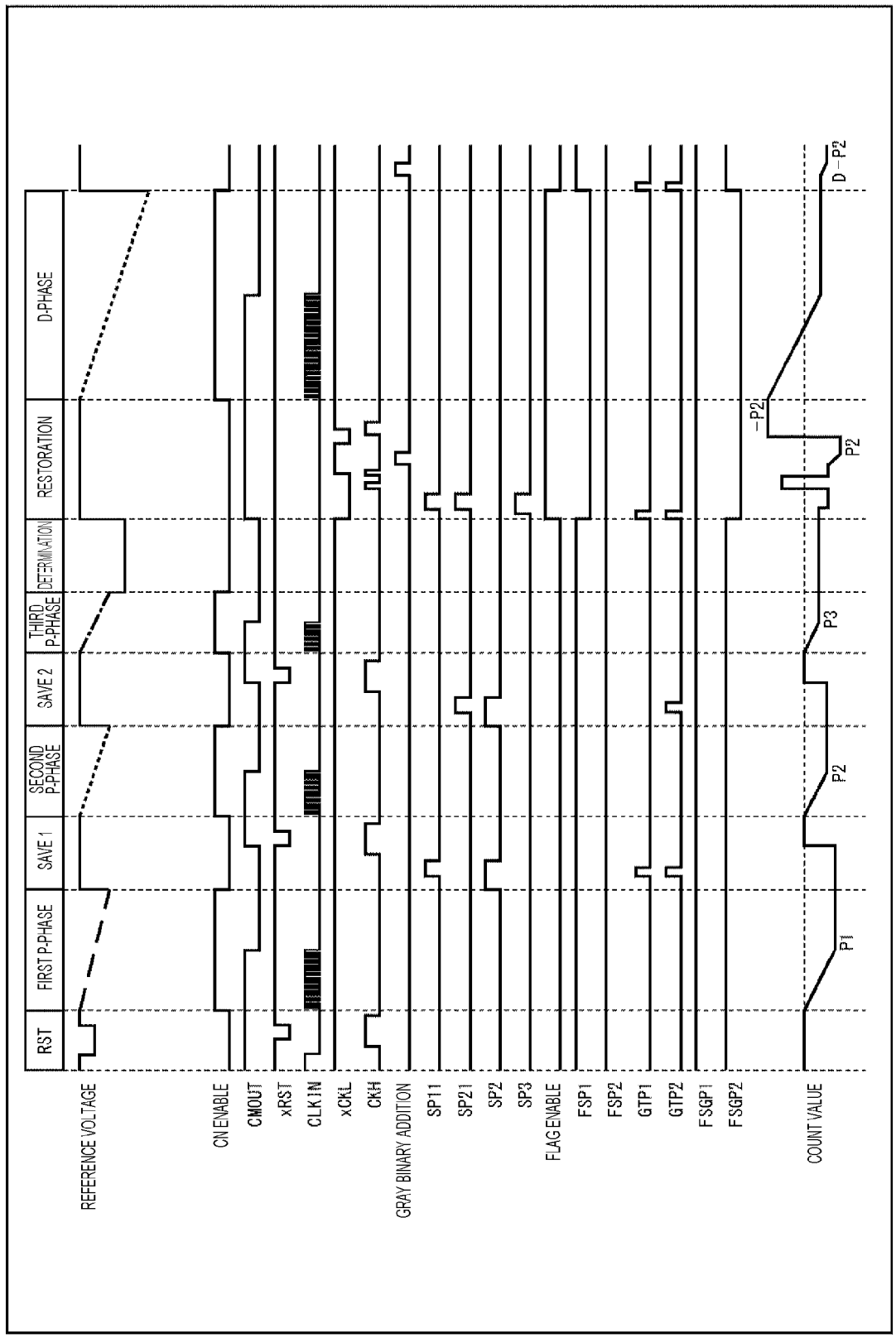
FIG. 34 is a timing chart showing another example of changes of A/D conversion.
Figure 35:
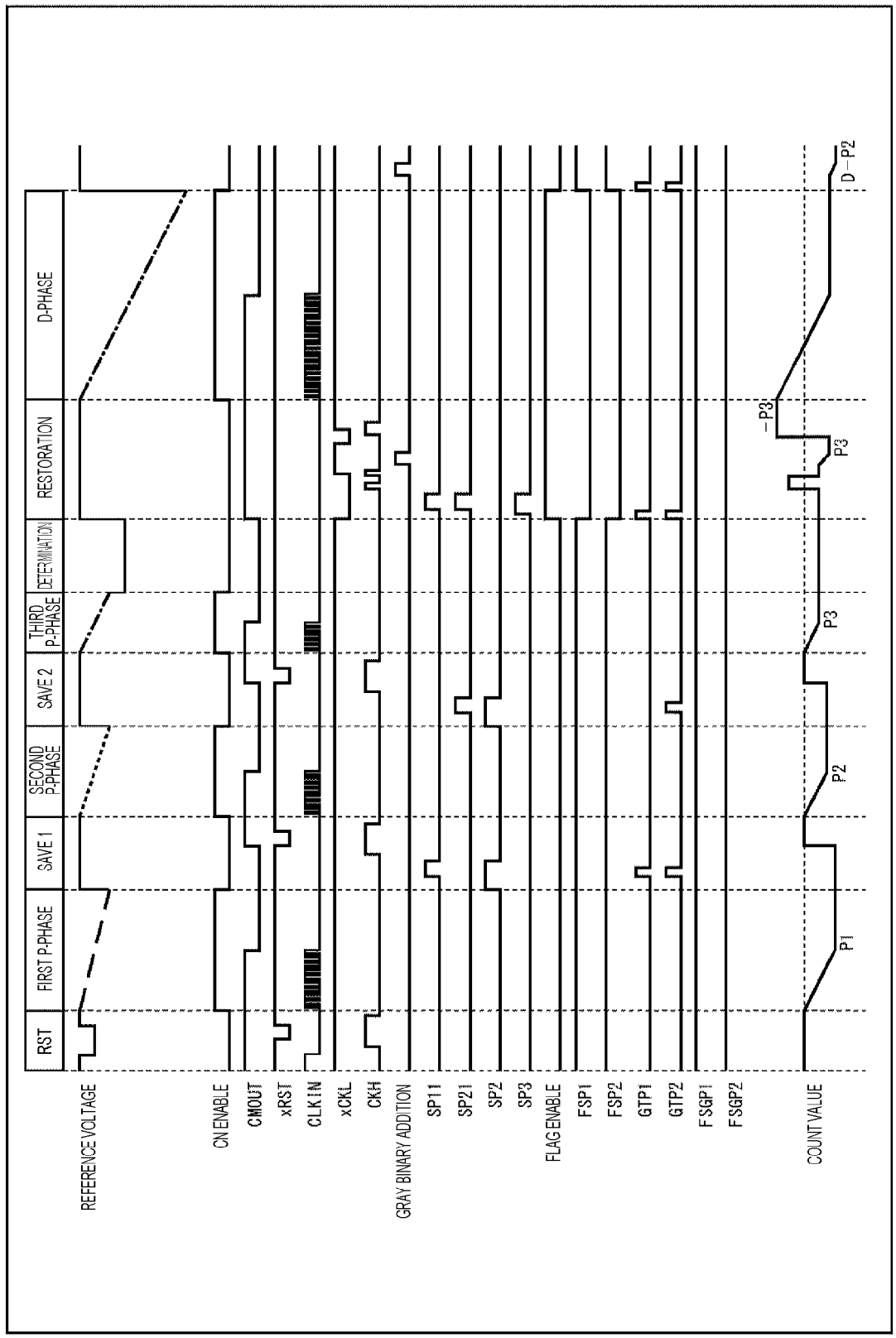
FIG. 35 is a timing chart showing a further example of changes of A/D conversion.

FIG. 33 is a view showing an example of a timing chart when low illuminance of the D-phase is determined on the basis of determination of the flag signal (F) in the A/D conversion process described above. FIG. 34 is a view showing an example of a timing chart when medium illuminance of the D-phase is determined on the basis of determination of the flag signal (F) in the A/D conversion process described above. FIG. 35 is a view showing an example of a timing chart when medium illuminance of the D-phase is determined on the basis of determination of the flag signal (F) in the A/D conversion process described above.

After the higher bit binary counter 262 is reset during a period (RST), a first reset signal (P1) is obtained in a period (first P-phase). In a subsequent period (save 1), binary codes of higher bits of the first reset signal (P1) are transferred to a first save latch of the D flip-flop 212, while gray codes of lower bits are transferred to the latch in the third stage of the latch 271. After the higher bit binary counter 262 is reset, binary codes of higher bits and gray codes of lower bits of a second reset signal (P2) are obtained in a period (second P-phase). In a subsequent period (save 2), binary codes of higher bits of the second reset signal (P2) are transferred to the second save latch of the D flip-flop 212, while gray codes of lower bits are transferred to the latch in the second stage of the latch 271. After the higher bit binary counter 262 is reset, binary codes of higher bits and gray codes of lower bits of a third reset signal (P3) are obtained in a period (third P-phase).

When it is determined that the signal level L of the flag signal (F1) is determined in a period (determination), gray-binary conversion and data inversion are performed for the gray codes of the lower bits of the first reset signal (P1) retained in the latch in the third stage of the latch 271 in a period (restoration). In addition, the D flip-flop 212 restores the binary codes of the higher bits of the first reset signal (P1), and inverts data.

More specifically, an initial value "−P1" is set for the D-phase. In a subsequent period (D-phase), A/D conversion of a pixel signal read from the unit pixel 141 is performed on the basis of a first slope reference signal (reference signal having gentlest slope, for example) to obtain a pixel signal (D). More specifically, a pixel signal (D-P1) subjected to digital CDS is obtained.

On the other hand, when H signal level of the flag signal (F1) and L signal level of the flag signal (F2) are determined in the period (determination), the gray codes of the lower bits of the second reset signal (P2) retained in the latch in the second stage of the latch 271 are transferred to the latch in the third stage in the period (restoration). Thereafter, the gray codes are read from the latch in the third stage, and subjected to gray-binary conversion and data inversion. On the other hand, the D flip-flop 212 restores the binary codes of the higher bits of the second reset signal (P2), and inverts data.

More specifically, an initial value "−P2" is set for the D-phase. In the subsequent period (D-phase), A/D conversion of a pixel signal read from the unit pixel 141 is performed on the basis of a second slope reference signal (reference signal having medium slope) to obtain a pixel signal (D). More specifically, a pixel signal (D-P2) subjected to digital CDS is obtained.

On the other hand, when the signal level of the flag signal (F2) is determined as H in the period (determination), the gray codes of the lower bits of the third reset signal (P3) retained in the latch in the first stage of the latch 271 are transferred to the latch in the third stage in the period (restoration). Thereafter, the gray codes are read from the latch in the third stage, and subjected to gray-binary conversion and data inversion. On the other hand, the D flip-flop 212 inverts data indicating the binary codes of the higher bits of the third reset signal (P3).

More specifically, an initial value "−P3" is set to the D-phase. In the period (D-phase), A/D conversion of a pixel signal read from the unit pixel 141 is performed on the basis of a third slope reference signal (reference signal having sharp slope) to obtain a pixel signal (D). More specifically, a pixel signal (D-P3) subjected to digital CDS is obtained.

Each of the column A/D conversion units 253 executes the A/D conversion process described above every time a unit pixel corresponding to a processing target changes.

The column A/D conversion unit 253 (i.e., A/D conversion unit 241) executing the A/D conversion process is capable of more accurately performing high speed and high dynamic range A/D conversion while reducing a rise of costs. Accordingly, the image sensor 100 including the column A/D conversion unit 253 (i.e., A/D conversion unit 241) to which the present technology has been applied is capable of reducing a rise of costs.

5. Fifth Embodiment

<Physical Configuration of Image Sensor>

Note that an imaging element to which the present technology has been applied may be realized in the form of a package (chip) into which a semiconductor substrate is sealed, a module including this package (chip) on a circuit substrate, or others. When the imaging element is realized in the form of a package (chip), for example, the imaging element of the package (chip) may be constituted by a single semiconductor substrate, or a plurality of substrates overlapped with each other.

Figure 36:
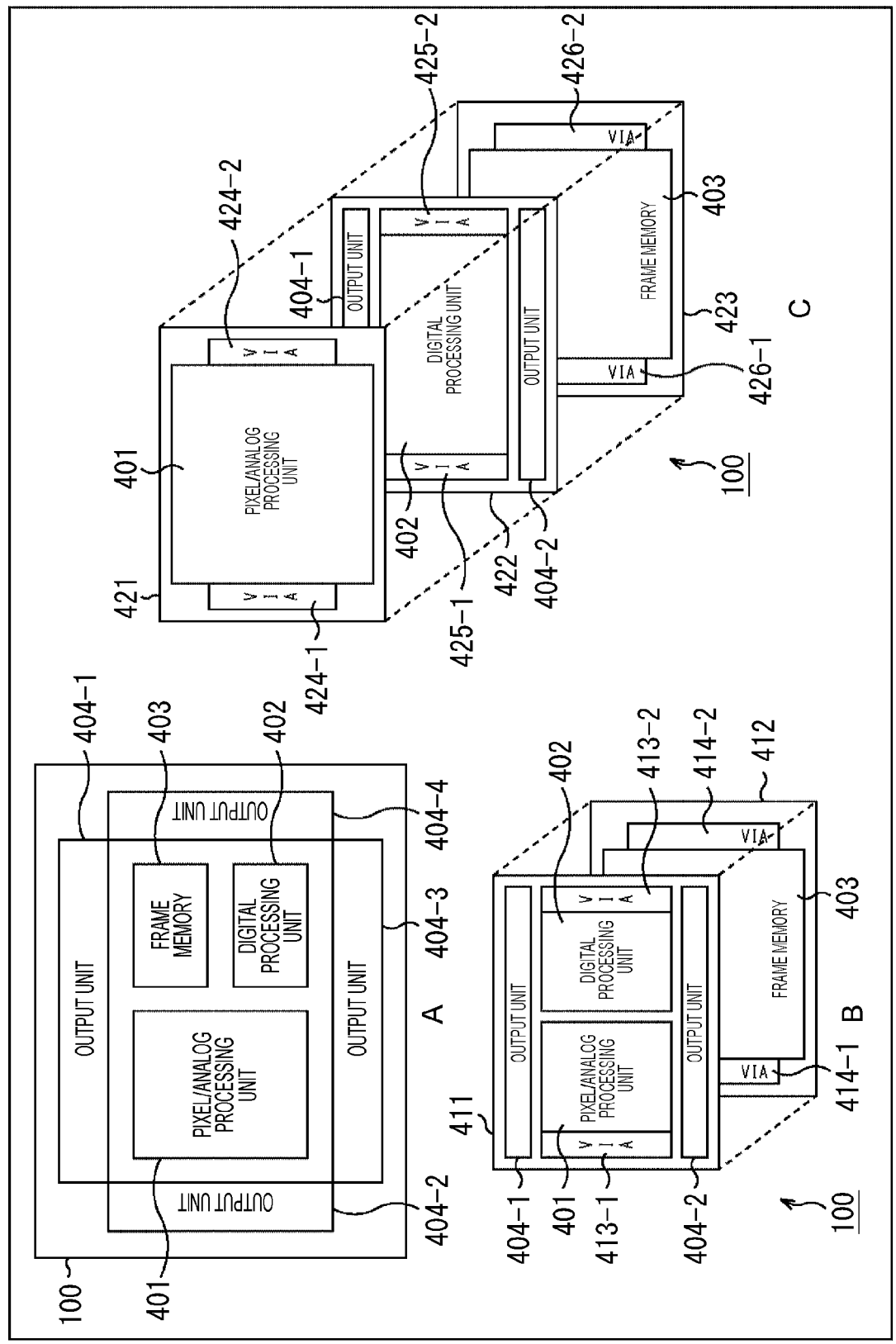
FIG. 36 is a view illustrating an example of a physical configuration of the image sensor.

FIG. 36 is a view illustrating an example of a physical configuration of the image sensor 100 constituting an imaging element to which the present technology has been applied.

According to an example illustrated in A of FIG. 36, all of the circuit configuration of the image sensor 100 described with reference to FIG. 1 and other figures are formed on a single semiconductor substrate. According to the example illustrated in A of FIG. 36, output units 404-1 through 404-4 are so disposed as to surround a pixel/analog processing unit 401, a digital processing unit 402, and a frame memory 403. The pixel/analog processing unit 401 is an area where an analog configuration such as the pixel array 101 and the column-parallel processing unit 102 are formed. The digital processing unit 402 is an area where a digital configuration such as the column-parallel processing unit 102, the control unit 111, the row-scanning unit 112, and the column-scanning unit 113 are formed. The frame memory 403 is an area where a storage unit is formed. This storage unit stores image data read from the pixel array 101, image data subjected to signal processing and image processing, various types of information for signal processing and image processing, and others. Each of the output units 404-1 through 404-4 is an area where I/O cells and other configurations are disposed.

Needless to say, the configuration example illustrated in A of FIG. 36 is presented only by way of example. Positions of configurations of respective processing units may be arbitrarily determined.

According to an example illustrated in B of FIG. 36, the circuit configuration of the image sensor 100 described with reference to FIG. 1 and other figures is formed in each of two semiconductor substrates overlapped with each other (laminated substrates (pixel substrate 411 and circuit substrate 412)).

The pixel substrate 411 is an area where the pixel/analog processing unit 401, the digital processing unit 402, and the output units 404-1 and 404-2 are formed. Each of the output units 404-1 and 404-2 is an area where I/O cells and other configurations are disposed.

On the other hand, the circuit substrate 412 is an area where the frame memory 403 is formed.

As discussed above, the pixel substrate 411 and the circuit substrate 412 overlapped with each other constitute a multilayer structure (laminated structure). The pixel/analog processing unit 401 formed on the pixel substrate 411 and the frame memory 403 formed on the circuit substrate 412 are electrically connected with each other via penetration vias (VIA) formed on via areas (VIA) 413-1 and 414-1, for example. Similarly, the digital processing unit 402 formed on the pixel substrate 411 and the frame memory 403 formed on the circuit substrate 412 are electrically connected with each other via penetration vias (VIA) formed on via areas (VIA) 413-2 and 414-2, for example.

The present technology is also applicable to the image sensor having this laminated structure. Note that the number (layer number) of the semiconductor substrates (lamination chips) may be an arbitrary number, such as three or more as illustrated in C of FIG. 36.

According to the example illustrated in C of FIG. 36, the image sensor 100 includes a semiconductor substrate 421, a semiconductor substrate 422, and a semiconductor substrate 423. The semiconductor substrates 421 through 423 are overlapped with each other to constitute a multilayer structure (laminated structure). The semiconductor substrate 421 includes the pixel/analog processing unit 401. The semiconductor substrate 422 includes the digital processing unit 402, and the output units 404-1 and 404-2. The semiconductor substrate 423 includes the frame memory 403. Respective processing units on each of the semiconductor substrates are electrically connected with each other via penetration vias (VIA) formed on via areas (VIA) 424-1, 425-1, and 426-1, and penetration vias (VIA) formed on via areas (VIA) 424-2, 425-2, and 426-2, for example.

The present technology is also applicable to the image sensor having this laminated structure. Needless to say, the processing units formed on each of the semiconductor substrates are not limited to the units included in the example in FIG. 36, but may be arbitrary units.

6. Sixth Embodiment

<Area A/D Conversion Unit>

According to the examples described above, for example, each of the A/D conversion units (column A/D conversion units 181) is provided for corresponding one of unit pixel columns of the A/D conversion unit 173 such that each of the column A/D conversion units 181 performs A/D conversion of signals read from respective unit pixels of the corresponding unit pixel column. However, the configuration of the A/D conversion unit 173 is not limited to this configuration example.

Figure 37:
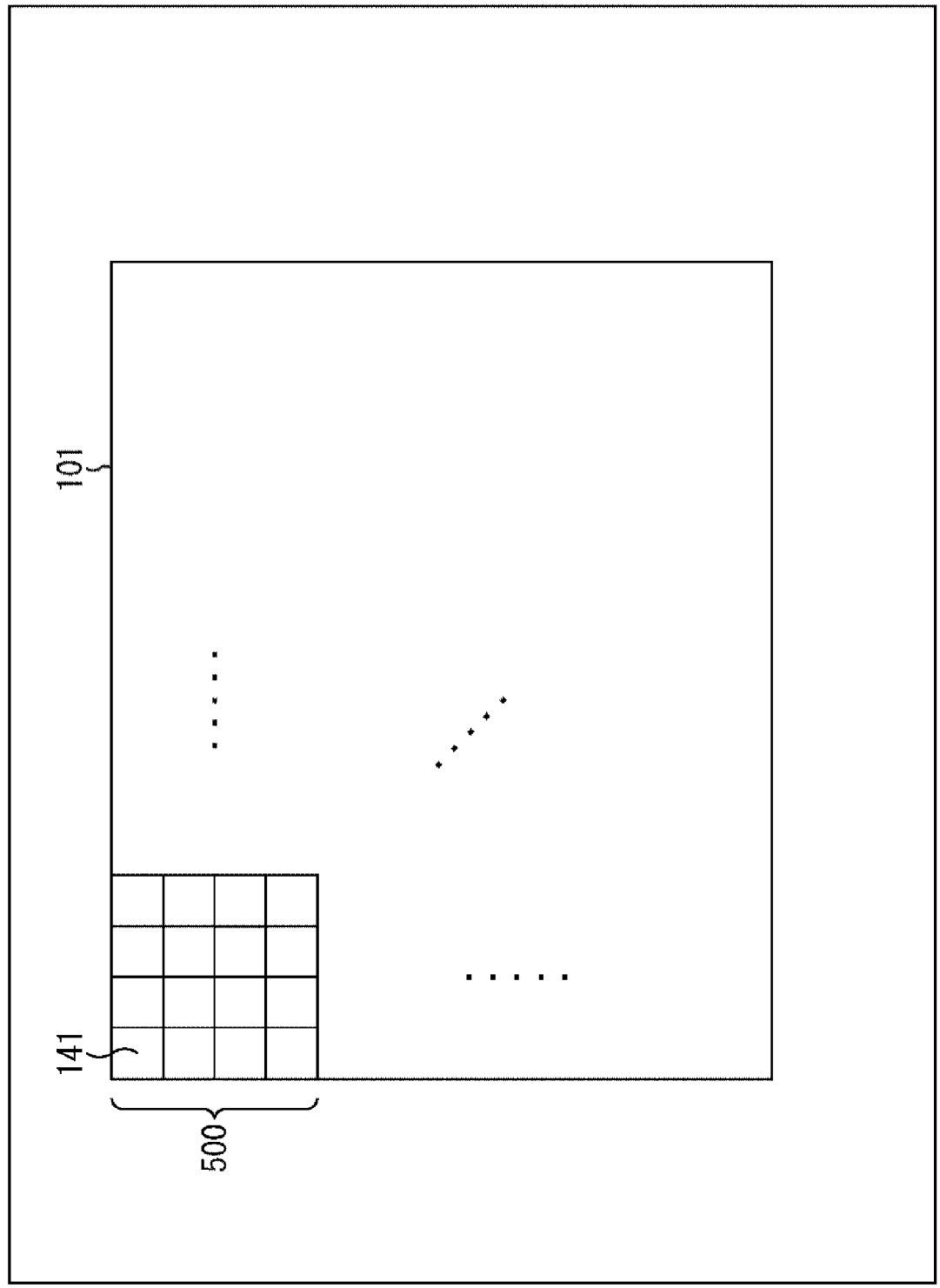
FIG. 37 is a view illustrating an example of a main configuration of the pixel array.

For example, a pixel unit 500 may be provided for each predetermined number of the unit pixels 141 in the pixel array 101 as illustrated in FIG. 37. FIG. 37 illustrates arrangement of an array of the unit pixels 141 in the pixel array 101. In the figure, arrangement in the horizontal direction of the unit pixels 141 represents rows, while arrangement in the vertical direction represents columns.

The pixel unit 500 constitutes a unit pixel group containing a plurality of unit pixels arranged in this manner (Y-row X-column (X, Y: arbitrary natural numbers), for example). More specifically, the pixel unit 500 constitutes a unit pixel group formed in a partial area corresponding to one of a plurality of divisions of a pixel area corresponding to the pixel array 101. The size of the pixel unit 500 (number of unit pixels 141 contained in pixel unit 500) and the shape of the pixel unit 500 may be arbitrarily determined. Note that the size (number of unit pixels 141) and shape of each of the pixel units 500 need not be equalized for each of the pixel units 500.

In addition, the pixel unit 500 of the example illustrated in FIG. 37 is constituted by 4×4 (4 rows 4 columns) unit pixels 141. However, the number of rows of the unit pixels and the number of columns of the unit pixels may be arbitrary numbers. For example, arrangement of the unit pixels may be 1-row 8-column, 2-row 2-column, 2-row 4-column, 4-row 2-column, 4-row 8-column, 8-row 4-column, 8-row 8-column, 8-row 1-column, or 16-row 16-column, or may be other arrangement examples.

Furthermore, while only the single pixel unit 500 is illustrated in FIG. 37, the pixel units 500 are provided on the entire pixel array 101 in an actual case. Accordingly, each of the unit pixels 141 belongs to any one of the pixel units 500.

Furthermore, while each of the unit pixels 141 is represented by a square having a uniform size in FIG. 37, the size and shape of each of the unit pixels 141 may be arbitrarily determined. Each of the unit pixels 141 is not required to have a square shape, or uniform size and shape.

When the pixel array has a shape other than the configuration illustrated in FIG. 37, an A/D conversion unit (area A/D conversion unit) included in the column-parallel processing unit may be provided for each of the pixel units 500 such that each of the area A/D conversion units performs A/D conversion of a signal read from each of unit pixels belonging to a pixel unit allocated to the corresponding area A/D conversion unit.

Figure 38:
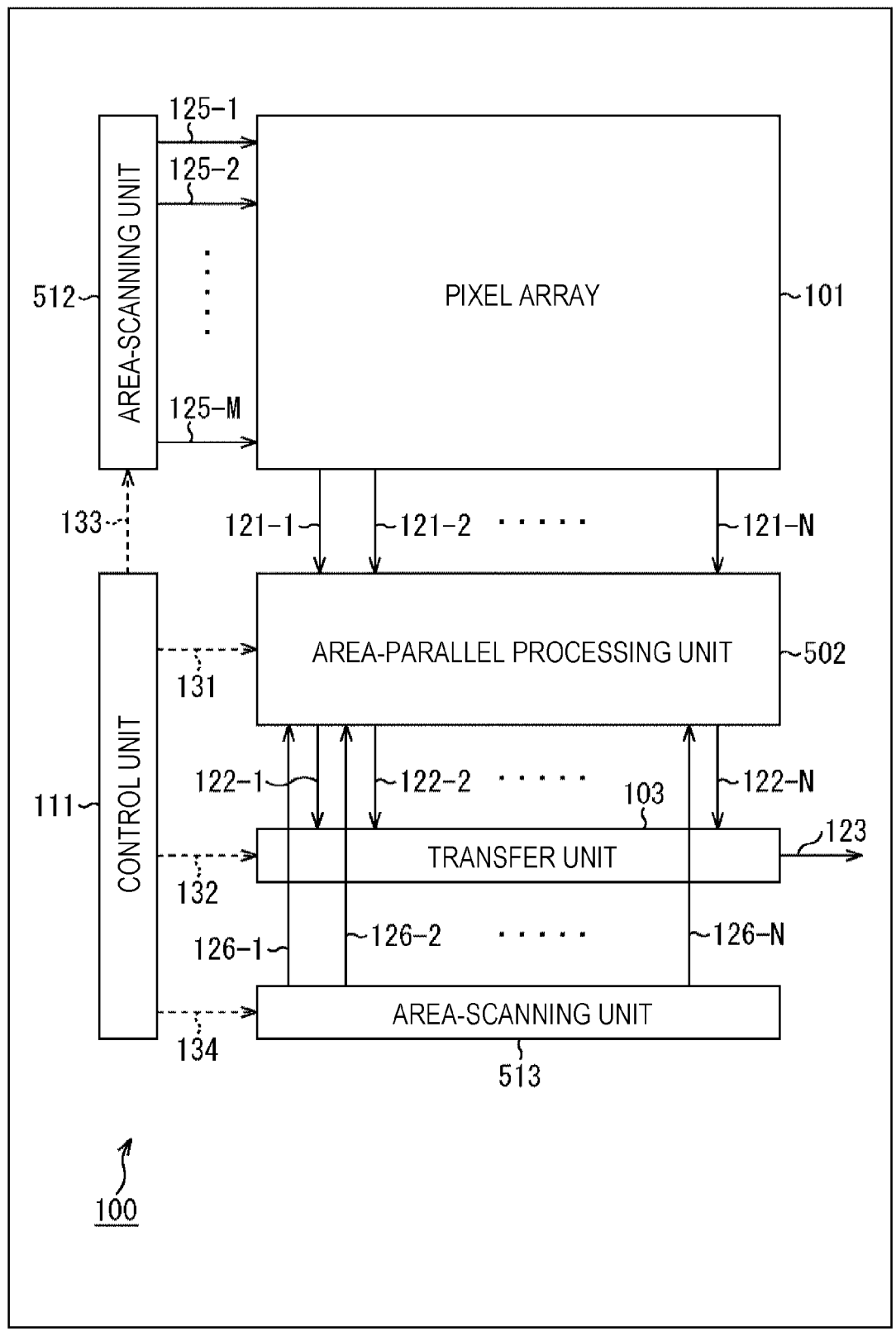
FIG. 38 is a view illustrating an example of a main configuration of the image sensor.

FIG. 38 illustrates an example of a main configuration of the image sensor 100 thus configured. According to the example illustrated in FIG. 38, the image sensor 100 includes an area-parallel processing unit 502 in place of the column-parallel processing unit 102 included in the example of FIG. 1. In addition, the image sensor 100 according to the example illustrated in FIG. 38 includes an area-scanning unit 512 in place of the row-scanning unit 112 included in the example of FIG. 1, and an area-scanning unit 513 in place of the column-scanning unit 113 in the example of FIG. 1.

The area-scanning unit 512 selects the unit pixel 141 corresponding to a processing target for each of the pixel units 500 of the pixel array 101 in accordance with a control signal supplied from the control unit 111 via the control line 133 (i.e., control by control unit 111), and reads a pixel (reset signal or pixel signal) from the selected one of the unit pixels 141. For example, when the pixel array 101 includes the N (N: arbitrary natural number) pixel units 500, the area-scanning unit 512 supplies a control signal to each of the pixel units 500 via the N control lines 125 (125-1 through 125-N) each of which is connected to the corresponding one of the pixel units 500 different from each other.

Each of the pixel units 500 of the pixel array 101 includes a configuration for selecting the unit pixels 141 (such as a switch). In this case, each of the pixel units 500 selects the unit pixel 141 corresponding to a processing target from the unit pixel group belonging to the corresponding pixel unit 500 in accordance with a control signal from the configuration for selecting the unit pixel 141 (i.e., under control by area-scanning unit 512), reads a signal (reset signal and pixel signal) from the selected unit pixel 141, and transfers the read signal to the area-parallel processing unit 502 via the vertical signal lines 121 (vertical signal lines 121-1 through 121-N).

More specifically, a signal is supplied from each of the pixel units 500 to the area-parallel processing unit 502. The area-scanning unit 513 allows the area-parallel processing unit 502 to process signals in parallel when the signals are supplied from each of the pixel units 500 of the pixel array 101 in accordance with a control signal supplied from the control unit 111 via the control line 134 (i.e., under control by control unit 111). For example, the area-scanning unit 513 allows the area-parallel processing unit 502 to perform A/D conversion of each signal. When the pixel array 101 includes the N pixel units 500, for example, the area-scanning unit 513 supplies the area-parallel processing unit 502, via the N control lines 126 (control lines 126-1 through 126-N) associated with the corresponding pixel units 500, with control signals which control processing of signals associated with the corresponding pixel units 500.

The area-parallel processing unit 502 performs processing (such as A/D conversion) of a signal (reset signal or pixel signal) read from each of the pixel units (unit pixels 141 belonging to pixel units) in accordance with each of the foregoing control signals (i.e., under control by area-scanning unit 513). The area-parallel processing unit 502 supplies a result of processing of each of the signals (such as digital data) to the transfer unit 103 via the corresponding signal line 122 in accordance with each of the control signals (i.e., under control by area-scanning unit 513).

Figure 39:
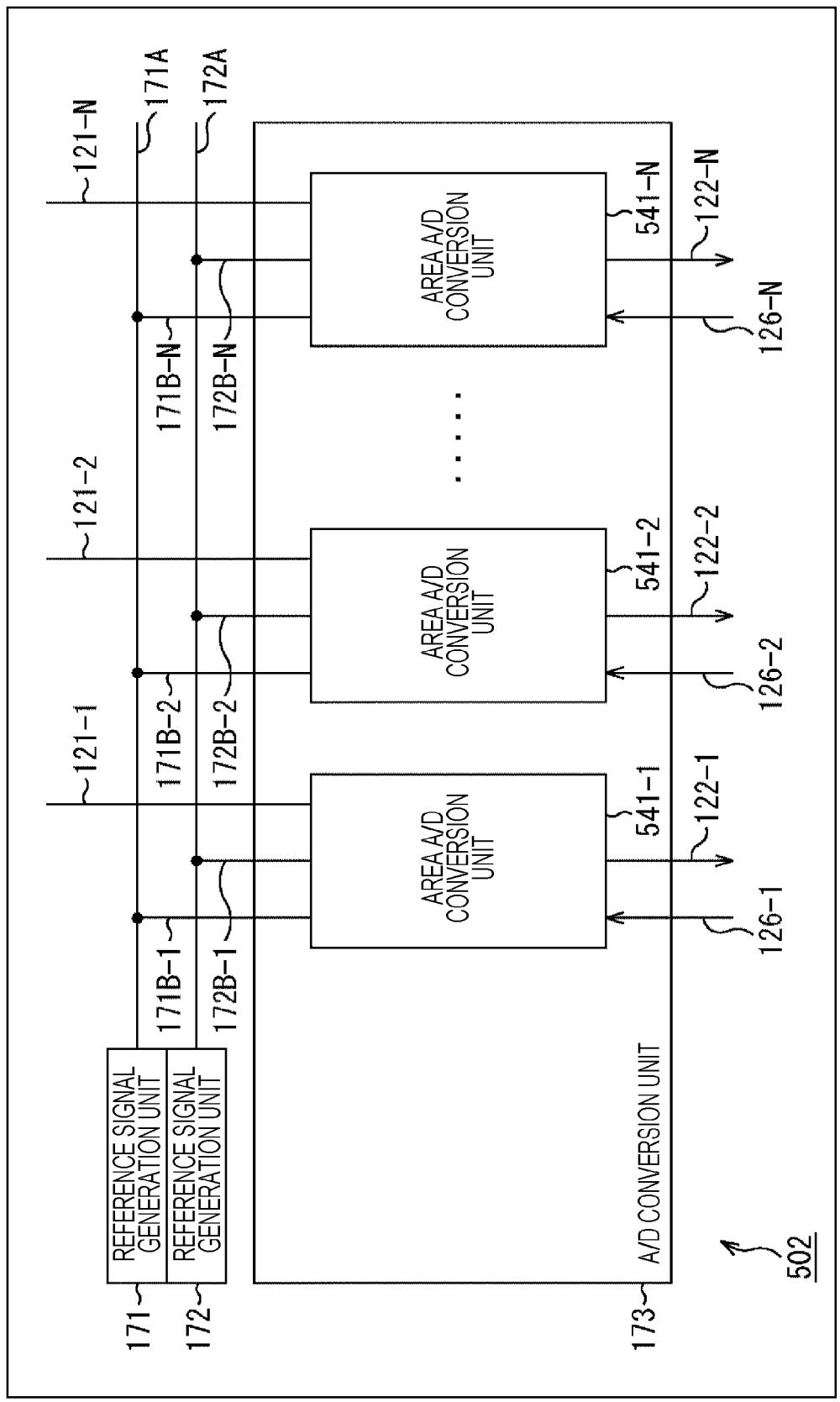
FIG. 39 is a view illustrating an example of a main configuration of an area-parallel processing unit.

When a counter for A/D conversion is constituted only by a binary counter similarly to the example of FIG. 4, the area-parallel processing unit 502 includes area A/D conversion units 541-1 through 541-N as illustrated in FIG. 39, for example, in place of the A/D conversion units 181 illustrated in FIG. 4. In the following description, the respective area A/D conversion units 541-1 through 541-N are collectively referred to as A/D conversion units 541 when no distinction between the area A/D conversion units 541 through 541-N is needed in the description.

Similarly to the column A/D conversion units 181, each of the area A/D conversion units 541 performs A/D conversion of a signal read from the unit pixel 141 of the pixel unit 500 associated with the corresponding area A/D conversion unit 541 and supplied via the corresponding one of the vertical signal lines 121 of the corresponding pixel unit 500. Each of the area A/D conversion unit 541 performs A/D conversion of the signal on the basis of a reference signal supplied from the reference signal generation unit 171 or 172 via the reference signal lines 171A and 171B, or via the reference signal lines 172A and 172B under control by the area-scanning unit 513.

Internal configuration and operation of the area A/D conversion units 541 may be similar to the internal configuration and operation of the column A/D conversion units 181 described above. More specifically, each of the area A/D conversion units 541 is similar to the column A/D conversion units 181 except for the point that a supply source of a signal corresponding to a processing target is not a column but the pixel unit 500. Accordingly, detailed description of the area A/D conversion units 541 is not repeated.

The number of the area A/D conversion units 541 included in the A/D conversion unit 173 may be an arbitrary number. The number of the area A/D conversion units 541 may be a number (N) equivalent to the number of the pixel units 500, or may be larger or smaller than the number of the pixel units 500. When the number of the area A/D conversion units 541 is smaller than the number of the pixel units 500, the vertical signal lines 121 extending from the plurality of pixel units 500 may be connected to a part or all of the area A/D conversion units 541 to perform A/D conversion of signals read from the unit pixels 141 of the pixel units 500.

Figure 40:
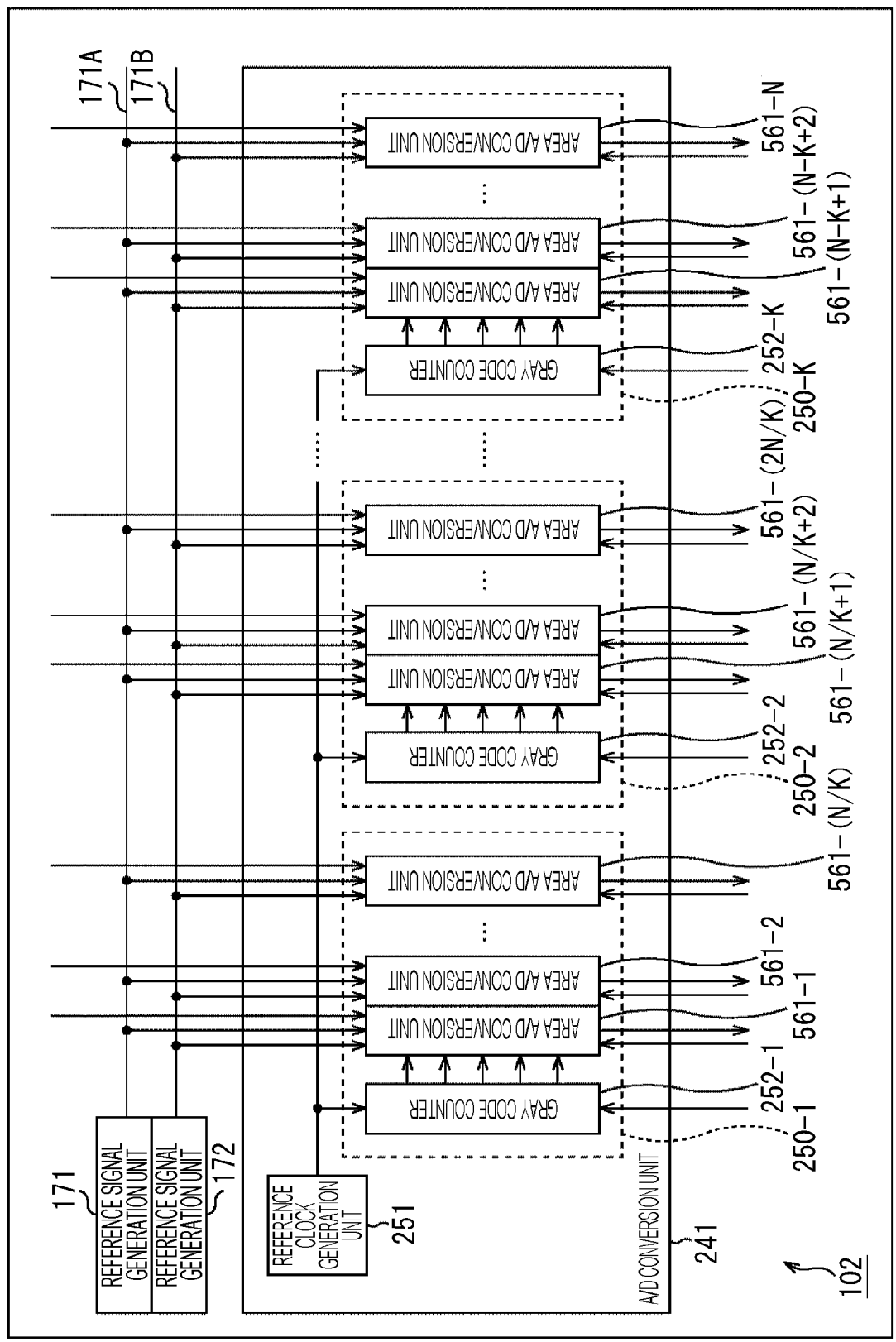
FIG. 40 is a view illustrating another example of the configuration of the area-parallel processing unit.

When a counter for A/D conversion is constituted by only a gray code counter similarly to the example of FIG. 12, the area-parallel processing unit 502 includes area A/D conversion units 561-1 through 561-N as illustrated in FIG. 40, for example, in place of the A/D conversion units 253 illustrated in FIG. 12. In the following description, the respective area A/D conversion units 561-1 through 561-N are collectively referred to as A/D conversion units 561 when no distinction between the area A/D conversion units 561-1 through 561-N is needed in the description.

Similarly to the column A/D conversion units 253, each of the area A/D conversion units 561 performs A/D conversion of a signal read from the unit pixel 141 of the pixel unit 500 associated with the corresponding area A/D conversion unit 561 and supplied via the corresponding one of the vertical signal lines 121 of the corresponding pixel unit 500. Each of the area A/D conversion unit 561 performs A/D conversion of the signal on the basis of a reference signal supplied from the reference signal generation unit 171 or 172 via the reference signal lines 171A and 171B, or via the reference signal lines 172A and 172B under control by the area-scanning unit 513, and on the basis of gray codes supplied from the gray code counter 252.

Internal configuration and operation of the area A/D conversion units 561 may be similar to the internal configuration and operation of the column A/D conversion units 253 described above. More specifically, each of the area A/D conversion units 561 is similar to the column A/D conversion units 253 except for the point that a supply source of a signal corresponding to a processing target is not a column but the pixel unit 500. Accordingly, detailed description of the area A/D conversion units 561 is not repeated.

Similarly to the area A/D conversion units 541 illustrated in FIG. 39, the number of the area A/D conversion units 561 included in the A/D conversion unit 173 may be an arbitrary number.

Figure 41:
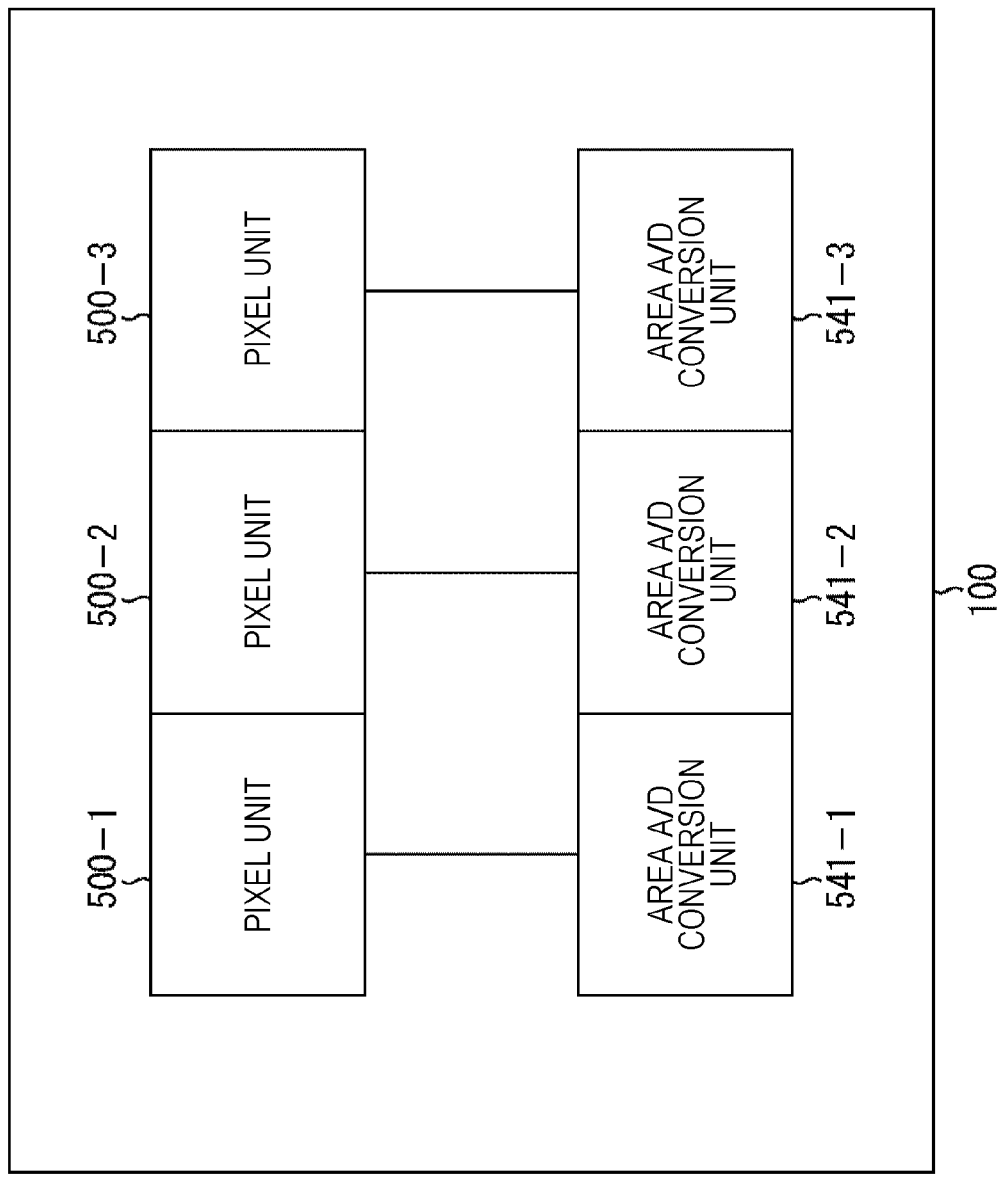
FIG. 41 is a view illustrating an example of a physical configuration of the image sensor.

When signals are processed for each of the pixel units 500 as described above, the pixel units 500 and the area A/D conversion units may be formed on the same semiconductor substrate. According to the example which constitutes the counter for A/D conversion only by a binary counter, the pixel units 500-1 through 500-3 and the area A/D conversion units 541-1 through 541-3 associated with the pixel units 500-1 through 500-3, respectively, may be formed on the same semiconductor substrate as illustrated in an example of FIG. 41. Needless to say, the number of each of the pixel units 500 and the area A/D conversion units 541 may be an arbitrary number.

Further, the configuration of the image sensor 100 may be formed on a plurality of semiconductor substrates. For example, the image sensor 100 may include two semiconductor substrates (lamination chips (pixel substrate 581 and circuit substrate 582) overlapped with each other as illustrated in FIG. 42.

Figure 42:
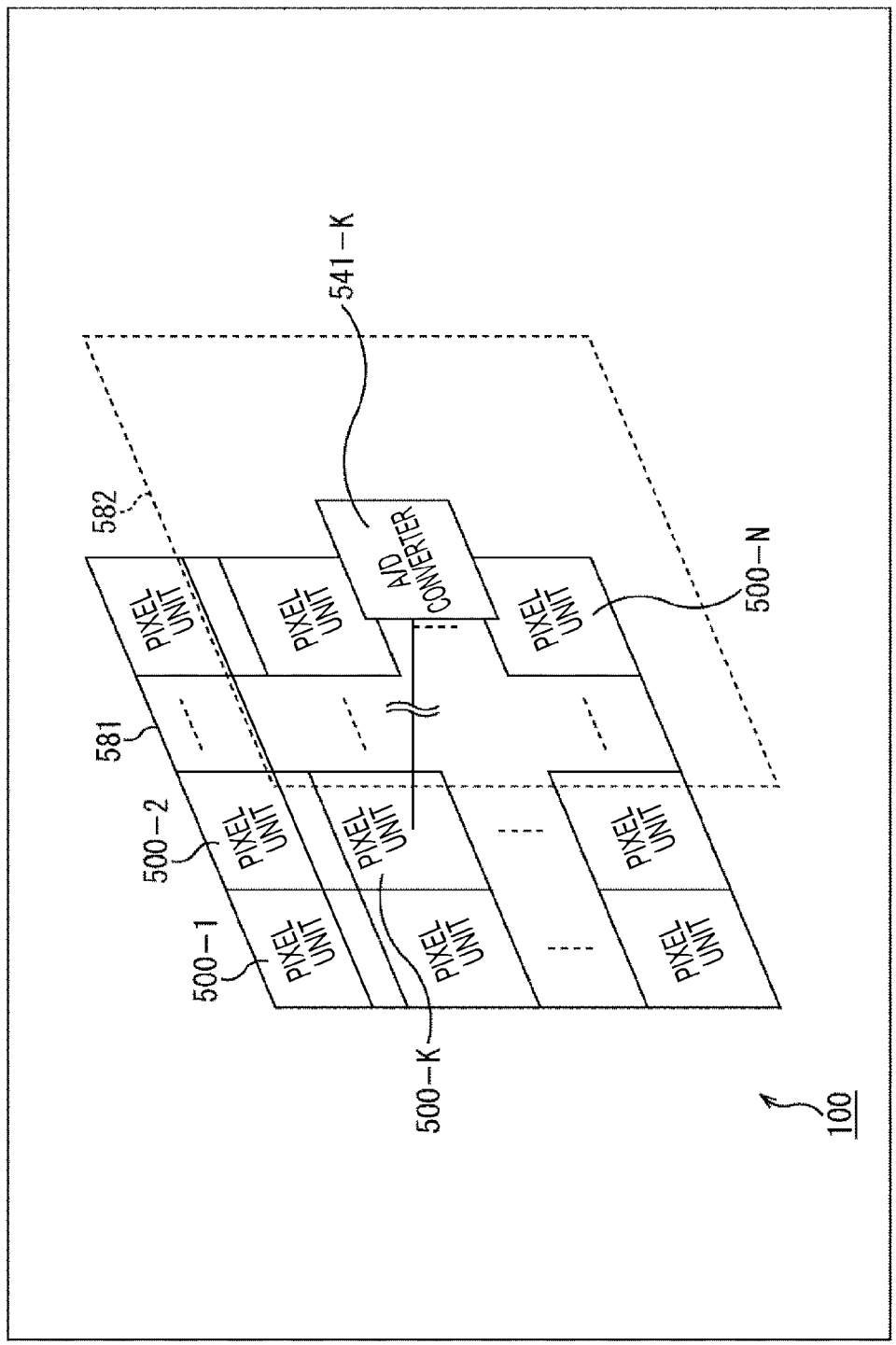
FIG. 42 is a view illustrating another example of the physical configuration of the image sensor.

According to the example which constitutes the counter for A/D conversion only by a binary counter, adoptable is such a configuration which positions the N pixel units 500 (pixel units 500-1 through 500-N) of a pixel area (i.e., pixel array 101) on the pixel substrate 581, and the area A/D conversion units 541 in correspondence with the pixel units 500 on the circuit substrate 582 at positions overlapping with the corresponding pixel units 500 as illustrated in FIG. 42. For example, the area A/D conversion unit 541-K for performing A/D conversion of a signal read from a unit pixel of the pixel unit 500-K may be formed on the circuit substrate 582 at the same position as the position of the pixel unit 500-K (at position overlapping with pixel unit 500-K) on the pixel substrate 581.

Needless to say, the number of the semiconductor substrates (layer number) of the image sensor 100 thus configured may be an arbitrary number, such as three or more.

7. Seventh Embodiment

<Imaging Device>

Figure 43:
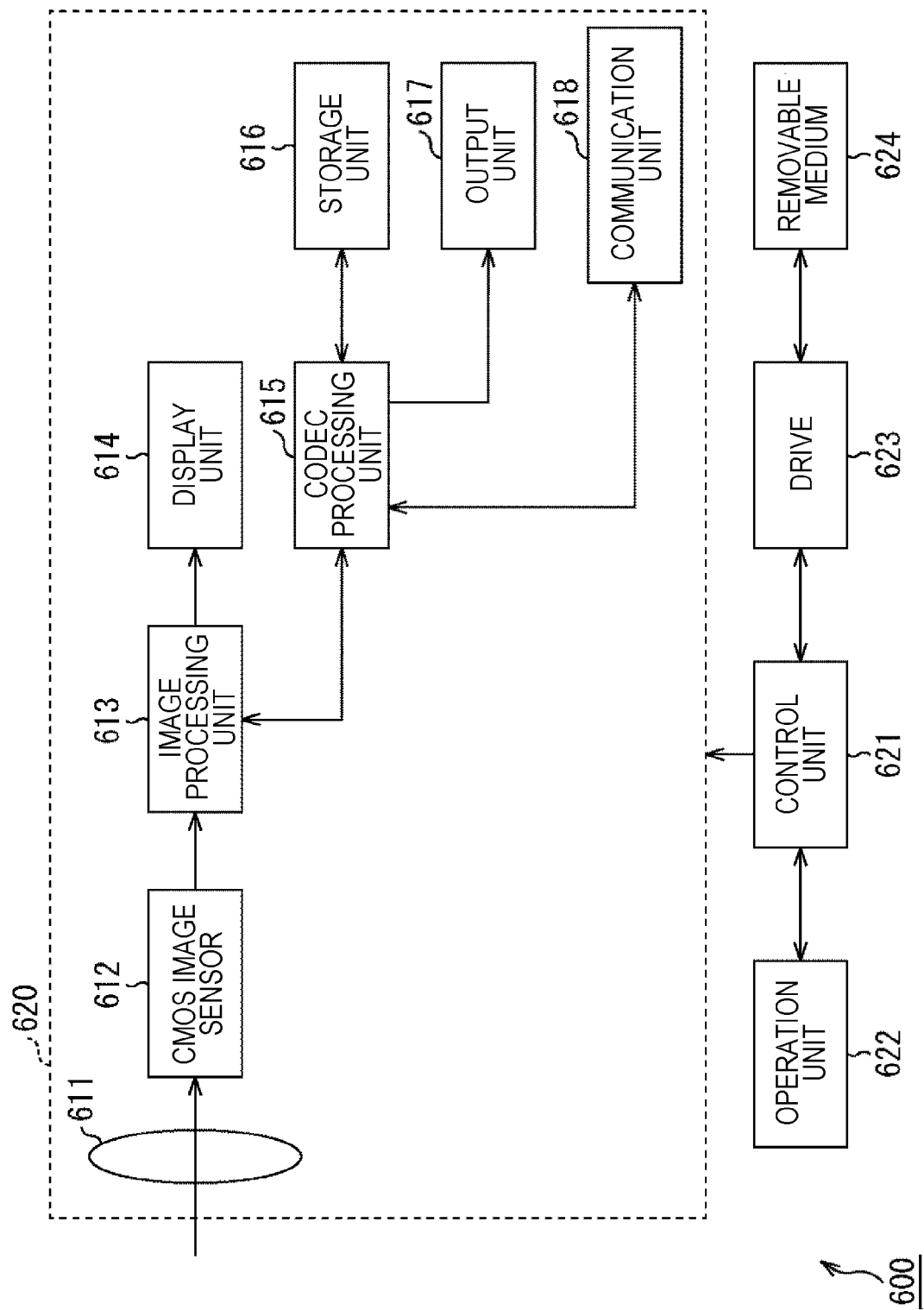
FIG. 43 is a view illustrating an example of a main configuration of an imaging device.

Note that the present technology has a range of applications other than an imaging element. For example, the present technology is applicable to a device including an imaging element (electronic device or the like), such as an imaging device. FIG. 43 is a block diagram illustrating an example of a main configuration of an imaging device presented as an example of an electronic device to which the present technology has been applied. An imaging device 600 illustrated in FIG. 43 is a device which images a subject, and outputs an image of the subject as an electronic signal.

As illustrated in FIG. 43, the imaging device 600 includes an optical unit 611, a CMOS image sensor 612, an image processing unit 613, a display unit 614, a codec processing unit 615, a storage unit 616, an output unit 617, a communication unit 618, a control unit 621, an operation unit 622, and a drive 623.

The optical unit 611 is constituted by a lens which controls a focus for a subject and condenses light coming from a focused position, a diaphragm for controlling exposure, a shutter for controlling imaging timing, and others. The optical unit 611 transmits light (incident light) from the subject, and supplies the light to the CMOS image sensor 612.

The CMOS image sensor 612 performs photoelectric conversion of incident light, A/D conversion of a signal of each pixel (pixel signal) thus obtained, and signal processing for the signal such as correlated double sampling (CDS), and supplies captured image data to the image processing unit 613 after processing.

The image processing unit 613 processes image data captured by the CMOS image sensor 612. More specifically, the image processing unit 613 performs various types of image processing, such as color mixture correction, black level correction, white balance control, demosaic processing, matrix processing, gamma correction, and YC conversion, for captured image data supplied from the CMOS image sensor 612. The image processing unit 613 supplies captured image data subjected to image processing to the display unit 614.

The display unit 614 is constituted by a liquid crystal display, for example, and displays an image of captured image data (such as image of subject) supplied from the image processing unit 613.

The image processing unit 613 also supplies captured image data subjected to image processing to the codec processing unit 615 as necessary.

The codec processing unit 615 performs encoding in a predetermined system for captured image data supplied from the image processing unit 613, and supplies obtained encoded data to the storage unit 616. The codec processing unit 615 also reads encoded data recorded in the storage unit 616, decodes the encoded data to generate decoded image data, and supplies the decoded image data to the image processing unit 613.

The image processing unit 613 performs predetermined image processing for decoded image data supplied from the codec processing unit 615. The image processing unit 613 supplies encoded image data subjected to image processing to the display unit 614. The display unit 614 is constituted by a liquid crystal display, for example, and displays an image of encoded image data supplied from the image processing unit 613.

In addition, the codec processing unit 615 may supply encoded data generated from captured image data supplied from the image processing unit 613, or encoded data generated from captured image data read from the storage unit 616 to the output unit 617 to output the supplied encoded data from the output unit 617 to the outside of the imaging device 600. The codec processing unit 615 may also supply captured image data prior to encoding, or decoded image data generated from encoded data read from the storage unit 616 to the output unit 617 to output the captured image data or the decoded image data from the output unit 617 to the outside of the imaging device 600.

Furthermore, the codec processing unit 615 may transfer captured image data, encoded data generated from captured image data, or decoded image data to other devices via the communication unit 618. In addition, the codec processing unit 615 may obtain captured image data or encoded data generated from image data via the communication unit 618. The codec processing unit 615 appropriately performs encoding and decoding, for example, for captured image data or encoded data generated from image data obtained via the communication unit 618. The codec processing unit 615 may supply obtained image data or encoded data to the image processing unit 613, or output obtained image data or encoded data to the storage unit 616, the output unit 617, and the communication unit 618 as described above.

The storage unit 616 stores encoded data or the like supplied from the codec processing unit 615. Encoded data stored in the storage unit 616 is read and decoded by the codec processing unit 615 as necessary. Captured image data obtained by decoding is supplied to the display unit 614 to display a captured image corresponding to the captured image data.

The output unit 617 includes an external output interface such as an external output terminal, and outputs various types of data supplied via the codec processing unit 615 to the outside of the imaging device 600 via the external output interface.

The communication unit 618 supplies various types of information such as image data and encoded data received from the codec processing unit 615 to other devices corresponding to communication partners of predetermined communication (wired communication or wireless communication). The communication unit 618 also obtains various types of information such as image data and encoded data from other devices corresponding to communication partners of predetermined communication (wired communication or wireless communication), and supplies the obtained information to the codec processing unit 615.

The control unit 621 controls operations of respective processing units (processing units shown within a dotted line 620, operation unit 622, and drive 623) of the imaging device 600.

The operation unit 622 is constituted by an arbitrary input device such as Jog Dial (trademark), keys, buttons, and a touch panel. The operation unit 622 receives operation input from a user or the like, and supplies a signal corresponding to the received operation input to the control unit 621.

The drive 623 reads information stored in the removable medium 624 constituted by a magnetic disk, an optical disk, a magneto-optical disk, a semiconductor memory or the like, and attached to the drive 623. The drive 623 reads various types of information such as programs and data from the removable medium 624, and supplies the read information to the control unit 621. The drive 623 also stores various types of information, such as image data and encoded data supplied via the control unit 621, in the removable medium 624 when the writable removable medium 624 is attached to the drive 623.

The present technology described in the respective embodiments is applied to the CMOS image sensor 612 of the imaging device 600 configured as above. In other words, the CMOS image sensor 612 is constituted by the image sensor 100 described above. In this case, the CMOS image sensor 612 reduces a rise of costs. Accordingly, the imaging device 600 achieves reduction of a rise of costs. More specifically, the CMOS image sensor 612 is capable of increasing the area of the pixel array 101, or adding a new circuit for image processing and signal processing while reducing increase in the area of the semiconductor substrate. In other words, the CMOS image sensor 612 prevents lowering of image quality of a captured image while reducing a rise of costs. Accordingly, the imaging device 600 is capable of obtaining a captured image having higher image quality by imaging a subject.

A series of processes described above may be executed either by hardware or by software. When the series of processes described above are executed by software, programs constituting the software are installed from a network or a recording medium.

For example, this recording medium is constituted by the removable medium 624 on which programs are recorded as illustrated in FIG. 43. The removable medium 624 is provided separately from the device body, and distributed to a user for delivering the programs. The removable medium 624 includes a magnetic disk (such as flexible disk), and an optical disk (such as CD-ROM and DVD). The removable medium 624 further includes a magneto-optical disk (such as mini disc (MD)), a semiconductor memory and the like.

In this case, the programs are installed into the storage unit 616 from the removable medium 624 attached to the drive 623.

Alternatively, the programs may be provided via a wired or wireless transmission medium such as a local area network, the Internet, and digital satellite broadcasting. In this case, the programs are received by the communication unit 618, and installed into the storage unit 616.

Instead, the programs may be installed beforehand in read only memory (ROM) or the like provided within the storage unit 616 or the control unit 621.

Note that the programs executed by the computer may be programs under which processes are executed in time series in the order described in the present specification, or executed in parallel or at necessary timing such as on occasions of calls.

Further, the steps describing the programs recorded in a recording medium contain not only processes executed in time series in the order discussed herein, but also processes executed in parallel or individually, rather than executed in time series.

In addition, the processes in the respective steps described above may be executed either by the respective devices described above, or arbitrary devices other than the respective devices described above. In this case, the devices executing the processes are configured to perform functions (function blocks or the like) necessary for executing the processes. The devices executing the processes are also configured to receive transmission of information necessary for the processes.

Further, according to the present specification, the system refers to a collection of multiple constituent elements (such as devices and modules (parts)), and includes both cases where all the constituent elements are contained in the same housing, and where some of the constituent elements are not contained in the same housing. Accordingly, multiple devices accommodated in separate housings and connected via a network, and one device including multiple modules accommodated within one housing are both regarded as systems.

According to the foregoing description, a configuration discussed as one device (or processing unit) may be divided into multiple devices (or processing units). On the contrary, the configuration discussed as multiple devices (or processing units) may be combined into one device (or processing unit). Needless to say, configurations not discussed herein may be added to the configurations of the respective devices (or respective processing units). In addition, when the configuration and operation of the whole system are substantially identical, a part of a configuration of a certain device (or pressing unit) may be incorporated into a configuration of another device (or another processing unit).

While the preferred embodiments according to the present disclosure have been described in detail with reference to the accompanying drawings, the technical scope of the present disclosure is not limited to these examples. It is obvious that various examples of changes and modifications may be presented by those having ordinary knowledge in the technical field of the present disclosure in the light of the present technology within the scope of the technical spirit described in the claims. It is therefore understood that these changes and modifications are also contained in the technical range of the present disclosure as a matter of course.

For example, the present technology is applicable to a system of cloud computing where one function is shared by multiple devices and processed in cooperation with one another via a network.

Moreover, the respective steps discussed with reference to the foregoing flowcharts may be shared and executed by multiple devices rather than executed by one device.

Furthermore, when multiple processes are contained in one step, the multiple processes contained in the one step may be shared and executed by multiple devices rather than executed by one device.

In addition, the present technology may be practiced by any configurations mounted on the foregoing devices or devices constituting the foregoing systems, such as a processor functioning as a system large scale integration (LSI), a module including a plurality of processors, a unit including a plurality of modules, and a set adding other functions to a unit (i.e., configuration of a part of device).

Note that the present technology may have the following configurations.

(1) A signal processing device including a measurement unit that performs measurement of a length of a period from an input start of a signal to a change of a value of the signal a plurality of times, retains measured values obtained by the measurement performed the plurality of times, sets an initial value of the measurement on the basis of any one of a plurality of the retained measured values, and performs the measurement by using the initial value.

(2) The signal processing device according to (1), wherein the measurement unit performs the measurement of the length of the period by counting a clock number of a predetermined clock signal, and retains an obtained count value as the measured value.

(3) The signal processing device according to (1) or (2), wherein the measurement unit performs the measurement of a first signal a plurality of times, sets the initial value on the basis of a measured value corresponding to one of the plurality of retained measured values and indicating a signal level of a second signal different from the first signal, and performs the measurement of a third signal different from the first signal and the second signal by using the set initial value.

(4) The signal processing device according to (3), wherein the first signal is a result of comparison between signal levels of a reset signal read from a unit pixel and a reference signal.

(5) The signal processing device according to (4), wherein the reference signal has a slope different for each measurement.

(6) The signal processing device according to any one of (3) through (5), wherein the second signal is a result of comparison between signal levels of a pixel signal read from a unit pixel and a predetermined reference voltage.

(7) The signal processing device according to any one of (3) through (6), wherein the third signal is a result of comparison between signal levels of a pixel signal read from a unit pixel, and a reference signal having a slope corresponding to the signal level of the second signal.

(8) The signal processing device according to any one of (1) through (7), wherein
the measurement unit obtains all bits of each of the measured values of the measurement in binary codes, and
the measurement unit inverts data indicating the measured value corresponding to the signal level of the second signal, and sets the initial value to the inverted data.

(9) The signal processing device according to any one of (1) through (8), wherein
the measurement unit obtains higher bits of each of the measured values of the measurement in binary codes, and obtains lower bits of each of the measured values in gray codes, and
the measurement unit converts the gray codes of the lower bits of the measured value corresponding to the signal level of the second signal into binary codes, adds the converted binary codes of the lower bits to the binary codes of the higher bits, inverts data indicating the obtained binary codes of all bits of the measured value, and sets the initial value to the inverted data.

(10) The signal processing device according to any one of (1) through (9), wherein
the measurement unit obtains all bits of each of the measured values of the measurement in gray codes, and
the measured value converts the gray codes of the measured value corresponding to the signal level of the second signal into binary codes, inverts data indicating the obtained binary codes of the measured value, and sets the initial value to the inverted data.

(11) The signal processing device according to any one of (1) through (10), wherein
the measurement unit performs first measurement that measures a length of a period from a start to a change of a value of the signal on the basis of a result of comparison between signal levels of a reset signal read from a unit pixel and a first reference signal having a first slope,
the measurement unit retains a first measured value obtained by the first measurement,
the measurement unit performs second measurement that measures a length of a period from a start to a change of a value of the signal on the basis of a result of comparison between signal levels of the reset signal and a second reference signal having a second slope,
the measurement unit retains a second measured value obtained by the second measurement,
the measurement unit sets an initial value on the basis of the first measured value or the second measured value in accordance with a result of comparison between a pixel signal read from a unit pixel and a predetermined reference voltage,
the measurement unit performs third measurement that measures a length of a period from a start to a change of a value of the signal by using the set initial value on the basis of a result of comparison between signal levels of the pixel signal and the first reference signal or the second reference signal corresponding to the result of comparison between the pixel signal and the reference voltage, and
the measurement unit outputs a third measured value obtained by the third measurement.

(12) The signal processing device according to (11), wherein
when the signal level of the pixel signal is lower than the reference voltage, the measurement unit sets the initial value on the basis of the first measured value, and performs the third measurement by using the set initial value on the basis of a result of comparison between signal levels of the pixel signal and the first reference signal, and
when the signal level of the pixel signal is higher than the reference voltage, the measurement unit sets the initial value on the basis of the second measured value, and performs the third measurement by using the set initial value on the basis of a result of comparison between signal levels of the pixel signal and the second reference signal.

(13) The signal processing device according to any one of (1) through (12), wherein the measurement unit includes a number of flip-flop circuits corresponding to a bit length of each of the measured values and connected with each other in series, each of the flip-flops retaining a plurality of values.

(14) The signal processing device according to any one of (1) through (13), further including a comparison unit that performs comparison of signal levels of a signal read from a unit pixel and a reference signal, wherein the measurement unit performs the measurement on the basis of a signal indicating a result of the comparison performed by the comparison unit.

(15) A signal processing method including:

performing measurement of a length of a period from an input start of a signal to a change of a value of the signal a plurality of times;

retaining measured values obtained by the measurement performed the plurality of times;

setting an initial value of the measurement on the basis of any one of a plurality of the retained measured values; and performing the measurement by using the initial value.

(16) An imaging element including:

a pixel array that includes a plurality of unit pixels disposed in matrix; and a measurement unit that performs measurement of a length of a period from an input start of a signal, which signal indicates a result of comparison between signal levels of a signal read from a unit pixel of the pixel array and a reference signal, to a change of a value of the signal a plurality of times, retains measured values obtained by the measurement performed the plurality of times, sets an initial value of the measurement on the basis of any one of a plurality of the retained measured values, and performs the measurement by using the initial value.

(17) An electronic device including:

an imaging unit that images a subject; and an image processing unit that performs image processing of image data captured by the imaging unit, wherein the imaging unit includes a pixel array that includes a plurality of unit pixels disposed in matrix, and a measurement unit that performs measurement of a length of a period from an input start of a signal, which signal indicates a result of comparison between signal levels of a signal read from a unit pixel of the pixel array and a reference signal, to a change of a value of the signal a plurality of times, retains measured values obtained by the measurement performed the plurality of times, sets an initial value of the measurement on the basis of any one of a plurality of the retained measured values, and performs the measurement by using the initial value.

(18) A signal processing device including:

one or a plurality of first latches each of which retains an input signal and outputs the retained signal;

one or a plurality of second latches each of which obtains the signal retained in the first latch or latches and retains the obtained signal, and further supplies the retained signal to the first latch to allow the first latch to retain the supplied signal; and a transfer control unit that controls transfer of the signal between the first latch or latches and the second latch or latches.

(19) The signal processing device according to (18), further including an inversion control unit that controls data inversion of the signal retained in the first latch or latches.

(20) A signal processing device including:

a plurality of latches connected with each other in series, each of the latches retaining a signal; and a control unit that controls transfer of the signal between the latches, and transfers a signal retained in the desired latch to the latch in a final stage, and outputs the signal from the latch in the final stage at the time of output of the signal.

REFERENCE SIGNS LIST

100 Image sensor
101 Pixel array
102 Column-parallel processing unit
103 Transfer unit
111 Control unit
112 Row-scanning unit
113 Column-scanning unit
121 Vertical signal line
122 and 123 Signal line
125 and 126 Control line
131 through 134 Control line
141 Unit pixel
171 and 172 Reference signal generation unit
171A, 172A, 171B, 172B Reference signal line
173 A/D conversion unit
181 Column A/D conversion unit
191 Selector
192 Comparison unit 193 Counter
211 AND gate
212 D flip-flop
213 Flag latch
221 NOT gate
222 NAND gate
223 NOT gate
224 Switch
225 and 226 NOT gate
227 Switch
228 and 229 NOT gate
231 AND gate
232 NOR gate
233 NOT gate
234 and 235 AND gate
241 A/D conversion unit
251 Reference clock generation unit
252 Gray code counter
253 Column A/D conversion unit
261 Lower bit gray code latch
262 Higher bit binary counter
271 Latch
272 Gray binary conversion unit
273 Selector
274 Lower bit binary addition unit
275 Switch
276 Flag latch
277 Metastable countermeasure latch
281 XOR gate
291 through 296 NOT gate
301 AND gate
311 through 313 NOT gate
314 and 315 NAND gate
321 Gray code latch
331 Gray binary conversion unit
332 Selector
333 Binary addition unit
334 Flag latch
341 Switch
342 and 343 NOT gate
344 Switch
345 and 346 NOT gate
351 and 352 AND gate
353 OR gate
354 AND gate
361 through 366 NOT gate
371 and 372 AND gate
401 Pixel/analog processing unit
402 Digital processing unit
403 Frame memory
404 Output unit
411 Pixel substrate
412 Circuit substrate 421 through 423 Semiconductor substrate
500 Pixel unit
512 and 513 Area-scanning unit
541 and 561 Area A/D conversion unit
581 Pixel substrate
582 Circuit substrate
600 Imaging device
612 CMOS image sensor

The invention claimed is:

1. A signal processing device, comprising:
a gray code counter;
a column analog to digital (A/D) conversion unit, wherein the column A/D conversion unit includes:
 a higher bit binary counter; and
 a lower bit gray code latch, wherein a gray code clock signal generated by the gray code counter is supplied to the lower bit gray code latch, wherein the lower bit gray code latch generates gray codes on the basis of the gray code clock signal and converts gray codes into binary codes to generate lower bits of a binary code that are supplied to the higher bit binary counter, and
wherein the lower bit gray code latch includes:
 a plurality of latches, wherein the number of latches is equal to the number of bits of gray code clocks supplied from the gray code counter, and wherein respective bits of the gray code clocks supplied from the gray code counter are supplied to the corresponding latches; and
 a metastable countermeasure latch, wherein the metastable countermeasure latch supplies a carry signal to the higher bit binary counter.

2. The signal processing device according to claim 1, wherein the device includes a plurality of column A/D conversion units.

3. The signal processing device according to claim 1, wherein the lower bit gray code latch further includes:
a switch, wherein the carry signal is supplied to the higher bit binary counter via the switch.

4. The signal processing device according to claim 3, wherein the lower gray code latch further includes:
a gray binary conversion circuit.

5. The signal processing device according to claim 4, wherein the gray binary conversion circuit includes:
a plurality of XOR gates;
a selector; and
a lower bit binary addition unit.

6. The signal processing device according to claim 5, wherein the selector supplies a binary codes to the lower bit binary addition unit at a timing corresponding to an input control signal.

7. The signal processing device according to claim 6, wherein the lower bit binary addition unit performs digital correlated double sampling for lower bits.

8. The signal processing device according to claim 7, wherein the lower gray code latch further includes:
a flag latch, wherein the flag latch stores a flag signal supplied from a comparison unit, is ANDed to a flag enable period, is supplied to each of the latches as a signal FSGP, and is supplied to the higher bit binary counter as a signal FSP.

9. A signal processing device, comprising:
a gray code counter;
a column analog to digital (A/D) conversion unit, wherein the column A/I) conversion unit includes:
 a higher bit binary counter; and
 a lower bit gray code latch, wherein a gray code clock signal generated by the gray code counter is supplied to the lower bit gray code latch, wherein the lower bit gray code latch generates gray codes on the basis of the gray code clock signal and converts gray codes into binary codes to generate lower bits of a binary code that are supplied to the higher bit binary counter, and
wherein the lower bit gray code latch includes:
a plurality of latches, wherein the number of latches is equal to the number of bits of gray code clocks supplied from the gray code counter, wherein respective bits of the gray code clocks supplied from the gray code counter are supplied to the corresponding latches, and wherein the lower bit gray code latch supplies a carry signal to the higher bit binary counter in synchronization with a clock signal provided to one of the latches of the lower bit gray code latch via a signal line.

10. The signal processing device according to claim 9, wherein the higher bit binary counter calculates a sum of generated higher-bit binary codes and lower bit binary codes supplied from the lower bit gray code latch and generates and outputs binary codes of all the bits.

11. The signal processing device according to claim 10, wherein the higher bit binary counter includes an AND gate, a plurality of D flip-flops, and a flag latch.

12. An image sensor, comprising:
a pixel array;
a column-parallel processing unit, including:
 a gray code counter;
 a plurality of column analog to digital (A/D) conversion units, wherein each of the column A/D conversion units includes:
  a higher bit binary counter; and
  a lower bit gray code latch, wherein a gray code clock signal generated by the gray code counter is supplied to the lower bit gray code latch, and wherein the lower bit gray code latch generates gray codes on the basis of the gray code clock signal and converts gray codes into binary codes to generate lower bits of a binary code that are supplied to the higher bit binary counter; wherein the lower bit gray code latch includes:
   a plurality of latches, wherein the number of latches is equal to the number of bits of gray code clocks supplied from the gray code counter, and wherein respective bits of the gray code clocks supplied from the gray code counter are supplied to the corresponding latches; and
   a metastable countermeasure latch, wherein the metastable countermeasure latch supplies a carry signal to the higher bit binary counter; and
a control unit, wherein the control unit supplies a control signal to the column-parallel processing unit.

* * * * *